US009685500B2

(12) United States Patent
Yamazaki et al.

(10) Patent No.: US 9,685,500 B2
(45) Date of Patent: Jun. 20, 2017

(54) CIRCUIT SYSTEM

(71) Applicant: Semiconductor Energy Laboratory Co., Ltd., Atsugi-shi, Kanagawa-ken (JP)

(72) Inventors: Shunpei Yamazaki, Tokyo (JP); Yutaka Shionoiri, Kanagawa (JP); Tomoaki Atsumi, Kanagawa (JP); Shuhei Nagatsuka, Kanagawa (JP); Yutaka Okazaki, Kanagawa (JP); Suguru Hondo, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 42 days.

(21) Appl. No.: 14/645,566

(22) Filed: Mar. 12, 2015

(65) Prior Publication Data
US 2015/0263007 A1    Sep. 17, 2015

(30) Foreign Application Priority Data

Mar. 14, 2014    (JP) .................................. 2014-052263
Mar. 16, 2014    (JP) .................................. 2014-052864
(Continued)

(51) Int. Cl.
*H01L 29/12*        (2006.01)
*H01L 29/04*        (2006.01)
(Continued)

(52) U.S. Cl.
CPC ........ *H01L 29/045* (2013.01); *H01L 27/0688* (2013.01); *H01L 27/1156* (2013.01);
(Continued)

(58) Field of Classification Search
None
See application file for complete search history.

(56) References Cited

U.S. PATENT DOCUMENTS 5,216,630 A *  6/1993  Nakase ............... G11C 11/4116
                                                             365/155
5,731,856 A     3/1998  Kim et al.
(Continued)

FOREIGN PATENT DOCUMENTS

EP    1737044 A    12/2006
EP    2226847 A    9/2010
(Continued)

OTHER PUBLICATIONS

International Search Report (Application No. PCT/IB2015/051567) Dated Jun. 9, 2015.
(Continued)

*Primary Examiner* — Angel Roman
(74) *Attorney, Agent, or Firm* — Fish & Richardson P.C.

(57) ABSTRACT

A semiconductor device with a transistor having favorable electrical characteristics is provided. The semiconductor device has a memory circuit and a circuit that are over the same substrate. The memory circuit includes a capacitor, a first transistor, and a second transistor. A gate of the first transistor is electrically connected to the capacitor and one of a source and a drain of the second transistor. The circuit includes a third transistor and a fourth transistor that are electrically connected to each other in series. The first transistor and the third transistor each include an active layer including silicon, and the second transistor and the fourth transistor each include an active layer including an oxide semiconductor.

21 Claims, 52 Drawing Sheets

(30) Foreign Application Priority Data

Mar. 18, 2014 (JP) ................................ 2014-055459
Mar. 28, 2014 (JP) ................................ 2014-070518
Apr. 30, 2014 (JP) ................................ 2014-093321

(51) Int. Cl.
| | | |
|---|---|---|
| H01L 27/12 | (2006.01) | |
| H01L 29/786 | (2006.01) | |
| H01L 29/24 | (2006.01) | |
| H01L 27/11551 | (2017.01) | |
| H01L 27/1156 | (2017.01) | |
| H01L 27/06 | (2006.01) | |

(52) U.S. Cl.
CPC .... *H01L 27/11551* (2013.01); *H01L 27/1225* (2013.01); *H01L 27/1255* (2013.01); *H01L 29/24* (2013.01); *H01L 29/7869* (2013.01); *H01L 29/78648* (2013.01); *H01L 29/78696* (2013.01)

(56) References Cited

U.S. PATENT DOCUMENTS

| | | | |
|---|---|---|---|
| 5,744,864 | A | 4/1998 | Cillessen et al. |
| 6,191,990 | B1 * | 2/2001 | Itoh .......................... G11C 7/18 |
| | | | 257/E21.021 |
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,663,165 | B2 | 2/2010 | Mouli |
| 7,674,650 | B2 | 3/2010 | Akimoto et al. |
| 7,692,223 | B2 | 4/2010 | Isobe et al. |
| 7,732,819 | B2 | 6/2010 | Akimoto et al. |
| 7,791,074 | B2 | 9/2010 | Iwasaki |
| 7,956,361 | B2 | 6/2011 | Iwasaki |
| 8,084,331 | B2 | 12/2011 | Ofuji et al. |
| 8,154,024 | B2 | 4/2012 | Iwasaki |
| 8,202,365 | B2 | 6/2012 | Umeda et al. |
| 8,304,298 | B2 | 11/2012 | Ofuji et al. |
| 8,339,837 | B2 | 12/2012 | Inoue et al. |
| 8,455,876 | B2 | 6/2013 | Choi et al. |
| 8,487,303 | B2 | 7/2013 | Takemura |
| 8,502,226 | B2 | 8/2013 | Kondo et al. |
| 8,514,609 | B2 | 8/2013 | Kawae et al. |
| 8,809,853 | B2 | 8/2014 | Saito et al. |
| 8,854,865 | B2 | 10/2014 | Saito |
| 8,860,022 | B2 | 10/2014 | Sasaki et al. |
| 8,891,264 | B1 * | 11/2014 | Cleeves ............. G06K 19/0701 |
| | | | 257/655 |
| 8,947,910 | B2 | 2/2015 | Takemura |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0076832 | A1 * | 4/2007 | Matsudera ................ H03L 7/18 |
| | | | 375/371 |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0045397 | A1 | 2/2009 | Iwasaki |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2010/0187524 | A1 | 7/2010 | Isobe et al. |
| 2011/0089417 | A1 | 4/2011 | Yamazaki et al. |
| 2011/0090416 | A1 | 4/2011 | Arasawa et al. |
| 2011/0194331 | A1 | 8/2011 | Kawae et al. |
| 2011/0228584 | A1 | 9/2011 | Takemura |
| 2011/0228603 | A1 * | 9/2011 | Takashima ............. G11C 14/00 |
| | | | 365/185.08 |
| 2012/0051116 | A1 | 3/2012 | Inoue et al. |
| 2012/0063206 | A1 * | 3/2012 | Furutani ................ G11C 11/404 |
| | | | 365/149 |

(56) References Cited

U.S. PATENT DOCUMENTS

| | | | |
|---|---|---|---|
| 2012/0154369 A1* | 6/2012 | Yamauchi | G09G 3/3659 345/212 |
| 2012/0274378 A1* | 11/2012 | Fujita | H01L 27/00 327/208 |
| 2013/0141157 A1 | 6/2013 | Takemura | |
| 2013/0256658 A1 | 10/2013 | Takemura | |
| 2013/0285045 A1 | 10/2013 | Sasaki et al. | |
| 2014/0104151 A1 | 4/2014 | Yamazaki et al. | |
| 2014/0266379 A1 | 9/2014 | Inoue et al. | |
| 2014/0286093 A1* | 9/2014 | Abe | G11C 16/0408 365/185.03 |
| 2015/0021596 A1 | 1/2015 | Yamazaki et al. | |
| 2015/0214378 A1 | 7/2015 | Matsubayashi et al. | |
| 2015/0255139 A1 | 9/2015 | Atsumi et al. | |

FOREIGN PATENT DOCUMENTS

| | | |
|---|---|---|
| EP | 2339639 A | 6/2011 |
| EP | 2816607 A | 12/2014 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 02-271657 A | 11/1990 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-103918 A | 4/2007 |
| JP | 2007-123861 A | 5/2007 |
| JP | 2007-299913 A | 11/2007 |
| JP | 2007-318112 A | 12/2007 |
| JP | 2009-004733 A | 1/2009 |
| JP | 2009-135350 A | 6/2009 |
| JP | 2009-167087 A | 7/2009 |
| JP | 2009-212443 A | 9/2009 |
| JP | 2009-535819 | 10/2009 |
| JP | 2011-048339 A | 3/2011 |
| JP | 2011-181167 A | 9/2011 |
| JP | 2011-227981 A | 11/2011 |
| JP | 2012-160247 A | 8/2012 |
| JP | 2013-243352 A | 12/2013 |
| WO | WO-2004/114391 | 12/2004 |
| WO | WO-2007/029844 | 3/2007 |
| WO | WO-2008/027392 | 3/2008 |
| WO | WO-2008/143304 | 11/2008 |
| WO | WO-2009/110623 | 9/2009 |
| WO | WO-2011/096264 | 8/2011 |
| WO | WO-2011/114905 | 9/2011 |

OTHER PUBLICATIONS

Written Opinion (Application No. PCT/IB2015/051567) Dated Jun. 9, 2015.

Asakuma.N et al., "Crystallization and Reduction of Sol-Gel-Derived Zinc Oxide Films by Irradiation WIth Ultrviolet Lamp", Journal of Sol-Gel—Science and Technology, 2003, vol. 26, pp. 181-184.

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol.220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc-Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film And its Bending Properties", SID Digest '09 : SID International Symposium Digest of Technical Papers, May 31, 2009, pp. 983-985.

(56) References Cited

OTHER PUBLICATIONS

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Kikuchi.H et al., "Polymer-Stabilized Liquid Crystal Blue Phases", Nature Materials, Sep. 2, 2002, vol. 1, pp. 64-68.
Kim.S et al., "High-Performance oxide thin film transistors passivated by various gas plasmas", 214th ECS Meeting, 2008, No. 2317, ECS.
Kimizuka.N. et al., "SPINEL,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu, or Zn] at Temperatures over 1000° C.", Journal of Solid State Chemistry, 1985, vol. 60, pp. 382-384.
Kitzerow.H et al., "Observation of Blue Phases in Chiral Networks", Liquid Crystals, 1993, vol. 14, No. 3, pp. 911-916.
Kurokawa.Y et al., "UHF RFCPUS on Flexible and Glass Substrates for Secure RFID Systems", Journal of Solid-State Circuits , 2008, vol. 43, No. 1, pp. 292-299.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Lee.H et al., "Current Status of, Challenges to, and Perspective View of AM-OLED", IDW '06 : Proceedings of the 13th International Display Workshops, Dec. 7, 2006, pp. 663-666.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Lee.M et al., "15.4:Excellent Performance of Indium-Oxide-Based Thin-Film Transistors by DC Sputtering", SID Digeest '09 : SID International Symposium Digest of Technical Papers, May 31, 2009, pp. 191-193.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Miyasaka.M, "SUFTLA Flexible Microelectronics on Their Way to Business", SID Digest '07 : SID International Symposium Digest of Technical Papers, 2007, vol. 38, pp. 1673-1676.
Mo.Y et al., "Amorphous Oxide TFT Backplanes for Large Size AMOLED Displays", IDW '08 : Proceedings of the 6th International Display Workshops, Dec. 3, 2008, pp. 581-584.
Nakamura.M, "Synthesis of Homologous Compound with New Long-Period Structure", NIRIM Newsletter, Mar. 1, 1995, vol. 150, pp. 1-4.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nowatari.H et al., "60.2: Intermediate Connector With Suppressed Voltage Loss for White Tendem OLEDS", SID Digest '09 : SID International Symposium Digest of Technical Papers, May 31, 2009, vol. 40, pp. 899-902.
Oba.F et al., "Defect energetics in ZnO: A hybrid Hartree-Fock density functional study", Phys. Rev. B (Physical Review. B), 2008, vol. 77, pp. 245202-1-245202-6.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ohara.H et al., "21.3:4.0 In. QVGA AMOLED Display Using In—Ga—Zn—Oxide TFTS With a Novel Passivation Layer", SID Digest '09 : SID International Symposium Digest of Technical Papers, May 31, 2009, pp. 284-287.
Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Orita.M et al., "Amorphous transparent conductive oxide InGaO3(ZnO)m (m<4):a Zn4s conductor", Philosophical Magazine, 2001, vol. 81, No. 5, pp. 501-515.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.
Osada.T et al., "Development of Driver-Integrated Panel Using Amorphous In—Ga—Zn—Oxide TFT", AM-FPD '09 Digest of Technical Papers, Jul. 1, 2009, pp. 33-36.
Park.J et al., "Amorphous Indium-Gallium-Zinc Oxide TFTS and Their Application for Large Size AMOLED", AM-FPD '08 Digest of Technical Papers, Jul. 2, 2008, pp. 275-278.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.
Park.J et al., "High performance amorphous oxide thin film transistors with self-aligned top-gate structure", IEDM 09: Technical Digest of International Electron Devices Meeting, Dec. 7, 2009, pp. 191-194.
Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.
Park.S et al., "Challenge to Future Displays: Transparent AM-OLED Driven by PEALD Grown ZnO TFT", IMID '07 Digest, 2007, pp. 1249-1252.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Sakata.J et al., "Development of 4.0-In. AMOLED Display With Driver Circuit Using Amorphous In—Ga—Zn—Oxide TFTS", IDW '09 : Proceedings of the 16th International Display Workshops, 2009, pp. 689-692.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Tsuda.K et al., "Ultra Low Power Consumption Technologies for Mobile TFT-LCDs", IDW '02 : Proceedings of the 9th International Display Workshops, Dec. 4, 2002, pp. 295-298.

(56) References Cited

OTHER PUBLICATIONS

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, pp. 1012-1015.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Nakamura.M et al., "Syntheses and crystal structures of new homologous compounds, indium iron zinc oxides (InFeO3(ZnO)m) (m natural number) and related compounds", Kotai Butsuri (Solid State Physics), 1993, vol. 28, No. 5, pp. 317-327.

Nomura.K et al., "Thin-Film Transistor Fabricated in Single-Crystalline Transparent Oxide Semiconductor", Science, May 23, 2003, vol. 300, No. 5623, pp. 1269-1272.

Yamazaki.S et al., "Research, Development, and Application of Crystalline Oxide Semiconductor", SID Digest '12 : SID International Symposium Digest of Technical Papers, Jun. 5, 2012, pp. 183-186.

Aoki.T et al., "Electronic Global Shutter CMOS Image Sensor Using Oxide Semiconductor FET With Extremely Low Off-State Current", 2011 Symposium on VLSI Technology : Digest of Technical Papers, 2011, pp. 174-175.

Kato.K et al., "Evaluation of Off-State Current Characteristics of Transistor Using Oxide Semiconductor Material, Indium.Gallium.Zinc Oxide", Jpn. J. Appl. Phys. (Japanese Journal of Applied Physics), 2012, vol. 51, pp. 021201-1-021201-7.

Inoue.H et al., "Nonvolatile Memory With Extremely Low-Leakage Indium-Gallium-Zinc-Oxide Thin-Film Transistor", IEEE Journal of Solid-State Circuits, Sep. 1, 2012, vol. 47, No. 9, pp. 2258-2265.

Ohmaru.T, "Eight-Bit CPU With Nonvolatile Registers Capable of Holding Data for 40 Days at 85° C. Using Crystalline In—Ga—Zn Oxide Thin Film Transistors", Extended Abstracts of the 2012 International Conference on Solid State Devices and Materials, 2012, pp. 1144-1145.

\* cited by examiner

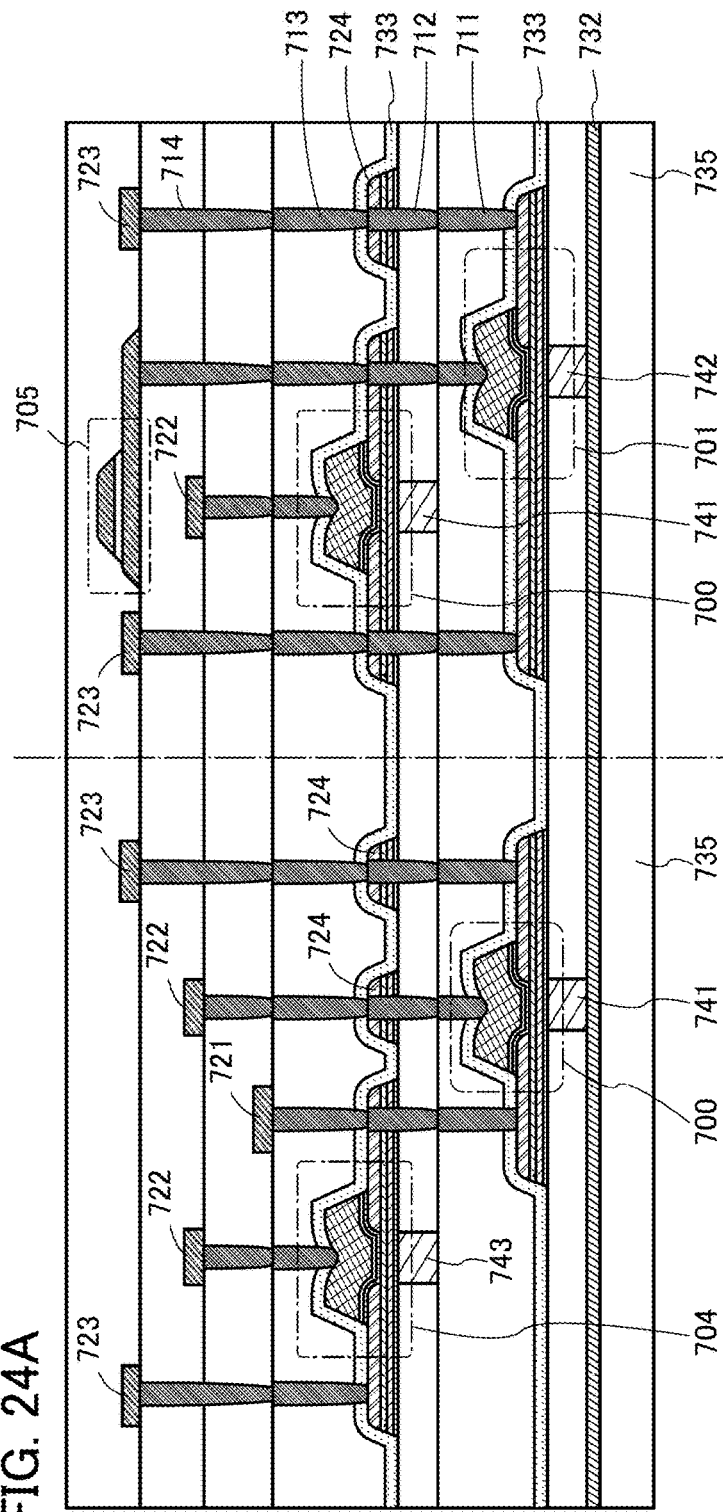

FIG. 44A
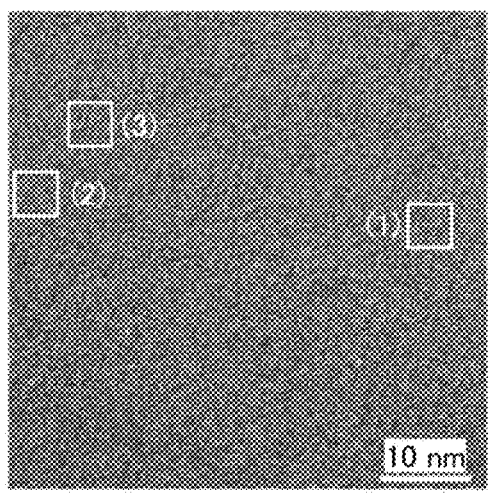
FIG. 44B  FIG. 44C  FIG. 44D
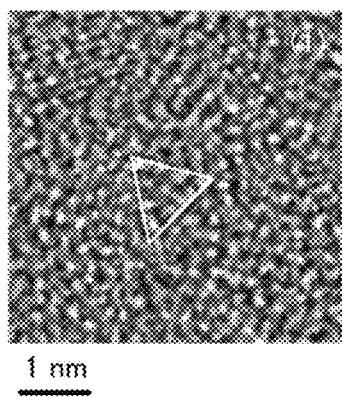 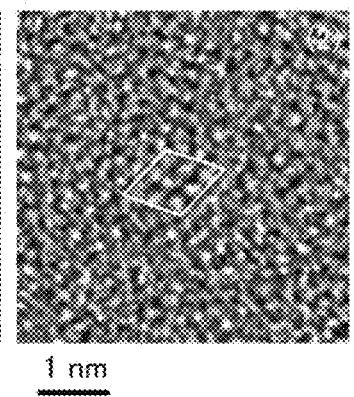 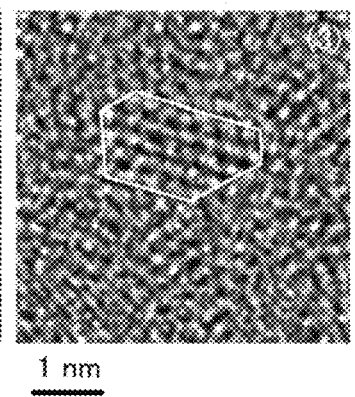

Crystal structure of InMZnO$_4$

CIRCUIT SYSTEM

TECHNICAL FIELD

One embodiment of the present invention relates to a circuit system using a semiconductor, or another semiconductor device. Another embodiment of the present invention relates to a method for driving the semiconductor device, or a method for manufacturing the semiconductor device.

Note that one embodiment of the present invention is not limited to the above technical field. The technical field of one embodiment of the present invention disclosed in this specification and the like relates to an object, a method, or a manufacturing method. In addition, one embodiment of the present invention relates to a process, a machine, manufacture, or a composition of matter. In particular, the present invention relates to a semiconductor device, a display device, a light-emitting device, a power storage device, a storage device, a driving method thereof, or a manufacturing method thereof.

In this specification and the like, the semiconductor device refers to any device that can operate by utilizing semiconductor characteristics. A semiconductor element such as a transistor, a semiconductor circuit, an arithmetic device, or a memory device is an embodiment of a semiconductor device. An imaging device, a display device, a liquid crystal display device, a light-emitting device, an electro-optical device, a power generation device (including a thin film solar cell, an organic thin film solar cell, and the like), and an electronic device may each include a semiconductor device.

In this specification and the like, the circuit system refers to any circuit which includes semiconductor devices such as a capacitor, a transistor, a resistor, a memory, and a wiring. The circuit system may include a driving circuit for driving the semiconductor devices, a power circuit, and the like. Further, the circuit system may include one or more of an inverter circuit, a NAND circuit, an AND circuit, a NOR circuit, an OR circuit, a buffer, a level shifter, an XOR circuit, an XNOR circuit, an AND-NOR circuit, an OR-NAND circuit, an AND-OR-INV circuit, an OR-AND-INV circuit, an analog switch, a flip-flop, a settable flip-flop, a resettable flip-flop, a settable and resettable flip-flop, an adder circuit, a half adder circuit, a multiplexer, a demultiplexer, a register, a scan register, a retention register, an isolator, a decoder, and the like.

BACKGROUND ART

A technique in which a transistor is formed using a semiconductor material has attracted attention. The transistor is applied to a wide range of electronic devices such as an integrated circuit (IC) or an image display device (also simply referred to as a display device). As semiconductor materials applicable to the transistor, silicon-based semiconductor materials have been widely used, but oxide semiconductors have been attracting attention as alternative materials.

For example, a technique for formation of a transistor using zinc oxide or an In—Ga—Zn oxide semiconductor as an oxide semiconductor is disclosed (see Patent Documents 1 and 2).

In recent years, demand for integrated circuits in which semiconductor elements such as miniaturized transistors are integrated with high density has risen with increased performance and reductions in the size and weight of electronic devices.

PATENT DOCUMENT

[Patent Document 1] Japanese Published Patent Application No. 2007-123861

[Patent Document 2] Japanese Published Patent Application No. 2007-096055

DISCLOSURE OF INVENTION

An object of one embodiment of the present invention is to provide a circuit system including a transistor with favorable electrical characteristics. Another object of one embodiment of the present invention is to provide a circuit system including a transistor with favorable electrical characteristics and a capacitor with small electrostatic capacitance. Another object of one embodiment of the present invention is to provide a circuit system including a transistor suitable for miniaturization. Another object of one embodiment of the present invention is to provide a circuit system with increased switching speed (operation speed). Another object of one embodiment of the present invention is to provide a circuit system with increased writing speed. Another object of one embodiment of the present invention is to provide a circuit system with increased reading speed. Another object of one embodiment of the present invention is to provide a circuit system with low power consumption. Another object of one embodiment of the present invention is to provide a circuit system including a memory with favorable retention characteristics. Another object is to provide a novel circuit system. Another object is to provide a novel semiconductor device.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is a semiconductor device comprising a capacitor and a transistor electrically connected to the capacitor. Electrostatic capacitance of the capacitor is larger than or equal to 0.1 fF and less than 10 fF. The transistor comprises an oxide semiconductor film. Writing time of the semiconductor device is longer than or equal to 0.1 nsec and shorter than 5 nsec in operation at room temperature.

One embodiment of the present invention is a semiconductor device in which a memory circuit and a circuit are formed over a same substrate. The memory circuit comprises a capacitor, a first transistor, and a second transistor. A gate of the first transistor is electrically connected to the capacitor and one of a source and a drain of the second transistor. The circuit comprises a third transistor and a fourth transistor that are electrically connected to each other in series. The first transistor and the third transistor each comprise an active layer comprising silicon. The second transistor and the fourth transistor each comprise an active layer formed of an oxide semiconductor film.

One embodiment of the present invention is a semiconductor device in which a memory circuit and a circuit are formed over a same substrate. The memory circuit comprises a capacitor, a first transistor, and a second transistor. A gate of the first transistor is electrically connected to the capacitor and one of a source and a drain of the second transistor. The circuit comprises a third transistor and a fourth transistor that are electrically connected to each other in series. The first, second, third, and fourth transistors each comprise an active layer formed of an oxide semiconductor film.

In any of the above embodiments, a transistor comprising an active layer formed of an oxide semiconductor film preferably has a region where the channel length is larger than or equal to 1 nm and less than 100 nm. In any of the above embodiments, it is preferable that the oxide semiconductor film contain oxygen, In, Zn, and M (M is Ti, Ga, Y, Zr, La, Ce, Nd, or Hf). In addition, in any of the above embodiments, the oxide semiconductor film preferably contains crystal parts. Furthermore, the oxide semiconductor film preferably contains c-axis aligned crystal parts.

According to one embodiment of the present invention, a circuit system including a transistor having favorable electrical characteristics can be provided. According to one embodiment of the present invention, a circuit system including a transistor with favorable electrical characteristics and a capacitor with small electrostatic capacitance can be provided. According to one embodiment of the present invention, a circuit system including a transistor suitable for miniaturization can be provided. According to one embodiment of the present invention, a circuit system with increased switching speed (operation speed) can be provided. According to one embodiment of the present invention, a circuit system with increased writing speed can be provided. According to one embodiment of the present invention, a circuit system with increased reading speed can be provided. According to one embodiment of the present invention, a circuit system with low power consumption can be provided. According to one embodiment of the present invention, a circuit system including a memory with favorable retention characteristics can be provided. A novel circuit system can be provided. A novel semiconductor device can be provided.

Note that the description of these effects does not disturb the existence of other effects. One embodiment of the present invention does not necessarily achieve all the effects listed above. Other effects will be apparent from and can be derived from the description of the specification, the drawings, the claims, and the like.

BRIEF DESCRIPTION OF DRAWINGS

In the accompanying drawings:

FIG. 24A is a cross-sectional view illustrating a structural example of a semiconductor device, and FIGS. 24B and 24C are circuit diagrams illustrating an example of the semiconductor device;

FIG. 37A shows a measurement result of drain current-gate voltage ($I_d$-$V_g$) characteristics, and FIG. 37B shows a measurement result of drain current-drain voltage ($I_d$-$V_d$) characteristics;

FIGS. 44A to 44D are Cs-corrected high-resolution TEM images of a plane of a CAAC-OS;

BEST MODE FOR CARRYING OUT THE INVENTION

Figure 1:
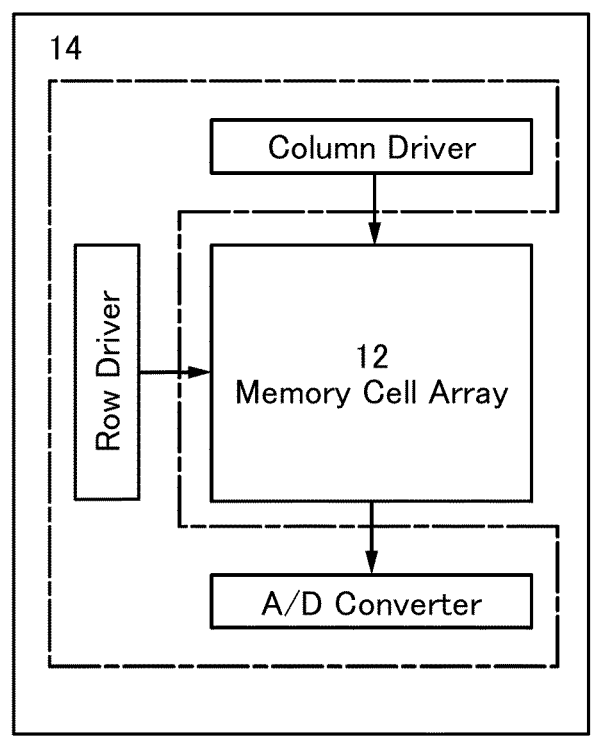
FIG. 1 is a block diagram illustrating an example of a circuit system.

Embodiments will be described in detail with reference to drawings. Note that the present invention is not limited to the description below, and it is easily understood by those skilled in the art that various changes and modifications can be made without departing from the spirit and scope of the present invention. Accordingly, the present invention should not be interpreted as being limited to the content of the embodiments below.

In the structures of the invention to be given below, the same portions or portions having similar functions are denoted by the same reference numerals in different drawings, and explanation thereof will not be repeated. Further, the same hatching pattern is applied to portions having similar functions, and the portions are not especially denoted by reference numerals in some cases.

Note that in each drawing described in this specification, the size, the layer thickness, or the region of each component is exaggerated for clarity in some cases. Therefore, embodiments of the present invention are not limited to such a scale.

It is also noted that in this specification and the like, ordinal numbers such as "first" and "second" are used in order to avoid confusion among components, and the terms do not limit the components numerically.

In this specification, the term "parallel" indicates that the angle formed between two straight lines is greater than or equal to −10° and less than or equal to 10°, and accordingly also includes the case where the angle is greater than or equal to −5° and less than or equal to 5°. The term "perpendicular" indicates that the angle formed between two straight lines is greater than or equal to 80° and less than or equal to 100°, and accordingly includes the case where the angle is greater than or equal to 85° and less than or equal to 95°.

A transistor is a kind of semiconductor elements and can achieve amplification of current or voltage, switching operation for controlling conduction or non-conduction, or the like. A transistor in this specification includes an insulated-gate field-effect transistor (IGFET) and a thin film transistor (TFT). Note that a transistor is an element having three terminals: a gate, a source, and a drain. In this specification and the like, in some cases, the two terminals that are not the gate of the transistor are referred to as a first terminal and a second terminal.

For example, in this specification and the like, when it is explicitly described that X and Y are connected, the case where X and Y are electrically connected, the case where X and Y are functionally connected, and the case where X and Y are directly connected are included therein. Accordingly, a connection relation other than that shown in drawings and texts is also included without limitation to a predetermined connection relation, for example, the connection relation shown in the drawings and the texts.

Here, X and Y each denote an object (e.g., a device, an element, a circuit, a line, an electrode, a terminal, a conductive film, a layer, or the like).

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. A switch is controlled to be on or off. That is, a switch is conducting or not conducting (is turned on or off) to determine whether current flows therethrough or not. Alternatively, the switch has a function of selecting and changing a current path.

In the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a step-up circuit, or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a memory circuit; and/or a control circuit) can be connected between X and Y. Note that, for example, in the case where a signal output from X is transmitted to Y even when another circuit is interposed between X and Y, X and Y are functionally connected.

Note that when it is explicitly described that X and Y are connected, the case where X and Y are electrically connected (i.e., the case where X and Y are connected with another element or another circuit provided therebetween), the case where X and Y are functionally connected (i.e., the case where X and Y are functionally connected with another circuit provided therebetween), and the case where X and Y are directly connected (i.e., the case where X and Y are connected without another element or another circuit provided therebetween) are included therein. That is, when it is explicitly described that "X and Y are electrically connected", the description is the same as the case where it is explicitly only described that "X and Y are connected".

Note that, for example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y, can be expressed by using any of the following expressions.

The expressions include, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit structure is defined by an expression similar to the above examples, a source (or a first terminal or the like) and a drain (or a second terminal or the like) of a transistor can be distinguished from each other to specify the technical scope. Note that these expressions are examples and there is no limitation on the expressions. Here, X, Y, Z1, and Z2 each denote an object (e.g., a device, an element, a circuit, a wiring, an electrode, a terminal, a conductive film, and a layer).

Embodiment 1

In this embodiment, a circuit system of one embodiment of the present invention is described with reference to FIG. 1 to FIG. 18. Here, a memory device is described as an example of a circuit system.
<Structural Example of Circuit System>
FIG. 1 is a block diagram illustrating an example of a circuit system.

A circuit system 10 shown in FIG. 1 includes a memory cell array 12 and a peripheral circuit 14. The peripheral circuit 14 is electrically connected to the memory cell array 12. A row driver, a column driver, an A/D converter, and the like are provided in the peripheral circuit 14. A logic circuit may be provided in the peripheral circuit 14.

Note that a structure including the memory cell array 12 and the peripheral circuit 14 (here, the row driver, the column driver, and the A/D driver) electrically connected to the memory cell array 12 can be referred to as a memory device.

With reference to FIGS. 2A to 2D, an example of a memory circuit that can be used in a circuit system of one embodiment of the present invention is described.

Figure 2A:
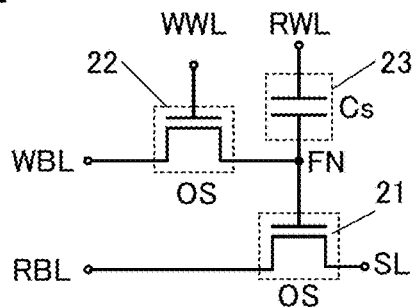
FIGS. 2A to 2C are circuit diagrams illustrating an example of a memory device.

FIG. 2A is a circuit diagram illustrating an example of a memory device. A memory circuit 25 shown in FIG. 2A includes a transistor 21, a transistor 22, and a capacitor 23. The memory circuit 25 can retain data even without power supply, and has no limitation on the number of writing operations. In addition, the memory circuit 25 can be applied to a memory cell in the memory cell array 12 in FIG. 1.

The transistors 21 and 22 each are a transistor whose channel is formed in a semiconductor layer including an oxide semiconductor (hereinafter referred to as an OS transistor in some cases). Note that a circuit symbol with a term "OS" (oxide semiconductor) in FIG. 2A means a transistor including an oxide semiconductor layer. The same applied to the other drawings. Although FIG. 2A shows an example in which both of the transistors 21 and 22 are OS transistors, the circuit structure is not limited to that as long as at least one of the transistors 21 and 22 is an OS transistor. It is much preferable that the transistor 22 be an OS transistor. When the transistor 22 is an OS transistor, power consumption of the memory circuit 25 can be reduced. Specifically, since an off-state current of the transistor 22 can be reduced, data can be retained for a long period. In other words, the memory circuit 25 whose power consumption is sufficiently reduced can be provided because refresh operation is unnecessary or the frequency of refresh operation is extremely low.

In addition, in the memory circuit 25 shown in FIG. 2A, deterioration of an element does not easily occur because the memory circuit 25 does not require high voltage for data writing. Unlike in a conventional flash memory, for example, it is not necessary to inject and extract electrons into and from a floating gate; thus, a problem such as deterioration of an insulator is not caused. That is, the memory circuit 25 shown in FIG. 2A is a semiconductor device which has no limitation on the number of writing operations unlike a conventional flash memory where the limitation is problematic, and which highly increases reliability. Furthermore, data is written depending on the state of the transistor 22 (on or off), whereby high-speed operation can be achieved.

The electrostatic capacitance of the capacitor 23 in the memory circuit 25 is preferably larger than or equal to 0.1 fF and less than 10 fF. If the electrostatic capacitance of the capacitor 23 is in the above range, writing speed can be improved. In other words, writing time can be shortened. Specifically, in operation at room temperature, writing time can be longer than or equal to 0.1 nsec and shorter than 5 nsec. Alternatively, in operation at room temperature, writing frequency can be larger than 0.2 GHz and less than or equal to 10 GHz. Alternatively, writing time converted into a bit rate can be larger than or equal to 400 Mbps (bit per second) and smaller than or equal to 20 Gbps.

Here, the writing time means time necessary for charging the capacitor 23 to 90%, when data is written by charging the capacitor 23 in the memory circuit 25. In other words, the writing time means time required to step up a potential of a node FN from a potential at a low level to a 90% potential of a bit line for data writing (WBL).

The writing speed can be expressed by time taken for the writing transistor in the memory circuit to be turned on. Alternatively, the writing speed can be expressed by maximum frequency (cutoff frequency) with which the current gain of the writing transistor is 1 or more. Note that the transistor 22 is the writing transistor in the memory circuit 25.

One or both of the transistors 21 and 22 preferably have a region where the channel length is larger than or equal to 1 nm and less than 100 nm, or further preferably have a region where the channel length is larger than or equal to 5 nm and less than or equal to 60 nm. When the transistor has the channel length in the above range, a miniaturized memory device, a circuit system with a small-sized circuit area using the memory device, or a circuit system with low power consumption using the memory device can be provided.

The memory circuit 25 shown in FIG. 2A is electrically connected to a wiring WBL (writing bit line), a wiring RBL (reading bit line), a wiring WWL (writing word line), a wiring RWL (reading word line), and a wiring SL (source line). The wiring RBL is electrically connected to a first terminal of the transistor 21, and the wiring SL is electrically connected to a second terminal of the transistor 21. The wiring WBL is electrically connected to a first terminal of the transistor 22, and the wiring WWL is electrically connected to a gate electrode of the transistor 22. A gate electrode of the transistor 21 is electrically connected to a second terminal of the transistor 22 and a first terminal (first electrode) of the capacitor 23, and the wiring RWL is electrically connected to a second terminal (second electrode) of the capacitor 23.

In FIG. 2A, a node where the electrode of the capacitor 23 and the gate electrode of the transistor 21 are electrically connected to each other is referred to as a node FN. A term "FN" means that the node can be in an electrically floating state. Note that in this specification and the like, a "node" refers to any point on a wiring provided to connect elements electrically.

In the memory circuit 25 shown in FIG. 2A, a potential of the gate electrode of the transistor 21 (node FN) can be retained for a long period. Writing, retention, and reading of the memory circuit 25 are described below.

For the data writing, first, a potential of the wiring WWL is set to a potential that turns on the transistor 22. Accordingly, the transistor 22 is turned on, and the potential of the wiring WBL is supplied to the gate electrode of the transistor 21 and the first terminal of the capacitor 23. That is, a predetermined charge is supplied to the capacitor 23. Here, either a low-level (L level) potential or a high-level (H level) potential is supplied to the wiring WBL. The charge corresponding to the potential level of the wiring WBL is supplied to the capacitor 23. Next, the potential of the wiring WWL is set to a potential that turns off the transistor 22. When the transistor 22 is turned off, the node FN becomes in the electrically floating state, and the charge supplied to the capacitor 23 is retained. In this way, writing to the memory circuit 25 in FIG. 2A is conducted.

Since the off-state current of the transistor 22 is extremely low, the charge supplied to the capacitor 23 is retained for a long period. Therefore, stored data can be retained even when power is not supplied.

Next, the data reading will be described. When an appropriate potential (reading potential) is supplied to the wiring RWL while a predetermined potential (constant potential) is supplied to the wiring RBL, the potential of the wiring SL varies depending on the amount of charge retained in the capacitor 23. In general, when the transistor 21 is an n-channel transistor, an apparent threshold voltage $V_{th\_H}$ in the case where the H level potential is given to the gate electrode of the transistor 21 is lower than an apparent threshold voltage $V_{th\_L}$ in the case where the L level potential is given to the gate electrode of the transistor 21. Here, an apparent threshold voltage refers to the potential of the wiring RWL which is needed to turn on the transistor 21. Thus, the potential of the wiring RWL is set to a potential $V_0$ which is between $V_{th\_H}$ and $V_{th\_L}$, whereby a potential supplied to the gate electrode of the transistor 21 can be determined. For example, in the case where the H level potential is supplied to the gate electrode of the transistor 21 in writing, the transistor 21 is turned on when the potential of the wiring RWL is $V_0$ ($>V_{th\_H}$). In the case where the L level potential is supplied, even when the potential of the wiring RWL is $V_0$ ($<V_{th\_L}$), the transistor 21 remains off. Therefore, the retained data can be read by referring to the potential of the wiring RBL.

When the memory circuits 25 are arranged in an array, it is necessary to read data only of an intended memory circuit 25. In the case where such reading is not performed, the wiring RWL may be supplied with a potential at which the transistor 21 is turned off regardless of the amount of charge retained in the capacitor 23, that is, a potential lower than $V_{th\_H}$. In the case of reading the data, the wiring RWL may be supplied with a potential at which the transistor 21 is turned on regardless of the amount of charge retained in the capacitor 23, that is, a potential higher than $V_{th\_L}$.

FIG. 2A is an example of a gain cell structure with two transistors. A structure of a memory cell is not limited to that shown in FIG. 2A. For example, a memory circuit 26 shown in FIG. 2B or a memory circuit 27 shown in FIG. 2C can be used in the memory cell.

Figure 2B:
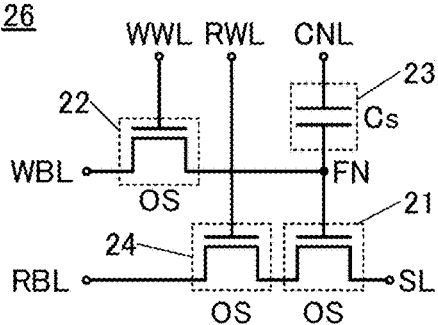

The memory circuit 26 shown in FIG. 2B is an example of a gain cell structure with three transistors. In the memory circuit 26, a transistor 24 functions as a reading transistor, and a gate of the transistor 24 is electrically connected to the wiring RWL. The first terminal of the capacitor 23 is electrically connected to the node FN, and the second terminal is electrically connected to a wiring CNL. The memory circuits 26 can operate in a way similar to that of the memory circuit 25. In data reading, the potential of the node FN is increased as necessary by controlling a potential of the wiring CNL.

Figure 2C:
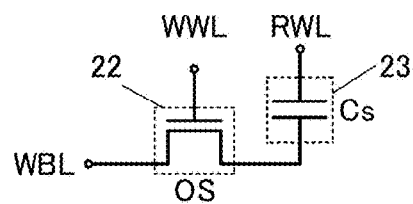

The memory circuit 27 shown in FIG. 2C is different from the memory circuit 25 in that the transistor 21 is not provided. The memory circuit 27 can operate in a way similar to that of the memory circuit 25. A reading operation of the memory circuit 27 is described below. When a transistor 22 is turned on, the wiring WBL in a floating state and the capacitor 23 are brought into conduction, whereby charge redistribution between the capacitor 23 and wiring capacitance accompanying the wiring WBL occurs. As a result, the potential of the wiring WBL is changed. The amount of change of the potential of the wiring WBL varies depending on the amount of charge stored in the capacitor 23 (or the potential of the first terminal of the capacitor 23).

For example, when the first terminal of the capacitor 23 (node FN) has a potential V, the capacitor 23 has capacitance C, the wiring WBL is accompanied by wiring capacitance $C_B$, and the wiring WBL has a potential $V_{B0}$ before charge redistribution, and when the potential of the wiring RWL is 0 [V] and a potential of another electrode of the wiring capacitance accompanying the wiring WBL is 0[V], the potential of the wiring WBL after charge redistribution is $(C_B \times V_{B0} + C \times V)/(C_B + C)$. Thus, it is found that, assuming that the potential V of the first terminal of the capacitor 23 is either $V_1$ or $V_0$ ($V_1 > V_0$) in the memory circuit 27, the potential of the wiring WBL when the capacitor 23 retaining the potential $V_1$ ($= (C_B \times V_{B0} + C \times V_1)/(C_B + C)$) is higher than the potential of the wiring WBL in the case of retaining the potential $V_0$ $(=(C_B \times V_{B0} + C \times V_0)/(C_B + C))$. Therefore, the data can be read by comparing the potential of the wiring WBL with a predetermined potential.

Figure 2D:
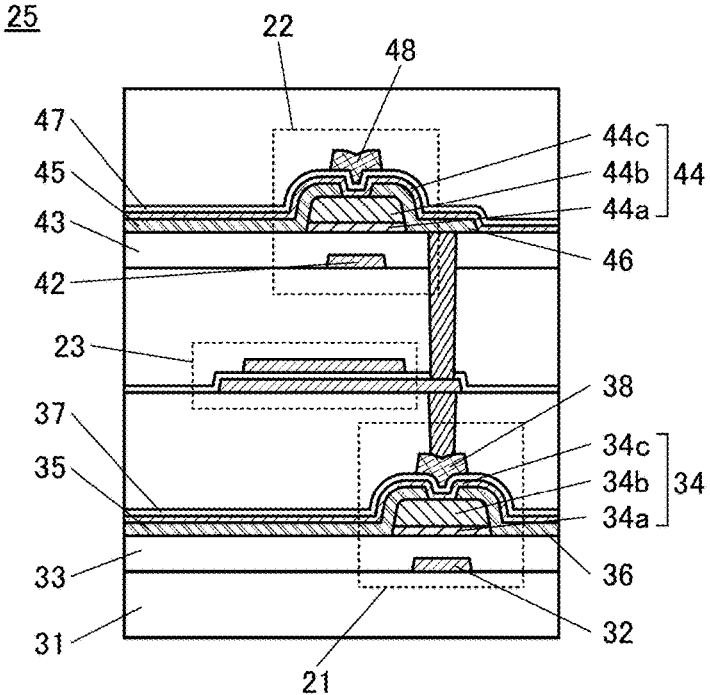
FIG. 2D is a cross-sectional view of the circuit in FIG. 2A

An example of a device structure of the memory circuit 25 shown in FIG. 2A is illustrated in FIG. 2D. FIG. 2D is a cross-sectional view in the channel length direction of the transistors 21 and 22 in the memory circuit 25. Note that the channel length direction of the transistor 21 does not necessarily coincide with that of the transistor 22 in an actual memory circuit 25. The same applies to the other drawings.

The memory circuit 25 shown in the FIG. 2D includes the transistor 21 over a substrate 31, the capacitor 23 over the transistor 21, the transistor 22 over the transistor 21 and the capacitor 23. The transistor 21 includes a conductive film 32 over the substrate 31; an insulating film 33 over the conductive film 32; a semiconductor film 34a over the insulating film 33; a semiconductor film 34b over the semiconductor film 34a; a conductive film 35 electrically connected to the semiconductor film 34b; a conductive film 36 electrically connected to the semiconductor film 34b; a semiconductor film 34c over the conductive film 35, the semiconductor film 34b, and the conductive film 36; an insulating film 37 over the semiconductor film 34c; and a conductive film 38 over the insulating film 37.

The conductive film 32 has a function as a back gate electrode of the transistor 21. The insulating film 33 has a function as a base film for the semiconductor film 34 and a function as a gate insulating film. The conductive films 35 and 36 have functions as a source electrode and a drain electrode. The insulating film 37 has a function as a gate insulating film. The conductive film 38 has a function as a gate electrode.

The transistor 22 includes a conductive film 42; an insulating film 43 over the conductive film 42; a semiconductor film 44a over the insulating film 43; a semiconductor film 44b over the semiconductor film 44a; a conductive film 45 electrically connected to the semiconductor film 44b; a conductive film 46 electrically connected to the semiconductor film 44b; a semiconductor film 44c over the conductive film 45, the semiconductor film 44b, and the conductive film 46; an insulating film 47 over the semiconductor film 44c; and a conductive film 48 over the insulating film 47.

The conductive film 42 has a function as a back gate electrode of the transistor 22. The insulating film 43 has a function as a base film for the semiconductor film 44 and a function as a gate insulating film. The conductive films 45 and 46 have functions as a source electrode and a drain electrode. The insulating film 47 has a function as a gate insulating film. The conductive film 48 has a function as a gate electrode. Although FIG. 2D shows a structural example where the transistors 21 and 22 include the back gate electrodes, the structure is not limited thereto, and a structure without a back gate electrode may be employed.

The components of the transistor 21, the capacitor 23, and the transistor 22 are overlapped with each other at least partially as shown in FIG. 2D, whereby the circuit system can have a small-sized circuit area.

Next, an example of a semiconductor device where a plurality of the memory circuits 25 shown in FIG. 2D are provided is described with reference to FIGS. 3A and 3B, FIG. 4, FIGS. 5A and 5B, FIG. 6, and FIG. 7.

<Structural Example of Memory Cell Array>

Figure 3A:
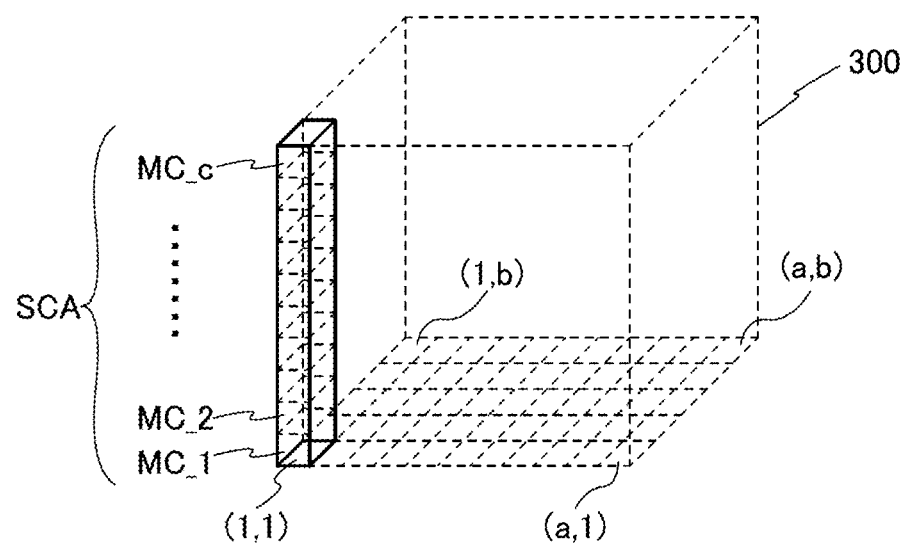
FIG. 3A is a schematic view illustrating an example of a memory cell array.

FIG. 3A is a schematic view illustrating an example of a memory cell array. In a memory cell array 300 shown in FIG. 3A, sub arrays SCA are arranged in an array of a columns and b rows (a and b are natural numbers). Each of the sub arrays SCA comprises c memory cells MC that are stacked (c is a natural number). In this way, the memory cell array 300 has a structure in which the memory cells MC are three-dimensionally arranged.

In the specification and drawings, an identification sign such as "_1", "[L1]" that indicates a row number, a column number, an order, or the like is added to a term in order to distinguish the same components (signals, wirings, elements, circuits, or the like). For example, a sign "MC_j" indicates a jth memory cell MC in a sub array SCA (j is a natural number from 1 to c).

Figure 3B:
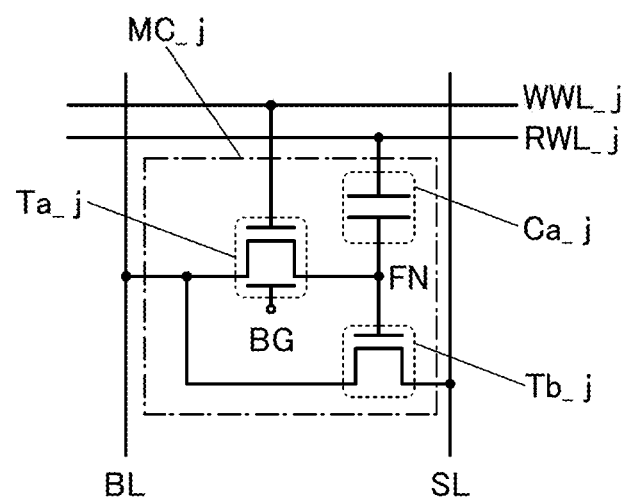
FIG. 3B is a circuit diagram illustrating an example of a memory cell.

The memory cell MC can have a circuit structure similar to that of the memory circuits 25 to 27 shown in FIGS. 2A to 2D. FIG. 3B shows an example of a circuit diagram of a memory cell MC_j. The memory cell MC_j shown in FIG. 3B includes a transistor Ta_j, a transistor Tb_j, and a capacitor Ca_j. The memory cell MC_j shown in FIG. 3B is a modification example of the memory circuit 25 in FIG. 2A. Here, the sign "Ta_j" indicates that the transistor Ta is a component of the memory cell MC_j. Similar signs are used in the other drawings.

A first terminal of the transistor Ta_j is electrically connected to a wiring BL, and a second terminal of the transistor Ta_j is electrically connected to a gate electrode of the transistor Tb_j. A gate electrode of the transistor Ta_j is electrically connected to a wiring WWL_j. A first terminal of the transistor Tb_j is electrically connected to the wiring BL, and a second terminal of the transistor Tb_j is electrically connected to a wiring SL. A first terminal (first electrode) of the capacitor Ca_j is electrically connected to the gate electrode of the transistor Tb_j, and a second terminal (second electrode) of the capacitor Ca_j is electrically connected to a wiring RWL_j.

The transistor Ta_j has a back gate electrode (BG). For example, a potential lower or higher than that of a source electrode can be applied to the back gate electrode, whereby the threshold voltage of the transistor Ta_j can be shifted in a positive or negative direction. For example, by shifting the threshold voltage of an n-channel transistor in the positive direction, a normally-off transistor can be achieved in some cases. The normally-off transistor means a transistor that is in a non-conduction state (off state) even when the gate potential is 0 V. The potential applied to the back gate electrode may be variable or fixed. When a potential applied to the back gate electrode is variable, a circuit for controlling the potential may be connected to the back gate electrode. The back gate electrode may be connected to the gate electrode of the transistor Ta_j. By supplying the same potential to the back gate electrode and the gate electrode that are connected to each other, the on-state current can be increased, variations in the initial characteristics can be reduced, degradation due to a negative gate bias-temperature (−GBT) stress test, and a change in the rising voltage of the on-state current at different drain voltages can be suppressed. When the on-state current of the transistor Ta_j is increased, writing time to the memory cell array 300 can be shortened, for example.

In addition, although not illustrated in FIG. 3B, the transistor Tb_j may also have a back gate electrode. With the back gate electrode, an on-state current of the transistor Tb_j can be increased, and reading speed of the memory cell array 300 can be higher due to the increase of the on-state current, for example.

Here, "data writing to the memory cell MC_j" means that a potential of a node FN is set to a potential corresponding to that of the wiring BL by controlling a word signal supplied to the wiring WWL_j. Furthermore, "data reading from the memory cell MC_j" means that the potential of the wiring BL is set to a potential corresponding to that of the node FN by controlling a read signal supplied to the wiring RWL_j.

A potential corresponding to binary or multilevel data is supplied to the wiring BL. The multilevel data is k-bit (k is a natural number of 2 or more) data. Specifically, 2-bit data is 4-level data, and a potential supplied to the wiring BL has any one of the four levels of potentials. A read signal is supplied to the wiring RWL_j. The read signal is a signal to control a potential of the node FN for selectively reading data from the memory cell MC_j. In addition, a word signal is supplied to the wiring WWL_j. The word signal is a signal which turns on the transistor Ta_j so that the potential of the wiring BL is supplied to the node FN.

The node FN corresponds to any node on a wiring that connects the first electrode of the capacitor Ca_j, the second terminal of the transistor Ta_j, and the gate electrode of the transistor Tb_j. For example, a liquid crystal element, an organic EL (electroluminescence) element may be electrically connected to the node FN. If the above display element is provided, part of the memory cell MC_j can function as a pixel of the display device.

The potential of the node FN is a potential based on data supplied to the wiring BL. The node FN is in an electrically floating state when the transistor Ta_j is off, and the transistor Tb_j and the wiring RWL_j make capacitive coupling by the capacitor Ca_j. Therefore, the potential of the node FN can be changed by changing the potential of the wiring RWL_j. Thus, in the case where the potential of the read signal supplied to the wiring RWL_j is changed, the potential of the node FN reaches a potential which is the sum of the previous potential and the amount of change in the potential of the read signal.

The transistor Ta_j has a function as a switch for controlling data writing by being turned on and off. The transistor Ta_j has a function of retaining a potential based on written data by being kept off. Here, the transistor Ta_j is an n-channel transistor.

Note that, as the transistor Ta_j, a transistor having a low current (low off-state current) which flows between a source electrode and a drain electrode in a non-conducting state is preferably used. Here, the "low off-state current" means that a normalized off-state current per micrometer of a channel width at a voltage of 10 V between the source electrode and the drain electrode at room temperature is less than or equal to 10 zA. An example of a transistor having such a low off-state current is a transistor including an oxide semiconductor in a semiconductor layer.

A transistor with a low off-state current is used as the transistor Ta_j, whereby the potential of the node FN in an electrically floating state can be held for a long time. This can reduce the frequency of refresh operations of the memory cell MC_j; thus, the semiconductor device can have low power consumption.

To hold a potential retained in the node FN at 85° C. for 10 years ($3.15 \times 10^8$ sec), for example, the normalized off-state current of the transistor Ta_j is preferably lower than 4.3 yA (yoctoamperes, where 1 yA is $1 \times 10^{-24}$ A) per fF of capacitance. In that case, the allowable potential variation in the node FN is preferably within 0.5 V. Alternatively, the normalized off-state current is preferably lower than 1.5 yA at 95° C.

In the memory cell MC_j shown in FIG. 3B, the potential of the node FN is held by keeping the transistor Ta_j off. Thus, the transistor Ta_j is preferably a transistor with a low off-state current for use as a switch that can suppress potential change with charge transfer o in the node FN.

Therefore, when the transistor Ta_j has a low off-state current, the memory cell array 300 can be a non-volatile memory. Thus, once data is written to the memory cell MC_j, the data can be held in the node FN until the transistor Ta_j is turned on again.

In the transistor Tb_j, a current $I_d$ flows between the source electrode and the drain electrode in accordance with the potential of the node FN. In the memory cell MC_j shown in FIG. 3B, the current $I_d$ flowing between the source electrode and the drain electrode in the transistor Tb_j is a current flowing between the wiring BL and the wiring SL. As the transistor Tb_j, a transistor using silicon in an active layer (hereinafter referred to as a Si transistor) or an OS transistor using an oxide semiconductor in an active layer may be used. Here, the transistor Tb_j is an n-channel OS transistor.

An n-channel transistor which has high switching speed can be used for the transistors Ta_j and Tb_j. For example, the switching speed of the transistor is larger than or equal to 0.1 nsec and less than 5 nsec. For example, an OS transistor whose channel region includes an oxide semiconductor (preferably oxide including In, Ga, and Zn) can achieve the above switching speed. Note that the switching speed of the transistor indicates time taken for the transistor to be changed from off to on. Alternatively, the switching speed can be expressed by speed corresponding to maximum frequency (cutoff frequency) with which the current gain of the transistor is 1 or more when the transistor is used as an amplifier.

<Circuit Configuration Example 1 of Memory Cell Array>

Figure 4:
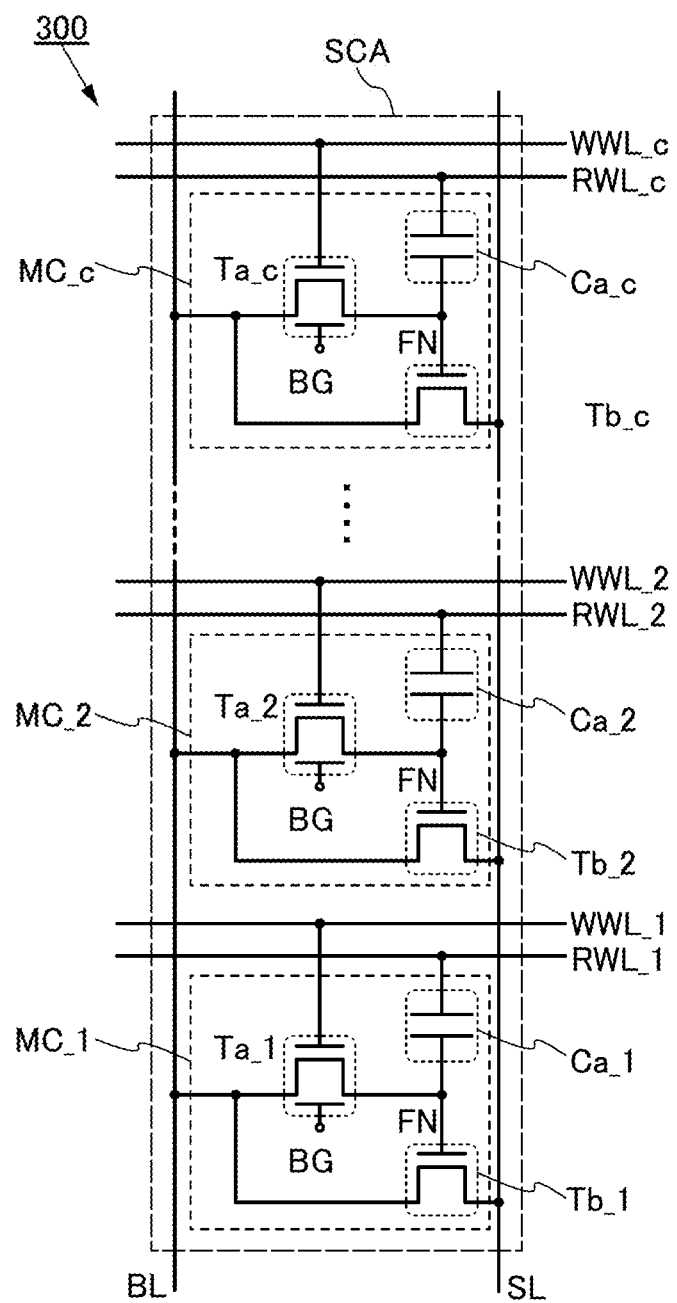
FIG. 4 is a circuit diagram illustrating an example of a memory cell array.

FIG. 4 illustrates an example of the memory cell array 300 where the memory cells MC_j shown in FIG. 3B are three-dimensionally arranged. FIG. 4 is a circuit diagram illustrating an example of the memory cell array 300, and also a circuit diagram illustrating an example of the sub array SCA. As shown in FIG. 4, the sub array SCA has c memory cells MC, and the memory cells MC share the wiring BL and the wiring SL.

<Operation Example of Memory Cell Array>

Figure 5A:
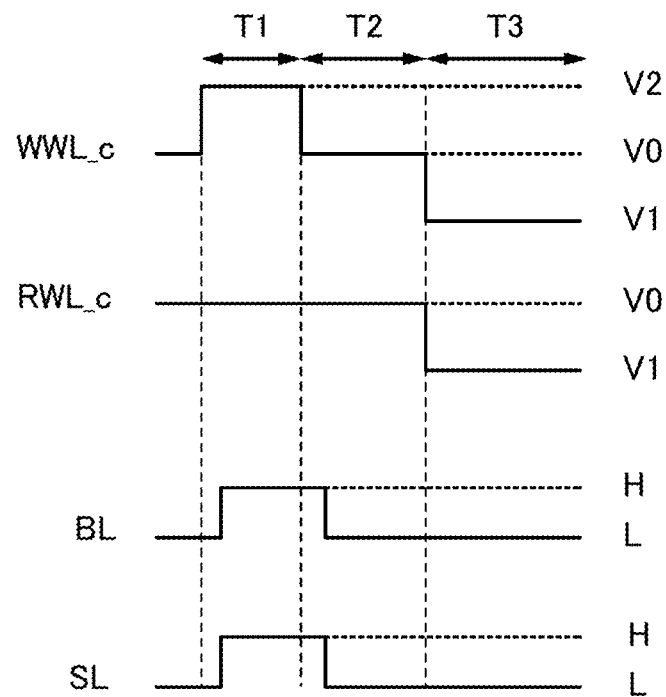
FIG. 5A and FIG. 5B are timing charts illustrating an example of operation of a memory cell array.
Figure 5B:
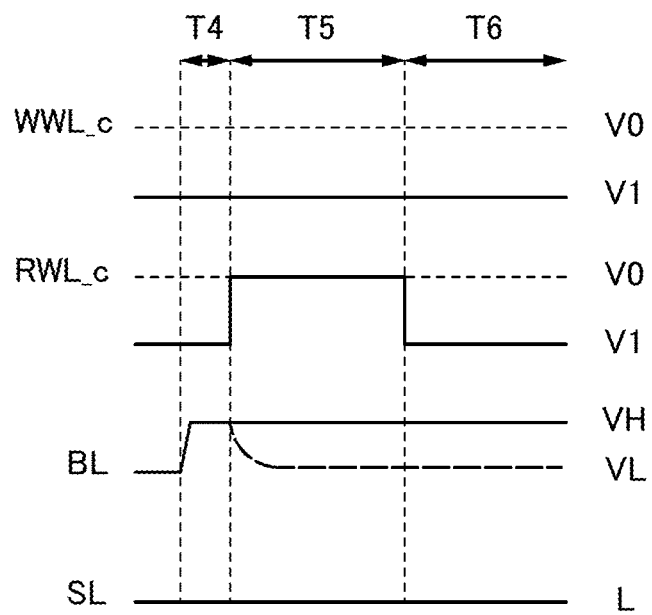

Next, operation of the memory cell array 300 illustrated in FIG. 4 is described. FIGS. 5A and 5B are timing charts illustrating an operation example of the memory cell array 300 shown in FIG. 4. The timing charts in FIGS. 5A and 5B show change of signals supplied to a wiring WWL_c, a wiring RWL_c, the node FN, the wiring BL, and the wiring SL.

First, with reference to FIG. 5A, writing operation is described. Though writing of binary data is described here, writing to the memory cell array 300 is not limited to the writing of binary data, and multilevel data may be written. The timing chart in FIG. 5A shows a writing period T1, a break period T2, and a non-selection period T3.

In the writing period T1, a potential V2 is supplied to the wiring WWL_c first. Next, a potential corresponding to binary data, that is, a potential at high (H) level or at low (L) level is supplied to the wiring BL. The wiring SL is supplied with a potential at the same level as that of the wiring BL. When the potential of the wiring BL is at the H level, the wiring SL is also supplied with the H level potential. When the potential of the wiring BL is at the L level, the wiring SL is also supplied with the L level potential.

In the break period T2, the wiring BL and the wiring SL are supplied with L level potentials, and the wiring RWL_c and the wiring WWL_c are supplied with potentials V0. Here, the potential V0 is a ground potential, and the potential V2 is a positive potential. The absolute value of the potential V2 is preferably larger than the H level potential, and may be, for example, larger than the sum of the H level potential and the threshold voltage of the transistor Ta_c while less than 3 times the sum of the H level potential and the threshold voltage of the transistor Ta_c.

In the non-selection period T3, the wiring RWL_c and the wiring WWL_c are supplied with potentials V1. The potential V1 is a negative potential, for example. The absolute value of the potential V1 is preferably larger than the H level potential, and may be, for example, larger than the sum of the H level potential and the threshold voltage of the transistor Tb_c while less than 3 times the sum of the H level potential and the threshold voltage of the transistor Tb_c. The wiring BL and the wiring SL are supplied with the L level potentials.

Next, with reference to FIG. 5B, reading operation is described. The timing chart in FIG. 5B shows a period T4 for precharging the wiring BL, a period T5 for discharging the wiring BL for reading data, and a non-selection period T6.

In the period T4 in FIG. 5B, the wiring BL is precharged. Here, the wiring WWL_c and the wiring RWL_c are supplied with the potentials V1. Here, the potential V1 is lower than the potential V0. For example, the potential V0 is a ground potential and the potential V1 is a negative potential. A potential corresponding to the data is retained in the node FN. The wiring BL is supplied with the H level potential (VH). The wiring SL is supplied with the L level potential. Here, the absolute value of the potential V1 is preferably larger than the H level potential, and may be, for example, larger than the sum of the H level potential and the threshold voltage of the transistor Tb_c while less than 3 times the sum of the H level potential and the threshold voltage of the transistor Tb_c.

In the period T4, the wiring BL is supplied with the H level potential VH to become in an electrically floating state. That is, the wiring BL is brought into a state in which the potential is changed by the charging or discharging of electrical charge. The floating state can be achieved by turning off a switch supplying a potential to the wiring BL.

Next, in the period T5 shown in FIG. 5B, the wiring BL is discharged with the potential of the node FN for reading the data. Here, from the period T4, the wiring WWL_c is continuously supplied with the potential V1, and the wiring SL is continuously supplied with the L level potential. Since the wiring RWL_c is supplied with the potential V0, the potential of the node FN is stepped up. The on/off state of the transistor Tb_c is determined depending on the potential of the node FN. When the H level potential is written to the node FN, the transistor Tb_c is turned on, whereby the potential of the wiring BL is stepped down to the potential VL. When the L level potential is written to the node FN, the transistor Tb_c is not turned on, so that the potential of the wiring BL is kept at the H level.

Next, in the period T6 shown in FIG. 5B, the potential of the wiring RWL_c is set to V1, whereby the memory cell MC_c is deselected. Then, the operation of reading data from the memory cell MC_c is completed.

<Circuit Configuration Examples 2 and 3 of Memory Cell Array>

Figure 6:
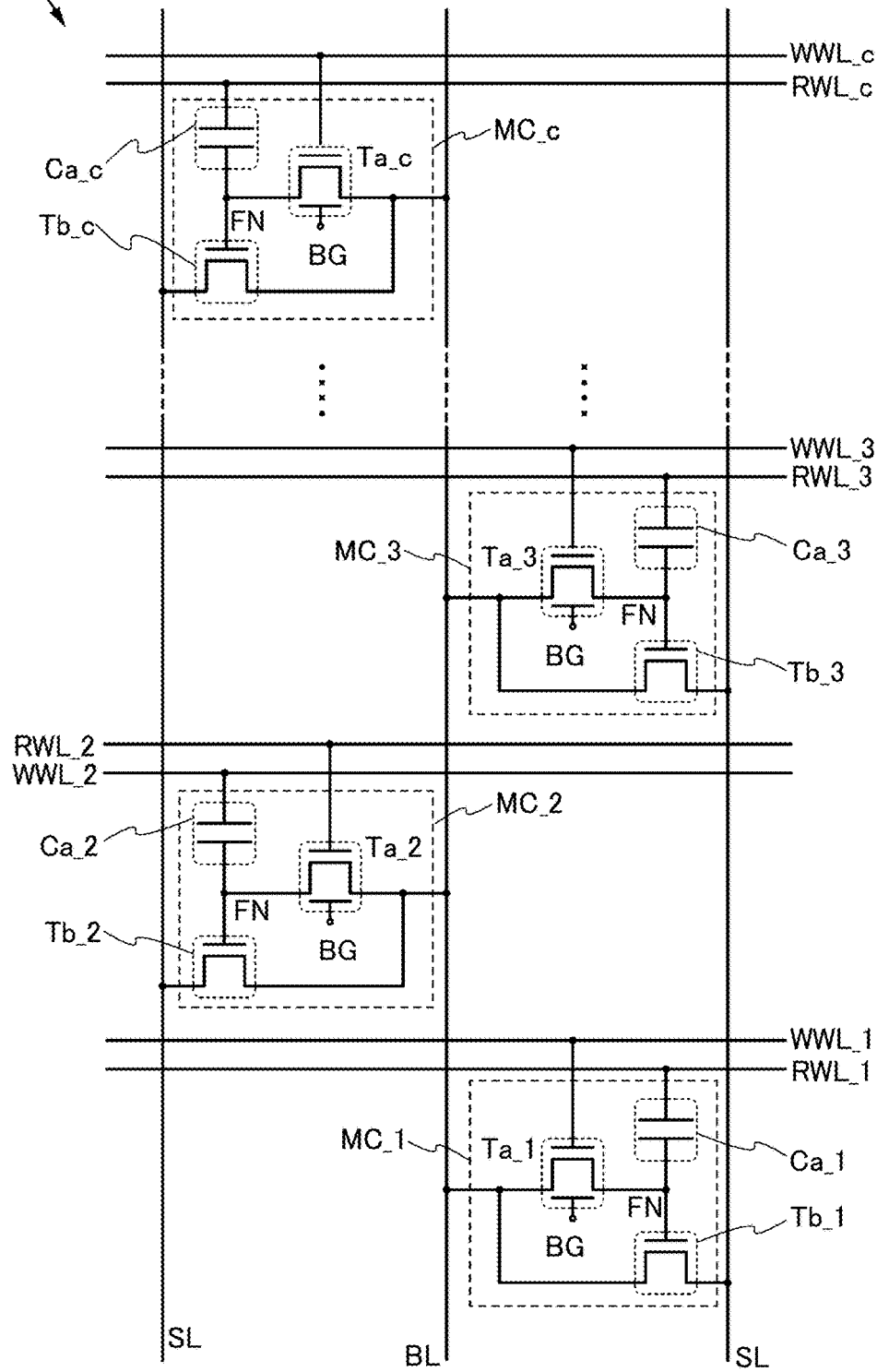
FIG. 6 is a circuit diagram illustrating an example of a memory cell array.
Figure 7:
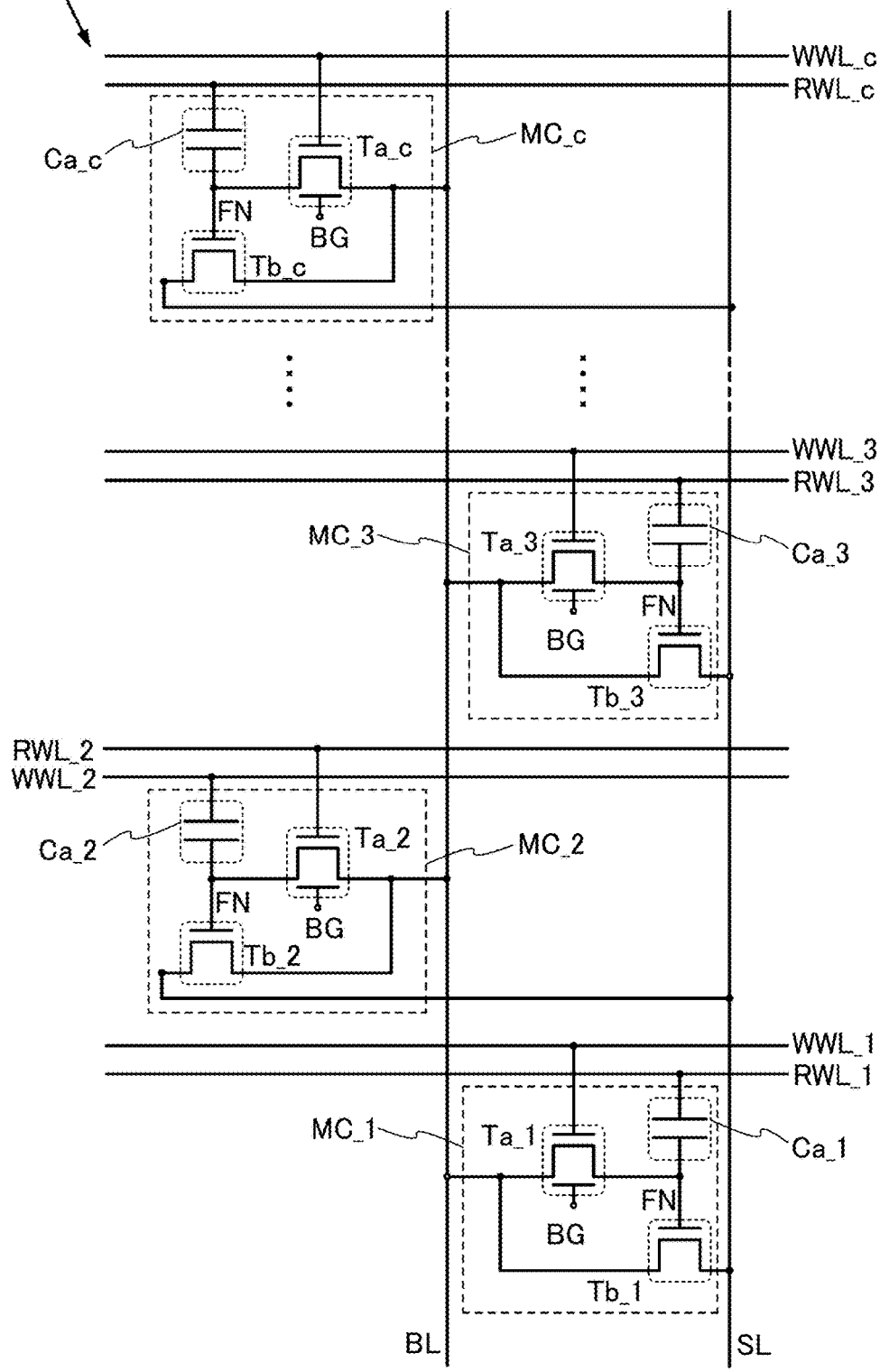
FIG. 7 is a circuit diagram illustrating an example of a memory cell array.

FIG. 6 and FIG. 7 illustrate other circuit configuration examples of the memory cell array 300. FIG. 6 and FIG. 7 are circuit diagrams illustrating examples of the memory cell array 300, and also circuit diagrams illustrating examples of the sub array SCA.

The circuit configuration example in FIG. 6 is a modification example of FIG. 4. Different points from FIG. 4 are that, in the FIG. 6, odd-numbered memory cells MC are electrically connected to a wiring SL while even-numbered memory cells MC are electrically connected to another wiring SL, and that the odd-numbered memory cells MC and the even-numbered memory cells MC are alternately connected to the wiring BL. Thus, the integration degree of the sub array SCA can be increased. Further, storage capacity per unit area can be increased. In the sub array SCA in FIG. 7, c memory cells MC share one wiring SL. Thus, the number of the wirings SL can be reduced.

<Example 1 of Stacked-Layer Structure of Memory Cell>

Figure 8:
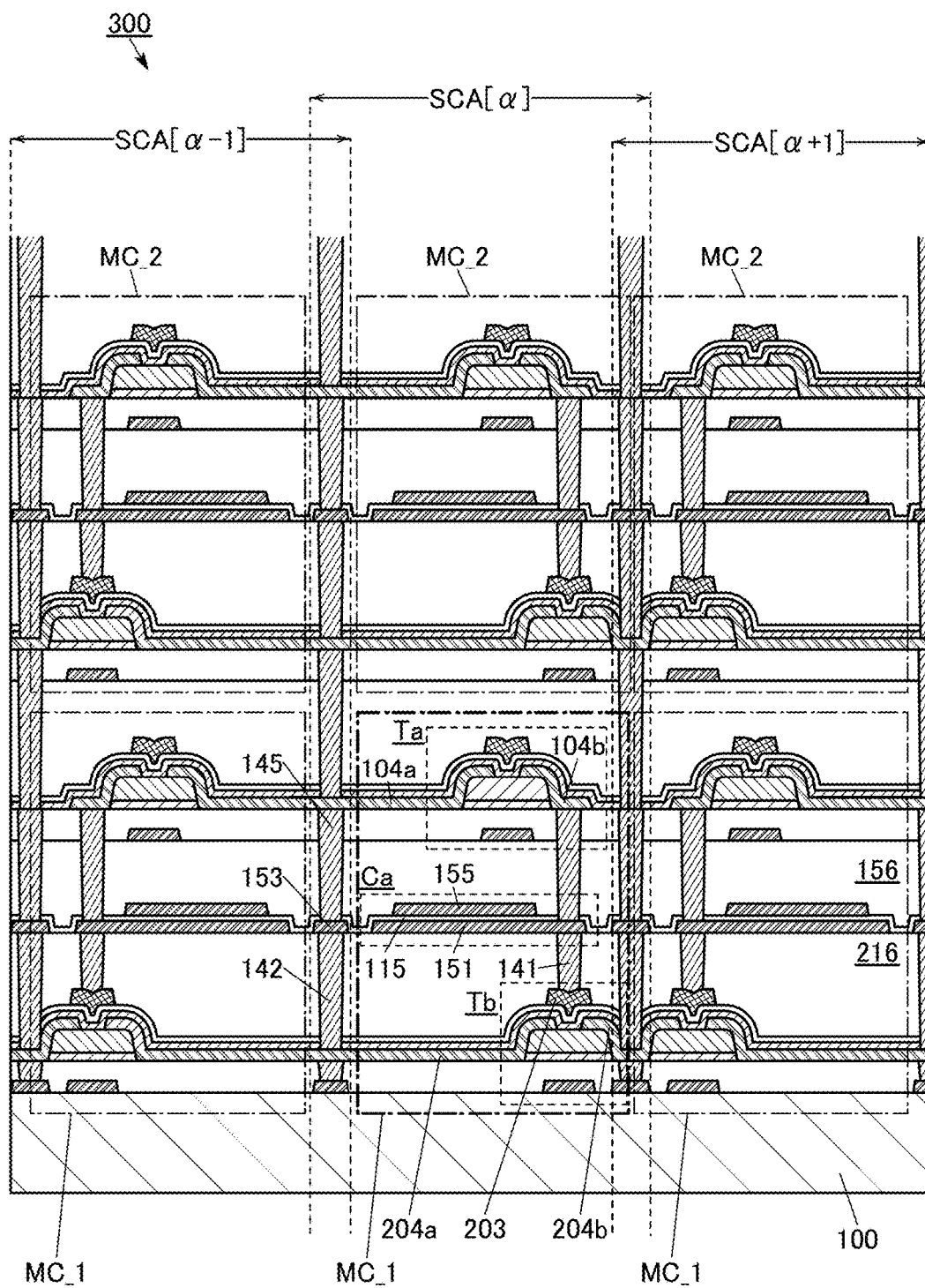
FIG. 8 is a cross-sectional view illustrating an example of a memory cell array.

FIG. 8 is a cross-sectional view illustrating an example of a memory cell array. An example in FIG. 8 corresponds to an example where the memory cell array is formed using the sub arrays SCA each having a circuit structure shown in FIG. 4.

FIG. 8 shows three sub arrays (SCA[α−1], SCA[α], and SCA[α+1]) that are adjacent to each other. The "sub arrays that are adjacent to each other" means that, in the x-y plane in FIG. 3A, either an x-coordinate or a y-coordinate of a sub array is different from that of another sub array, while the other coordinate is the same as that of the other sub array. For example, when the three sub arrays (SCA[α−1], SCA[α], SCA[α+1]) have the same y-coordinate, and the x-coordinate of the sub array SCA[α] is k (k is an integer number larger than or equal to 2 and smaller than or equal to a), the x-coordinate of the sub array SCA[α−1] is k−1, and that of the sub array SCA[α+1] is k+1.

FIG. 8 illustrates memory cells MC_1 and MC_2 of the sub arrays (SCA[α−1], SCA[α], SCA[α+1]). Not illustrated in the drawing, but memory cells MC_3 to memory cells MC_c are stacked in order over the memory cells MC_2 of the sub arrays. By increasing the number of the stacked layers of the memory cells MC, the integration degree of the memory cell array 300 can be increased without increase of the circuit area.

The device structure of the memory cell array 300 shown in FIG. 8 is described below. In FIG. 8, for simplification of the drawing, part of components forming the memory cell array 300 (such as a transistor Ta) does not have an identification sign of "_1". In the specification, the structure of the memory cell array 300 is described using or not using the identification sign of "_1" or the like. The same can be said for the other drawings.

A transistor Ta and a transistor Tb in each of the memory cells MC include an oxide semiconductor material. A capacitor Ca is over the transistor Tb. An insulating film 216 is between the transistor Tb and the capacitor Ca. At least part of the capacitor Ca preferably overlaps with the transistor Tb. An insulating film 115 is between conductive films 151 and 155, and constitutes the capacitor Ca. Conductive films 204a and 204b each function as a source electrode or a drain electrode of the transistor Tb. The conductive film 151 is electrically connected to a gate electrode 203 of the transistor Tb through a plug 141.

The transistor Ta is over the capacitor Ca. An insulating film 156 is between the capacitor Ca and the transistor Ta. At least part of the transistor Ta preferably overlaps with the capacitor Ca. Conductive films 104a and 104b each function as a source electrode or a drain electrode of the transistor Ta.

The conductive films 204a and 204b are electrically connected to the wirings SL (not illustrated in the drawing). The conductive film 204a is electrically connected to the conductive film 104a through a plug 142, a conductive film 153, a plug 145, and the like. The conductive films 204a and 104a are electrically connected to the wiring BL (not illustrated in the drawing). The plug 142, the conductive film 153, the plug 145, and the like may function as the wiring BL.

The two adjacent memory cells MC_j share the plug 142, the conductive film 153, and the like. Specifically, the memory cell MC_j in the sub array SCA[α] shares the plugs 142 and 145 and the conductive film 153 with the memory cell MC_j in the sub array SCA[α−1]. The integration degree of the memory cell array 300 can be increased when the two adjacent sub arrays share plugs and conductive film.

In addition, the adjacent memory cells MC_j share the conductive films 104a and 204b. Specifically, the transistors Ta of the sub array SCA[α−1] and the sub array SCA[α] share the conductive film 104a, and the transistors Tb of the sub array SCA[α] and the sub array SCA[α+1] share the conductive film 204a. The integration degree of the memory cell array 300 can be increased by sharing conductive films.

<Example 2 of Stacked-Layer Structure of Memory Cell>

Figure 9:
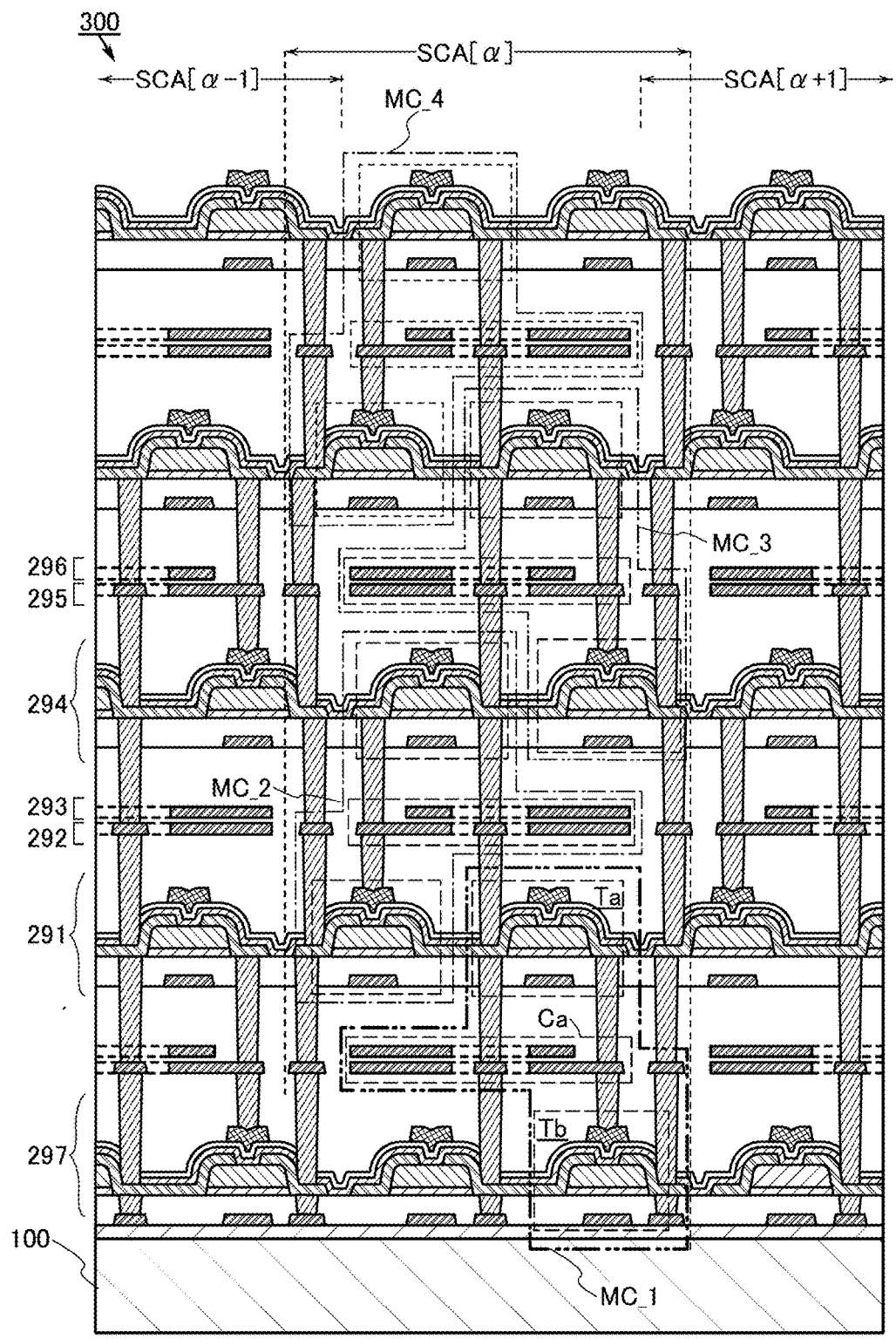
FIG. 9 is a cross-sectional view illustrating an example of a memory cell array.
Figure 10:
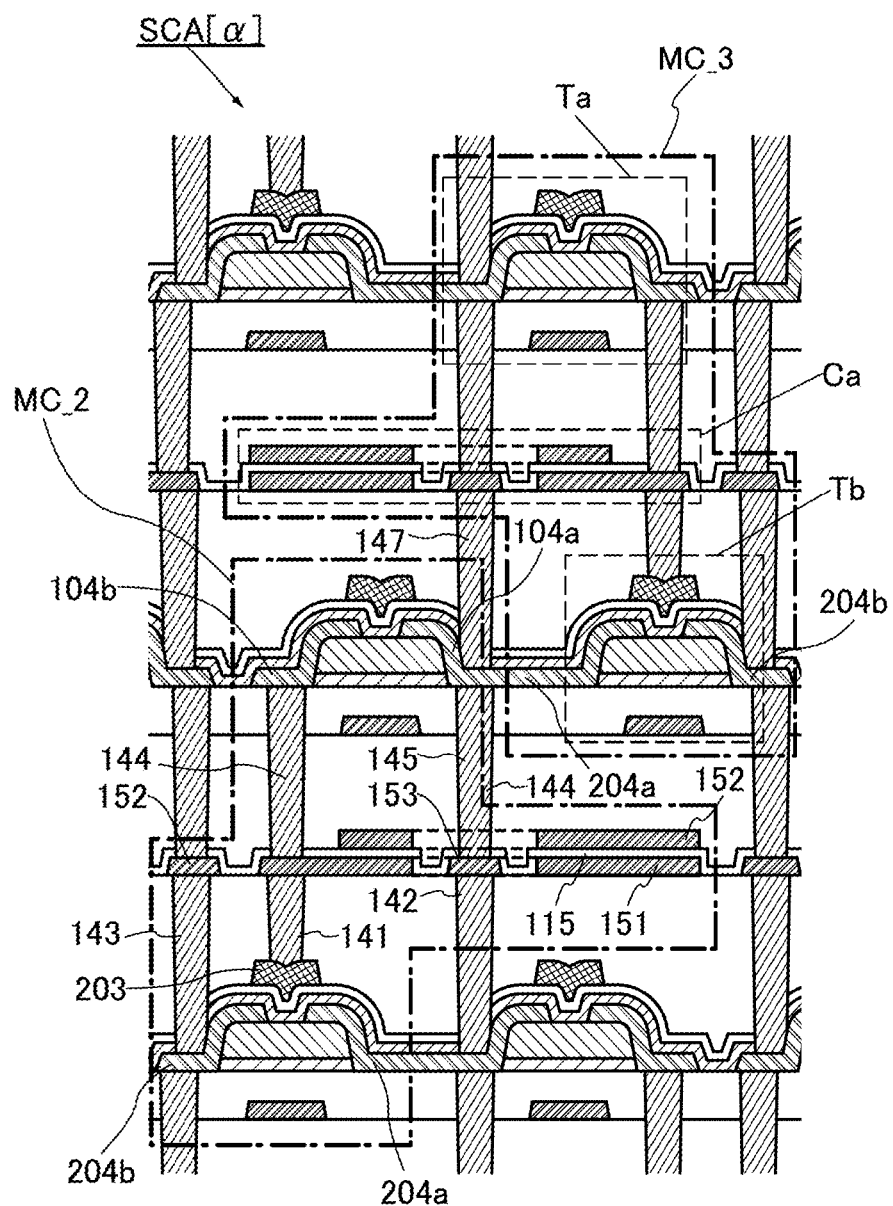
FIG. 10 is a partial enlarged view of FIG. 9.

FIG. 9 and FIG. 10 show a modification example of the memory cell array 300 shown in FIG. 8. FIG. 10 is a partial enlarged view of FIG. 9. The memory cell array 300 in FIG. 9 is formed over the substrate 100, and has layers 291 to 297. The layer 291 includes a transistor. The layers 292 and 293 include conductive films. The layer 294 includes a transistor. The layers 295 and 296 include conductive films. The layer 297 includes a transistor.

In the sub array SCA in the memory cell array 300 in FIG. 8, the stack order is as follows: the transistor Tb, the capacitor Ca, the transistor Ta, the transistor Tb, the capacitor Ca, and the transistor Ta. On the other hand, in the sub array SCA in FIG. 9, the memory cells MC are alternately arranged; therefore, the stack order is as follows: the transistor Tb, the capacitor Ca, the transistor Ta, the capacitor Ca, and the transistor Tb. Thus, the manufacturing process can be simplified.

In the memory cell MC, the capacitor Ca is over the transistor Tb, and the transistor Ta is over the capacitor Ca. The capacitor Ca preferably has a region overlapping with the transistor Tb, and a region overlapping with the transistor Ta. In addition, part of the capacitor Ca may have a region overlapping with another transistor Tb in an adjacent memory cell MC. With the device structure shown in FIG. 9, the integration degree of the memory cell array 300 can be increased.

Specifically, the memory cell MC_2 and the memory cell MC_3 are symmetrical in the sub array SCA[α]. Thus, the capacitor Ca overlaps with the transistors Ta and Tb. With such a structure, the memory cells MC can be alternately arranged in the sub array SCA, and the capacitor can be over the transistor Ta that is in the immediately below the memory cell MC, whereby the integration degree can be increased. The manufacturing process can be simplified compared with that of the memory cell array 300 shown in FIG. 8.

In the sub array SCA[α], c memory cells are alternately arranged; therefore, in memory cells MC adjacent to each other in the perpendicular direction, the transistor Ta in a memory cell MC and the transistor Tb in the other memory cell MC are formed in the same layer. In this way, the transistors which are in the memory cells adjacent to each other in the perpendicular direction are formed in the same layer, whereby the number of layers for forming the memory cell array 300 can be reduced, and thus the memory cell array 300 can be manufactured by less steps. Manufacturing by less steps can increase yield. In addition, when the number of stacked layers is increased, the films are possibly peeled or broken due to film stress of insulating films, conductive films, semiconductor films, and the like. Therefore, when the number of stacked layers is reduced, the malfunction of the semiconductor device due to film peeling or the like can be suppressed.

<Example 3 of Stacked-Layer Structure of Memory Cell>

Figure 11:
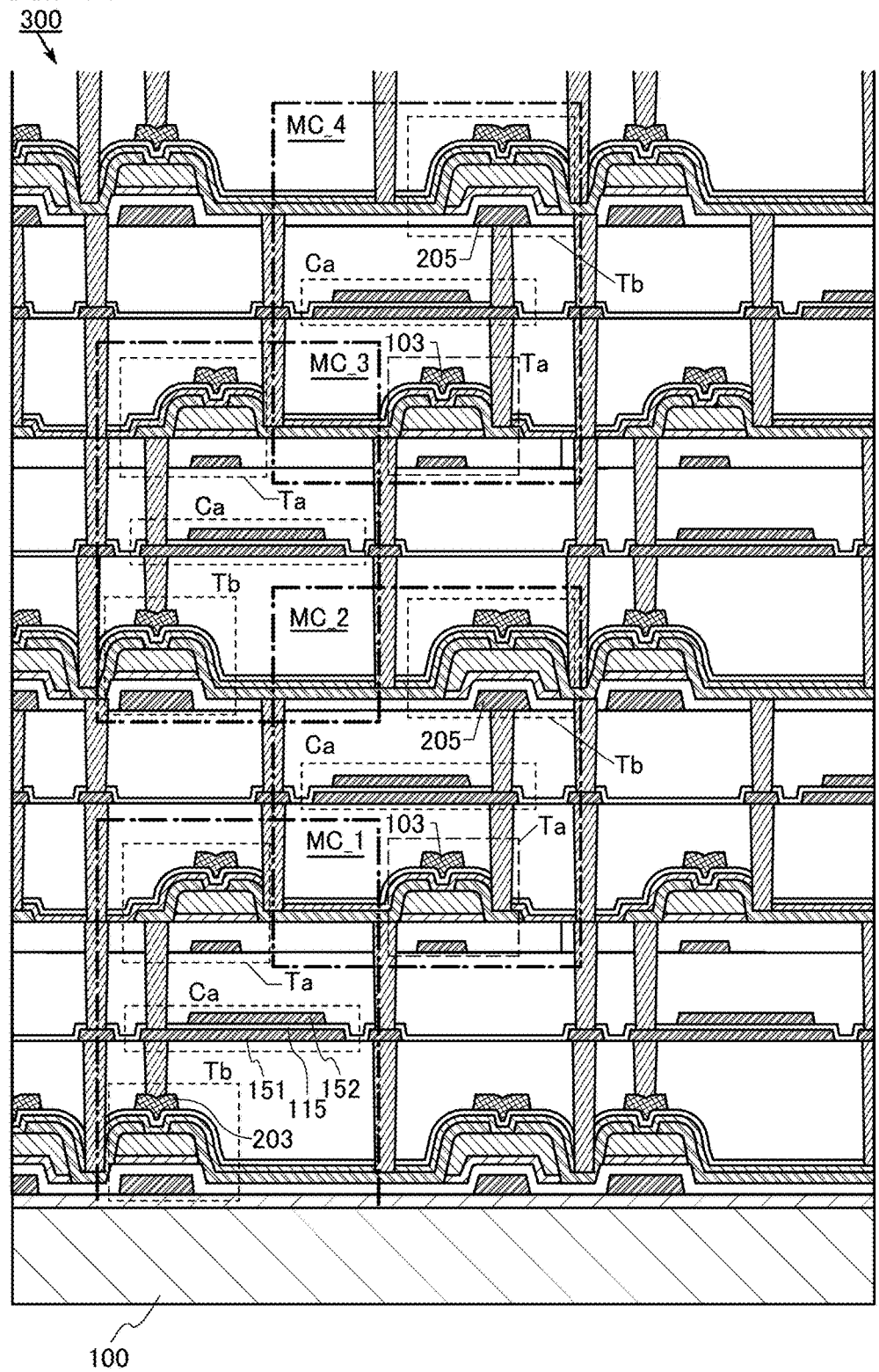
FIG. 11 is a cross-sectional view illustrating an example of a memory cell array.

FIG. 11 illustrates an example of a memory cell array. The memory cell array 300 shown in FIG. 11 is a modification example of the memory cell array 300 shown in FIG. 8 and FIG. 9.

The memory cell array 300 shown in FIG. 11 is the same as that in FIG. 9 in that the memory cells MC are alternately arranged. Difference is described below. In some of the memory cells MC, the capacitor Ca is over the transistor Ta, and the transistor Tb is over the capacitor Ca. In addition, a gate electrode 203 of the transistor Tb is electrically connected the capacitor Ca in the odd-numbered memory cells MC (MC_1 and MC_3 in FIG. 11), while in the even-numbered memory cells MC (MC_2 and MC_4 in FIG. 11), a conductive film 205 is electrically connected to the capacitor Ca. The conductive film 205 functions as a back gate electrode of the transistor Tb.

That is, in FIG. 11, the structure of the memory cell MC_j where j is an odd number is different from that of the memory cell MC_j where j is an even number. In addition, in the example of FIG. 11, the transistor Ta needs not be formed in the same layer as the transistor Tb, and a semiconductor film included in the transistor Ta may be different from that included in the transistor Tb. Therefore, it is easy to form the semiconductor films of the transistors Ta and Tb with, for example, oxide semiconductor films each different in constituent elements or an atomic ratio.

The above is description regarding structural examples of the memory call array 300. Next, structures of the transistors Ta and Tb included in the memory cell array 300 are described.

<Structural Example 1 of Transistor>

Figure 12A:
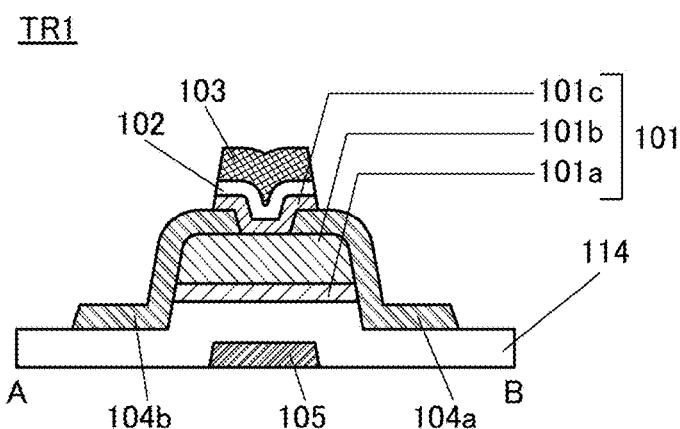
FIGS. 12A and 12C are cross-sectional views thereof.
Figure 12B:
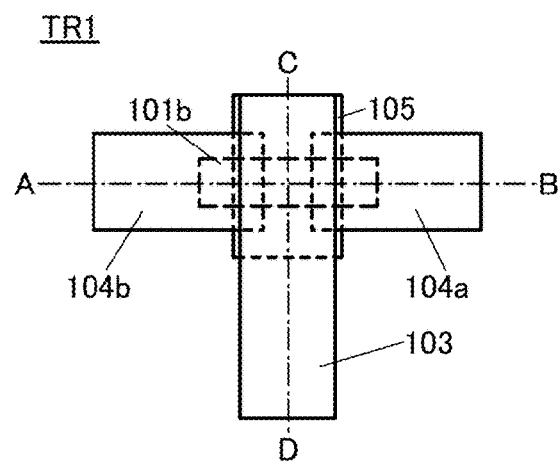
FIG. 12B is a top view illustrating an example of a transistor.
Figure 12C:
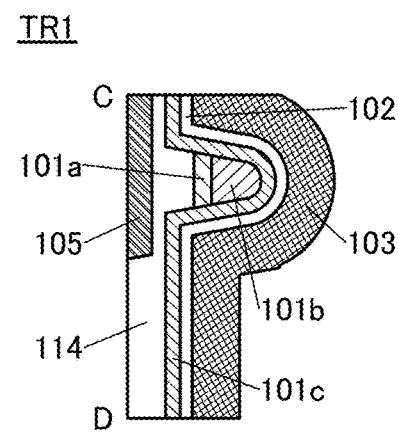

FIG. 12B is a top view of a structural example of a transistor, FIG. 12A is a cross-sectional view taken along A-B line in FIG. 12B, and FIG. 12C is a cross-sectional view taken along C-D line in FIG. 12B. A transistor TR1 in FIGS. 12A to 12C is an OS transistor, and is an example of a transistor corresponding to the transistor Ta in the memory cell MC. The transistor TR1 can be also used as the transistor Tb.

The transistor TR1 includes a semiconductor film 101, a conductive film 104a, a conductive film 104b, a gate insulating film 102, a gate electrode 103, a conductive film 105, and an insulating film 114.

The semiconductor film 101 includes a semiconductor film 101a in contact with an upper surface of the insulating film 114, a semiconductor film 101b in contact with an upper surface of the semiconductor film 101a, and a semiconductor film 101c in contact with an upper surface of the semiconductor film 101b. In the example of FIG. 12A, the semiconductor film 101 has a stacked-layer structure of the semiconductor film 101a, the semiconductor film 101b, and the semiconductor film 101c; however, the structure of the semiconductor film 101 is not limited thereto, and may be formed with a single layer. End portions of the gate electrode 103, the gate insulating film 102, and the semiconductor film 101c are substantially aligned with each other. This is because the gate electrode 103 functions as a mask in an etching step for formation of the gate insulating film 102 and the semiconductor film 101c.

The conductive films 104a and 104b each function as a source electrode or a drain electrode. The conductive films 104a and 104b are in contact with the upper surface of the semiconductor film 101*b*, and are isolated from each other on the upper surface of the semiconductor film 101*b*. The semiconductor film 101*c* is in contact with upper surfaces of the semiconductor film 101*b* and the conductive films 104*a* and 104*b*. The gate electrode 103 faces the semiconductor film 101 with the gate insulating film 102 positioned therebetween, and the conductive film 105 faces the semiconductor film 101 with the insulating film 114 positioned therebetween. The conductive film 105 functions as a back gate electrode of the transistor TR1.

In other words, the semiconductor film 101*a* is between the insulating film 114 and the semiconductor film 101*b*. The semiconductor film 101*c* is between the semiconductor film 101*b* and the gate insulating film 102. The conductive films 104*a* and 104*b* are in contact with the upper surface of the semiconductor film 101*b* and the bottom surface of the semiconductor film 101*c*. Side surfaces of the semiconductor film 101*b* are in contact with the conductive films 104*a* and 104*b*.

Note that a structure in which the conductive film 105 is not provided may be employed. Alternatively, though not illustrated in the drawing, the conductive film 105 may be electrically connected to the gate electrode 103. For example, when the conductive film 105 is electrically connected to the gate electrode 103 and the same potential is applied to them, it is possible to increase an on-state current, reduce variations in the initial characteristics, and suppress degradation of the transistor due to the a negative gate bias-temperature (−GBT) stress test and a change in the rising voltage of the on-state current at different drain voltages. The increase of the on-state current of the transistor TR1 may increase the reading speed of the memory cell array 300, for example.

The semiconductor film 101*b* can be electrically surrounded by an electric field of the gate electrode 103 (a structure in which a semiconductor film is electrically surrounded by an electric field of a conductive film is referred to as a surrounded channel (s-channel) structure). The transistor TR1 is a device with an s-channel structure. Therefore, a channel is formed in the entire semiconductor film 101*b* (bulk) in some cases. In the s-channel structure, a large amount of current can flow between a source electrode and a drain electrode of a transistor, so that current in an on state (on-state current) can be high.

The above-described s-channel structure is suitable for a miniaturized OS transistor because a high on-state current can be obtained. In addition, since an OS transistor can be miniaturized, a semiconductor device including the OS transistor can have a high integration degree and high density. For example, the channel length of an OS transistor is preferably larger than or equal to 1 nm and less than 100 nm, or further preferably larger than or equal to 5 nm and less than or equal to 60 nm.

Note that the channel length refers to, for example, a distance between a source (a source region or a source electrode) and a drain (a drain region or a drain electrode) in a region where a semiconductor (or a portion where a current flows in a semiconductor when a transistor is on) and a gate electrode overlap with each other or a region where a channel is formed in a top view of the transistor. In one transistor, channel lengths in all regions are not necessarily the same. In other words, the channel length of one transistor is not limited to one value in some cases. Therefore, in this specification and the like, the channel length is any one of values, the maximum value, the minimum value, or the average value in a region where a channel is formed.

A channel width refers to, for example, the length of a portion where a source (a source region or a source electrode) and a drain (a drain region or a drain electrode) face each other in a region where a semiconductor (or a portion where a current flows in a semiconductor when a transistor is on) and a gate electrode overlap with each other, or a region where a channel is formed. In one transistor, channel widths in all regions do not necessarily have the same value. In other words, a channel width of one transistor is not fixed to one value in some cases. Therefore, in this specification, a channel width is any one of values, the maximum value, the minimum value, or the average value in a region where a channel is formed.

Note that depending on transistor structures, a channel width in a region where a channel is formed actually (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is higher than the proportion of a channel region formed in a top surface of the semiconductor in some cases. In that case, an effective channel width obtained when a channel is actually formed is greater than an apparent channel width shown in the top view.

In a transistor having a three-dimensional structure, an effective channel width is difficult to measure in some cases. For example, to estimate an effective channel width from a design value, it is necessary to assume that the shape of a semiconductor is known as an assumption condition. Therefore, in the case where the shape of a semiconductor is not known accurately, it is difficult to measure an effective channel width accurately.

Therefore, in this specification and the like, in a top view of a transistor, an apparent channel width that is a length of a portion where a source (a source region or a source electrode) and a drain (a drain region or a drain electrode) face each other in a region where a semiconductor and a gate electrode overlap with each other is referred to as a surrounded channel width (SCW) in some cases. Furthermore, in this specification and the like, in the case where the term "channel width" is simply used, it may denote surrounded channel width or apparent channel width. Alternatively, in this specification and the like, in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where electric field mobility, a current value per channel width, and the like of a transistor are obtained by calculation, a surrounded channel width may be used for the calculation. In that case, a value different from one in the case where an effective channel width is used for the calculation is obtained in some cases.

Components included in the transistor TR1 in FIGS. 12A to 12C are described in detail below.

<Insulating Film Functioning as Base Film>

The insulating film 114 preferably includes oxide. In particular, it preferably contains an oxide material from which part of oxygen is released by heating. In addition, the semiconductor film 101 is preferably provided over the insulating film 114.

As the oxide material from which oxygen is released due to heating, oxide containing oxygen in excess of the stoichiometric composition is preferably used. The oxide film containing oxygen in excess of the stoichiometric composition is an oxide film of which the amount of released oxygen converted into oxygen atoms is greater than or equal to $1.0 \times 10^{18}$ atoms/cm$^3$, and preferably greater than or equal to $3.0 \times 10^{20}$ atoms/cm$^3$ in thermal desorption spectroscopy (TDS) analysis. Note that the temperature of the film surface in the TDS analysis is preferably higher than or equal to 100° C. and lower than or equal to 700° C., or higher than or equal to 100° C. and lower than or equal to 500° C.

As the oxide material from which oxygen is released by heating, a material containing silicon oxide or silicon oxynitride is preferably used. Alternatively, a metal oxide can be used. As the metal oxide, aluminum oxide, aluminum oxynitride, gallium oxide, gallium oxynitride, yttrium oxide, yttrium oxynitride, hafnium oxide, hafnium oxynitride, or the like can be used. Note that in this specification, "silicon oxynitride" refers to a material that contains oxygen at a higher proportion than nitrogen, and "silicon nitride oxide" refers to a material that contains nitrogen at a higher proportion than oxygen.

In the case where an oxide semiconductor is used as the semiconductor film 101, oxygen released from the insulating film 114 is supplied to the oxide semiconductor, so that oxygen vacancy in the oxide semiconductor can be reduced. Consequently, changes in the electrical characteristics of the transistor TR1 can be reduced and the reliability of the transistor can be improved.

In addition, the upper surface of the insulating film 114 is preferably planarized with planarization treatment such as chemical mechanical polishing (CMP).

<Semiconductor Film>

It is preferable that the semiconductor film 101 contains a semiconductor having a wider band gap than silicon. The semiconductor film 101 is preferably formed using an oxide semiconductor. A semiconductor material having a wider band gap and a lower carrier density than silicon is preferably used because off-state leakage current of the transistor can be reduced. The use of such materials for the semiconductor film 101 makes it possible to provide a highly reliable transistor in which a change in the electrical characteristics is suppressed.

The oxide semiconductor film is preferably used as the semiconductor film 101. When an In—Ga—Zn oxide in which the atomic ratio of In to Ga to Zn is 1:1:1, 2:1:3, 3:1:2, or 4:2:3 is used for the oxide semiconductor film 101b, for example, an In—Ga—Zn oxide in which the atomic ratio of In to Ga to Zn is 1:3:2, 1:3:4, 1:3:6, 1:6:4, 1:6:8, 1:6:10, 1:9:6, or 1:2:3 can be used for the oxide semiconductor films 101a and 101c. Note that the atomic ratio of each of the semiconductor film 101b, the semiconductor film 101a, and the semiconductor film 101c may vary within a range of ±20% of any of the above-described atomic ratios as an error. For the semiconductor film 101a and the semiconductor film 101c, materials with the same composition or materials with different compositions may be used.

Further, when an In-M-Zn oxide is used for the oxide semiconductor film 101b, an oxide containing metal elements in the atomic ratio satisfying the following conditions is preferably used for a target for forming a semiconductor film to be the oxide semiconductor film 101b. Given that the atomic ratio of the metal elements in the oxide is In:M:Zn=$x_1$:$y_1$:$z_1$, $x_1/y_1$ is greater than or equal to ⅓ and less than or equal to 6, preferably greater than or equal to 1 and less than or equal to 6, and $z_1/y_1$ is greater than or equal to ⅓ and less than or equal to 6, preferably greater than or equal to 1 and less than or equal to 6. Note that when $z_1/y_1$ is less than or equal to 6, a CAAC-OS film to be described later is easily formed. Typical examples of the atomic ratio of the metal elements in the target are In:M:Zn=1:1:1, In:M:Zn=2:1:3, In:M:Zn=3:1:2, and the like.

When an In-M-Zn oxide is used for the semiconductor film 101a and the semiconductor film 101c, an oxide containing metal elements in the atomic ratio satisfying the following conditions is preferably used for a target for forming oxide semiconductor films to be the semiconductor film 101a and the semiconductor film 101c. Given that the atomic ratio of the metal elements in the oxide is In:M:Zn=$x_2$:$y_2$:$z_2$, $x_2/y_2$ is less than $x_1/y_1$, and $z_2/y_2$ is greater than or equal to ⅓ and less than or equal to 6, preferably greater than or equal to 1 and less than or equal to 6. Note that when $z_2/y_2$ is less than or equal to 6, a CAAC-OS film to be described later is easily formed. Typical examples of the atomic ratio of the metal elements in the target are In:M:Zn=1:3:4, In:M:Zn=1:3:6, In:M:Zn=1:3:8, and the like.

The semiconductor film 101c is preferably formed of a gallium oxide film. The gallium oxide film has a blocking function of preventing diffusion of indium. Thus, the semiconductor film 101c formed of a gallium oxide film can prevent diffusion of indium from the semiconductor films 101a and 101b into the gate insulating film 102, and can reduce the off-state current of the transistor TR1.

In the cases where an oxide semiconductor is formed by a sputtering method, a film having an atomic ratio different from that of a target used may be formed. Especially for zinc, the atomic ratio of zinc in a deposited film is smaller than the atomic ratio of the target in some cases. Specifically, the film has an atomic ratio of zinc of 40 atomic % to 90 atomic % of the atomic ratio of zinc in the target.

<Conductive Films Functioning as Source Electrode and Drain Electrode>

Each of the conductive films 104a and 104b is formed to have a single-layer structure or a stacked-layer structure using any of metals such as aluminum, titanium, chromium, nickel, copper, yttrium, zirconium, molybdenum, silver, tantalum, and tungsten, or an alloy containing any of these metals as a main component. For example, a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which a titanium film or a titanium nitride film, an aluminum film or a copper film, and a titanium film or a titanium nitride film are stacked in this order, a three-layer structure in which a molybdenum film or a molybdenum nitride film, an aluminum film or a copper film, and a molybdenum film or a molybdenum nitride film are stacked in this order, and the like can be given. Note that a transparent conductive material containing indium oxide, tin oxide, or zinc oxide may be used.

<Gate Insulating Film>

The gate insulating film 102 may be formed with a single layer or a stack using, for example, one or more of silicon oxide, silicon oxynitride, silicon nitride oxide, aluminum oxide, hafnium oxide, gallium oxide, Ga—Zn-based metal oxide, silicon nitride, and the like.

The gate insulating film 102 may be formed using a high-k material such as hafnium silicate (HfSiO$_x$), hafnium silicate to which nitrogen is added (HfSi$_x$O$_y$N$_z$), hafnium aluminate to which nitrogen is added (HfAl$_x$O$_y$N$_z$), or yttrium oxide.

The gate insulating film 102 can be formed using an oxide insulating film of aluminum oxide, magnesium oxide, silicon oxide, silicon oxynitride, gallium oxide, germanium oxide, yttrium oxide, zirconium oxide, lanthanum oxide, neodymium oxide, hafnium oxide, tantalum oxide, or the like, a nitride insulating film of silicon nitride, silicon nitride oxide, aluminum nitride, aluminum nitride oxide, or the like, or a film in which any of the above materials are mixed.

As the gate insulating film 102, like the insulating film 114, an oxide insulating film that contains oxygen in excess of that in the stoichiometric composition is preferably used.

When the specific material is used for the gate insulating film, electrons are trapped in the gate insulating film under the specific conditions and the threshold voltage can be increased. For example, a material having a lot of electron trap states, such as hafnium oxide, aluminum oxide, and tantalum oxide is used as part of the gate insulating film, like a stacked-layer film of silicon oxide and hafnium oxide, and the state where the potential of the gate electrode is higher than that of the source electrode or the drain electrode is kept for one second or more, typically one minute or more at a higher temperature (a temperature higher than the operating temperature or the storage temperature of the semiconductor device, or a temperature of 125° C. or higher and 450° C. or lower, typically a temperature of 150° C. or higher and 300° C. or lower). Then, electrons are moved from the semiconductor layer to the gate electrode, and some of the electrons are trapped by the electron trap states.

In the transistor in which a necessary amount of electrons is trapped by the electron trap states in this manner, the threshold voltage is shifted in the positive direction. By controlling the voltage of the gate electrode, the amount of electrons to be trapped can be controlled, and thus the threshold voltage can be controlled. Furthermore, the treatment for trapping the electrons may be performed in the manufacturing process of the transistor.

For example, the treatment is preferably performed at any step before factory shipment, such as after the formation of a wire metal connected to the source electrode or the drain electrode of the transistor, after the preceding process (wafer processing), after a wafer-dicing step, after packaging, or the like. In either case, it is preferable that the semiconductor device be not exposed to temperatures of 125° C. or higher for one hour or more after the process for trapping electrons.

<Gate Electrode>

The gate electrode 103 can be formed using a metal selected from aluminum, chromium, copper, tantalum, titanium, molybdenum, and tungsten; an alloy containing any of these metals as a component; an alloy containing any of these metals in combination; or the like. Further, one or more metals selected from manganese and zirconium may be used. Alternatively, a semiconductor typified by polycrystalline silicon doped with an impurity element such as phosphorus, or a silicide such as nickel silicide may be used. Further, the gate electrode 103 may have a single-layer structure or a stacked structure of two or more layers. For example, a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, and the like can be given. Alternatively, an alloy film, or a nitride film containing aluminum and one or more metals selected from titanium, tantalum, tungsten, molybdenum, chromium, neodymium, and scandium may be used.

The gate electrode 103 can also be formed using a light-transmitting conductive material such as an indium tin oxide, an indium oxide containing a tungsten oxide, an indium zinc oxide containing a tungsten oxide, an indium oxide containing a titanium oxide, an indium tin oxide containing a titanium oxide, an indium zinc oxide, or an indium tin oxide to which a silicon oxide is added. It is also possible to have a stacked-layer structure formed using the above light-transmitting conductive material and the above metal.

An In—Ga—Zn oxynitride semiconductor film, an In—Sn oxynitride semiconductor film, an In—Ga oxynitride semiconductor film, an In—Zn oxynitride semiconductor film, a Sn oxynitride semiconductor film, an In oxynitride semiconductor film, a film of a metal nitride (such as InN or ZnN), or the like may be provided between the gate electrode 103 and the gate insulating film. These films each have a work function higher than or equal to 5 eV, preferably higher than or equal to 5.5 eV, which is higher than the electron affinity of the oxide semiconductor. Thus, the threshold voltage of the transistor including an oxide semiconductor can be shifted in the positive direction, and what is called a normally-off switching element can be achieved. For example, as an In—Ga—Zn oxynitride semiconductor film, an In—Ga—Zn oxynitride semiconductor film having a higher nitrogen concentration than at least the semiconductor film 101, specifically an In—Ga—Zn oxynitride semiconductor film having a nitrogen concentration higher than or equal to 7 at. %, is used.

<Conductive Films Functioning as Back Gate Electrode>

For the conductive film 105, a material similar to that used for the gate electrode 103 may be used.

<Structural Examples 2-6 of Transistor>

Next, structural examples different from that of the transistor TR1 shown in FIGS. 12A to 12C are described. FIGS. 13A to 13C and FIGS. 14A to 14D show modification examples of the transistor TR1.

Figure 13A:
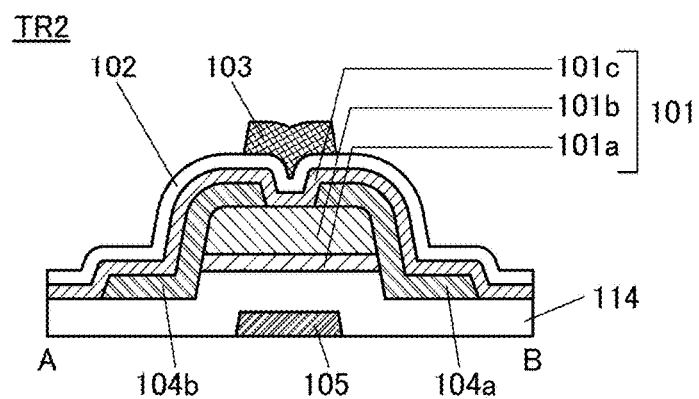
FIGS. 13A and 13C are cross-sectional views thereof.
Figure 13B:
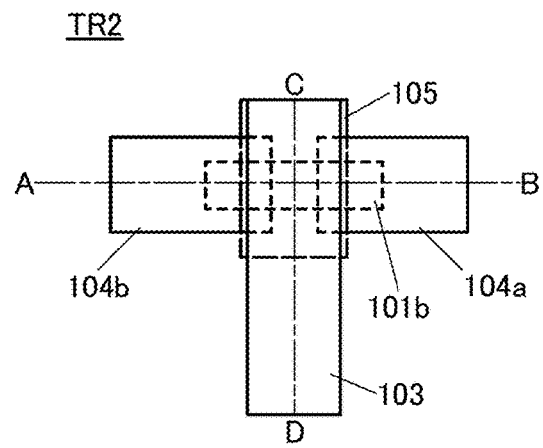
FIG. 13B is a top view illustrating an example of a transistor.
Figure 13C:
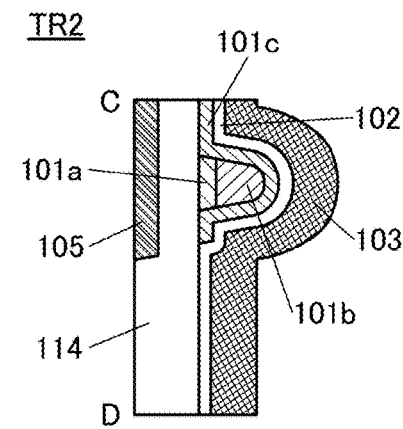

In the transistor TR1 in FIGS. 12A to 12C, the gate insulating film 102 and the semiconductor film 101c are processed so that their end portions are substantially aligned with each other. In a transistor TR2 in FIGS. 13A to 13C, the semiconductor film 101c is processed so that its end portion is on an inner side than the gate insulating film 102. FIG. 13B is a top view of the transistor TR2. FIG. 13A is a cross-sectional view taken along A-B line of FIG. 13B, and FIG. 13C is a cross-sectional view taken along C-D line of FIG. 13B.

Transistors shown in FIGS. 14A to 14D can be applied to the transistors Ta and Tb of the memory cell MC. FIGS. 14A to 14D are cross-sectional views of the transistors in the channel length direction.

Figure 14A:
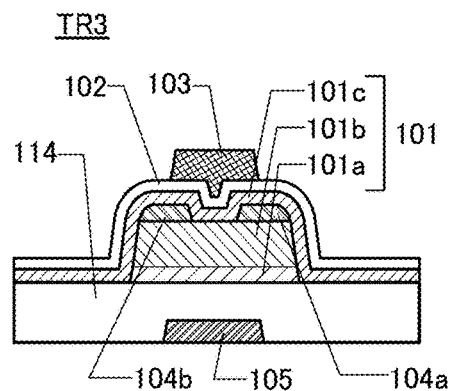
FIGS. 14A to 14D are cross-sectional views illustrating examples of a transistor.

A transistor TR3 in FIG. 14A is a modification example of the transistor TR2, and has a difference in structure of the conductive films 104a and 104b. For example, the transistor TR3 can be manufactured by the following steps. Two stacked semiconductor films to be the semiconductor films 101a and 101b are formed, and then a conductive film to be the conductive films 104*a* and 104*b* are formed over the stacked semiconductor films After that, a resist mask is formed over the conductive film, and the conductive film is etched, whereby a mask formed of the conductive film is formed. The stacked semiconductor films are etched with use of the mask, whereby the semiconductor films 101*a* and 101*b* are formed. Then, the mask is processed, so that the conductive films 104*a* and 104*b* are formed.

Figure 14B:
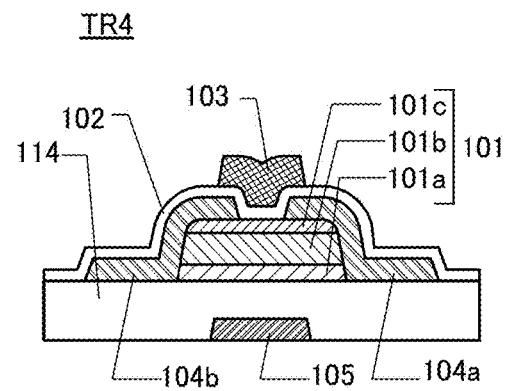

A transistor TR4 shown in FIG. 14B is a modification example of the transistor TR2. In the transistor TR4, the semiconductor film 101*c* is formed so as to be in contact with bottom surfaces of the conductive films 104*a* and 104*b*. Such a structure enables films used for the semiconductor film 101*a*, the semiconductor film 101*b*, and the semiconductor film 101*c* to be formed successively without contact with the air and therefore can reduce defects at each interface.

Figure 14C:
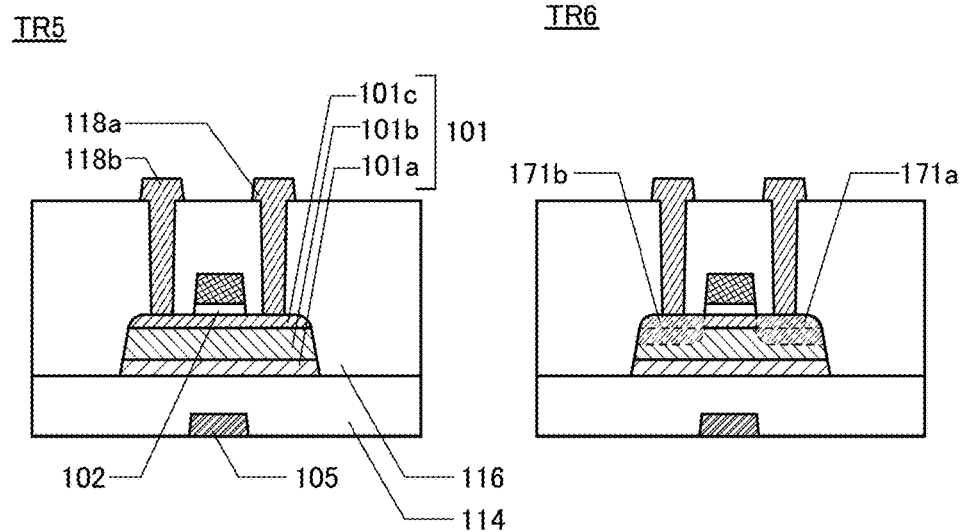

A transistor TR5 shown in FIG. 14C is a modification example of the transistor TR4. In the transistor TR5, plugs 118*a* and 118*b* are formed in openings provided in an insulating film 116, and the plugs are used as a source electrode and a drain electrode of the transistor.

Figure 14D:
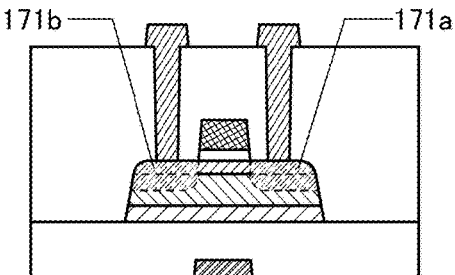

A transistor TR6 shown in FIG. 14D is a modification example of the transistor TR5. In the transistor TR6, a low-resistance region 171*a* and a low-resistance region 171*b* are formed in the semiconductor film 101. The low-resistance regions are formed by the following steps, for example. The semiconductor film 101 is formed over the insulating film 114. Next, the gate insulating film 102 and the gate electrode 103 are formed. Then, the low-resistance regions 171*a* and 171*b* are formed with the use of the gate electrode 103 as a mask. The low-resistance regions 171*a* and 171*b* are regions with high carrier density.

As ways to increase the carrier density, for example, addition of an impurity, formation of oxygen vacancy, and the like can be given. For example, to increase the carrier density, an element may be added by ion implantation. As the element, one or more of argon, boron, carbon, magnesium, aluminum, silicon, phosphorus, calcium, scandium, titanium, vanadium, chromium, manganese, iron, cobalt, nickel, gallium, germanium, arsenic, yttrium, zirconium, niobium, molybdenum, indium, tin, lanthanum, cerium, neodymium, hafnium, tantalum, and tungsten are preferably added. The low-resistance region 171*a* and low-resistance region 171*b* each contain for example, any of the above impurities at a concentration of higher than or equal to $5 \times 10^{19}$ atoms/cm$^3$, preferably higher than or equal to $1 \times 10^{20}$ atoms/cm$^3$, further preferably higher than or equal to $2 \times 10^{20}$ atoms/cm$^3$, still further preferably higher than or equal to $5 \times 10^{20}$ atoms/cm$^3$.

The low-resistance regions 171*a* and 171*b* possibly trap unnecessary hydrogen. If the low-resistance regions 171*a* and 171*b* trap hydrogen that is unnecessary, a concentration of hydrogen in the channel region can be reduced.

The above is description of structural examples of the transistors that can be applied to the transistors Ta and Tb.

<Example of Manufacturing Method of Memory Cell>

An example of a manufacturing method of the memory cell array 300 shown in FIG. 9 is described below with reference to FIGS. 15A to 15D, FIGS. 16A to 16C, FIGS. 17A to 17C, and FIG. 18. Here, the transistor TR2 shown in FIGS. 13A to 13C is applied to the transistors Ta and Tb.

First, the substrate 100 is prepared. As the substrate 100, for example, a single crystal silicon substrate (including a p-type semiconductor substrate or an n-type semiconductor substrate), a compound semiconductor substrate containing silicon carbide or gallium nitride, a glass substrate, or the like can be used. An SOI substrate may alternatively be used as the substrate 100. The case where single crystal silicon is used for the substrate 100 is described below.

Next, a conductive film to be the conductive film 105 and the like is formed over the substrate 100. The conductive film to be the conductive film 105 and the like can be formed by a sputtering method, a CVD method (including a thermal CVD method, an MOCVD method, a PECVD method, and the like), an MBE method, an ALD method, a PLD method, or the like. After that, a resist mask is formed, and an unnecessary portion of the conductive film to be the conductive film 105 and the like is removed by etching. Then, the resist mask is removed, so that the conductive film 105 and the like are formed.

Next, the insulating film 114 is formed over the substrate 100 and the conductive film 105. The insulating film 114 can be formed by a sputtering method, a CVD method (including a thermal CVD method, an MOCVD method, a PECVD method, and the like), an MBE method, an ALD method, a PLD method, or the like, for example. In particular, it is preferable that the insulating film be formed by a CVD method, further preferably a PECVD method because coverage can be improved. It is preferable to use a thermal CVD method, an MOCVD method, or an ALD method in order to reduce plasma damage.

To make the insulating film 114 contain excess oxygen, the insulating film 114 may be deposited in an oxygen atmosphere, for example. Alternatively, a region containing excess oxygen may be formed by introduction of oxygen into the insulating film 114 that has been deposited. Both the methods may be combined.

For example, oxygen (at least including any of oxygen radicals, oxygen atoms, and oxygen ions) is introduced into the insulating film 114 which has been deposited, whereby a region containing excess oxygen is formed. Oxygen can be introduced by an ion implantation method, an ion doping method, a plasma immersion ion implantation method, plasma treatment, or the like.

A gas containing oxygen can be used for oxygen introduction treatment. As the gas containing oxygen, dinitrogen monoxide, nitrogen dioxide, carbon dioxide, carbon monoxide, and the like can be used. Further, a rare gas may be included in the gas containing oxygen for the oxygen introduction treatment. Furthermore, hydrogen or the like may be included. For example, a mixed gas of carbon dioxide, hydrogen, and argon may be used.

After the insulating film 114 is formed, the insulating film 114 may be subjected to planarization treatment using a CMP method or the like to improve the planarity of an upper surface of the insulating film 114.

Figure 15A:
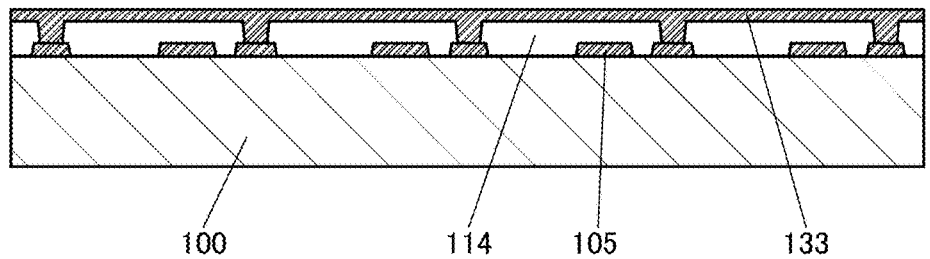
FIGS. 15A to 15D are cross-sectional views illustrating an example of a manufacturing method of a memory cell array.

Next, a plug for connection with the source electrode or the drain electrode of the transistor Tb will be formed over the insulating film 114. First, an opening is provided in the insulating film 114. Then, a conductive film 133 to be the plug is formed to fill the opening (FIG. 15A).

Figure 15B:
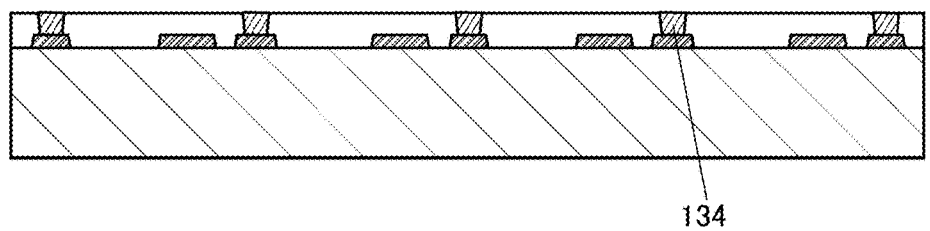

Next, planarization treatment is performed on the conductive film 133 so that the surface of the insulating film 114 is exposed, whereby the plug 134 is formed (FIG. 15B).

Next, a semiconductor film to be the semiconductor film 101*a* and the like and a semiconductor film to be the semiconductor film 101*b* and the like are formed in this order over the insulating film 114. The semiconductor films are preferably formed successively without contact with the air. The semiconductor film to be the semiconductor film 101*a* and the semiconductor film to be the semiconductor film 101b can be formed by a sputtering method, a CVD method, an MBE method, a PLD method, an ALD method, or the like.

In the case where In—Ga—Zn oxide films are formed as the semiconductor films to be the semiconductor film 101a, semiconductor film 101b, and the like by an MOCVD method, trimethylindium, trimethylgallium, dimethylzinc, and the like may be used as the source gases. The source gas is not limited to the combination of these gases, triethylindium or the like may be used instead of trimethylindium. Triethylgallium or the like may be used instead of trimethylgallium. Diethylzinc or the like may be used instead of dimethylzinc.

Heat treatment is preferably performed after formation of the semiconductor films to be the semiconductor films 101a and 101b. The heat treatment may be performed at a temperature higher than or equal to 250° C. and lower than or equal to 650° C., or preferably higher than or equal to 300° C. and lower than or equal to 500° C., in an inert gas atmosphere, an atmosphere containing an oxidizing gas at 10 ppm or more, or a reduced pressure state. Alternatively, the heat treatment may be performed in such a manner that heat treatment is performed in an inert gas atmosphere, and then another heat treatment is performed in an atmosphere containing an oxidization gas at 10 ppm or more, in order to compensate desorbed oxygen. Note that the heat treatment may be performed directly after the formation of the semiconductor films or may be performed after the semiconductor films are processed into the island-shaped semiconductor films 101a and 101b and the like. Through the heat treatment, oxygen can be supplied to the semiconductor films from the insulating film 114; thus, oxygen vacancies in the semiconductor films can be reduced.

Figure 15C:
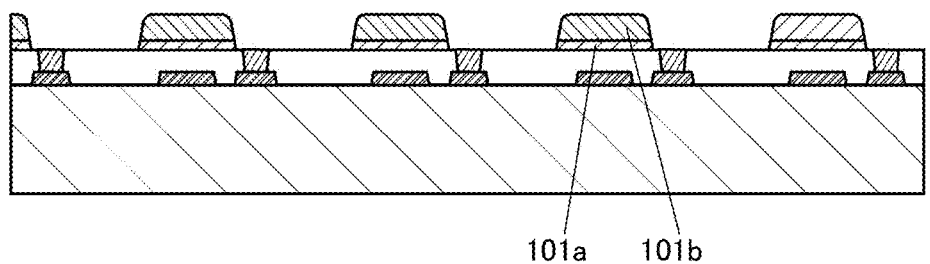

Then, a resist mask is formed, and an unnecessary portion is removed by etching. Then, the resist mask is removed. In this manner, a stacked-layer structure including the island-shaped semiconductor film 101a and the island-shaped semiconductor film 101b and the like can be formed (FIG. 15C).

Note that, in some cases, part of the insulating film 114 is etched in the etching of the semiconductor films to reduce the thickness of a portion of the insulating film 114 which is not covered with the semiconductor films 101a and 101b and the like. For this reason, the insulating film 114 is preferably formed to have a large thickness so as not to be removed by the etching.

Figure 15D:
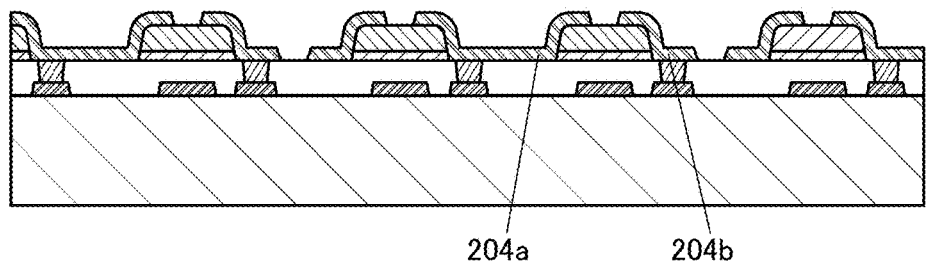

After that, a conductive film to be the conductive films 204a and 204b is formed. The conductive film can be formed by, for example, a sputtering method, a CVD method (including a thermal CVD method, an MOCVD method, a PECVD method, and the like), an MBE method, an ALD method, or a PLD method. Next, a resist mask is formed, and an unnecessary portion of the conductive film to be the conductive films 204a and 204b is removed by etching. Then, the resist mask is removed, and the conductive films 204a and 204b are formed (FIG. 15D).

Here, in some cases, parts of the upper portions of the semiconductor film 101b and the insulating film 114 and the like are etched in the etching of the conductive film and the thickness of a portion where the conductive film 204a and the conductive film 204b do not overlap therewith is reduced. For this reason, the semiconductor film to be the semiconductor film 101b is preferably formed to have a large thickness in advance in consideration of the etching depth.

Figure 16A:
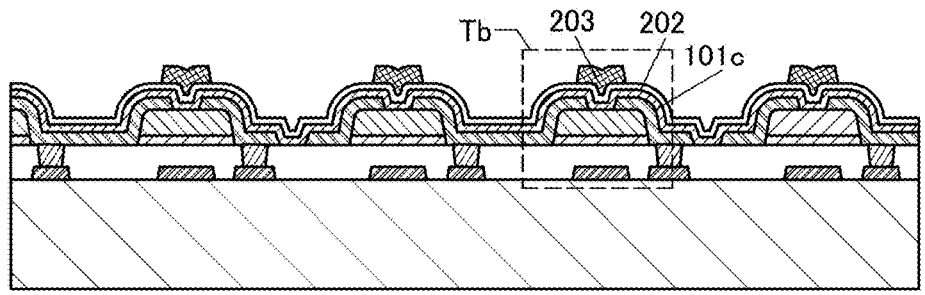
FIGS. 16A to 16C are cross-sectional views illustrating an example of a manufacturing method of a memory cell array.

Next, the gate insulating film 202 and the semiconductor film 101c are formed. Note that after the formation of the gate insulating film 202 and the semiconductor film 101c, they may be processed by etching with the use of a resist mask formed after the formation. Next, a conductive film to be the gate electrode 203 is formed. Then, a resist mask is formed, and the conductive film is processed by etching, whereby the gate electrode 203 is formed. After that, the resist mask is removed. The transistor Tb is formed at this stage (FIG. 16A).

A semiconductor film to be the semiconductor film 101c can be formed by a sputtering method, a CVD method, an MBE method, a PLD method, an ALD method, or the like.

Note that in the case where an In—Ga—Zn oxide film formed by an MOCVD method is used as the semiconductor film to be the semiconductor film 101c, trimethylindium, trimethylgallium, dimethylzinc, and the like may be used as source gases. The source gas is not limited to the combination of these gases, triethylindium or the like may be used instead of trimethylindium. Triethylgallium or the like may be used instead of trimethylgallium. Diethylzinc or the like may be used instead of dimethylzinc.

Figure 16B:
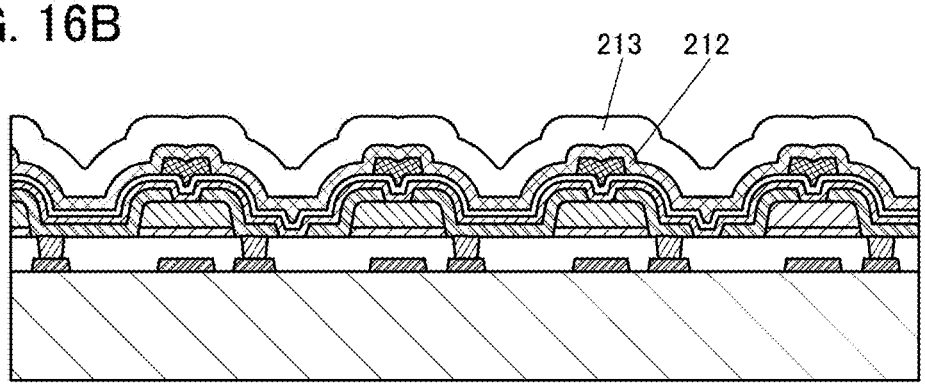

Although not shown in FIG. 8, FIG. 9, FIG. 10, and FIG. 11, an insulating film 212 and an insulating film 213 may be formed over the transistor Tb (FIG. 16B).

The insulating film 212 can be formed by a sputtering method, a CVD method (including a thermal CVD method, an MOCVD method, a PECVD method, and the like), an MBE method, an ALD method, a PLD method, or the like. After the insulating film 212 is formed, heat treatment is preferably performed. Through the heat treatment, oxygen can be supplied to the semiconductor film 101b from the insulating film 114 or the like; thus, oxygen vacancies in the semiconductor film 101b can be reduced. Furthermore, the insulating film 212 may have a stacked-layer structure of two or more layers. In this case, for example, the insulating film 212 may be formed to have a two-layer structure in which the bottom layer is formed using, for example, silicon oxide, silicon oxynitride, silicon nitride oxide, silicon nitride, aluminum oxide, aluminum oxynitride, aluminum nitride oxide, aluminum nitride, or the like.

The insulating film 213 can be formed to have a single-layer structure or a stacked-layer structure using, for example, silicon oxide, silicon oxynitride, silicon nitride oxide, silicon nitride, aluminum oxide, aluminum oxynitride, aluminum nitride oxide, aluminum nitride, or the like.

Next, the insulating film 216 is formed over the insulating film 213. The insulating film 216 can be formed to have a single-layer structure or a stacked-layer structure using, for example, silicon oxide, silicon oxynitride, silicon nitride oxide, silicon nitride, aluminum oxide, aluminum oxynitride, aluminum nitride oxide, aluminum nitride, or the like. The insulating film 216 can be formed by a sputtering method, a CVD method (including a thermal CVD method, an MOCVD method, a PECVD method, and the like), an MBE method, an ALD method, a PLD method, or the like. In the case where the insulating film 216 is formed using an organic insulating material such as an organic resin, a coating method such as a spin coating method may be used. After the insulating film 216 is formed, an upper surface thereof is preferably subjected to planarization treatment.

Figure 16C:
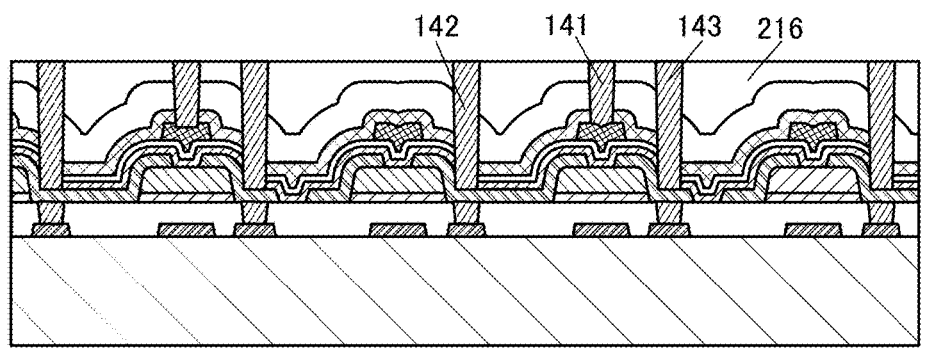

Next, openings are provided in the insulating film 216, the insulating film 213, the insulating film 212, the gate insulating film 202, the semiconductor film 101, and the like, and then a conductive film to be the plugs 141, 142, and 143, and the like is formed so as to fill the openings. Then, planarization treatment is performed so that the surface of the insulating film 216 is exposed, whereby the plugs 141, 142, and 143, and the like are formed (FIG. 16C).

Figure 17A:
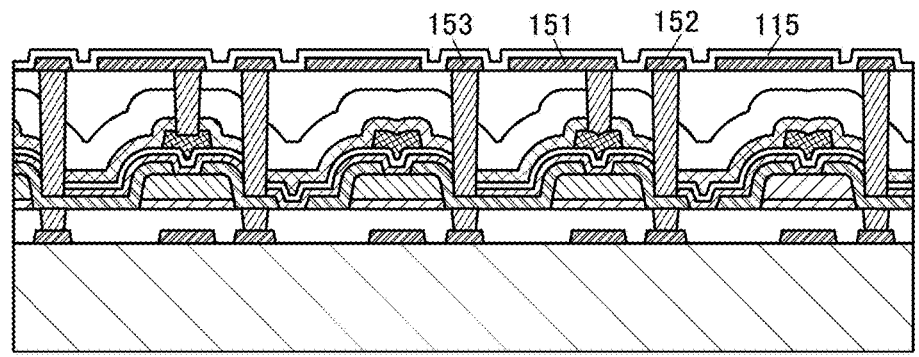
FIGS. 17A to 17C are cross-sectional views illustrating an example of a manufacturing method of a memory cell array.

Next, a conductive film is formed over the insulating film 216, the plug 141, and the like, a mask is formed, and then etching with use of the mask is performed so that the conductive films 151, 152, and 153 and the like are formed. After that, the insulating film 115 is formed (FIG. 17A). The insulating film 115 functions as an insulating film of the capacitor Ca. For a material and the like that can be used for the insulating film 115, the description regarding the gate insulating film 102 can be referred to, for example.

Figure 17B:
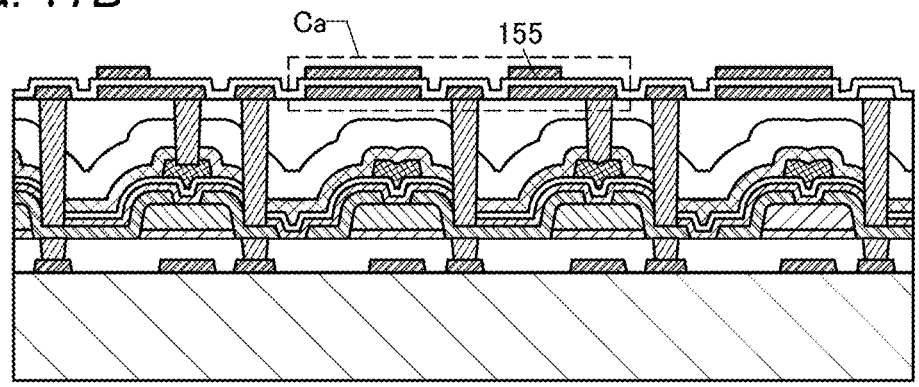

Then, the conductive films 155 and the like are formed over the insulating film 115. For a material and the like that can be used for the conductive film 155 and the like, the description regarding the conductive film 105 can be referred to, for example. In this way, the capacitor Ca can be formed (FIG. 17B).

Figure 17C:
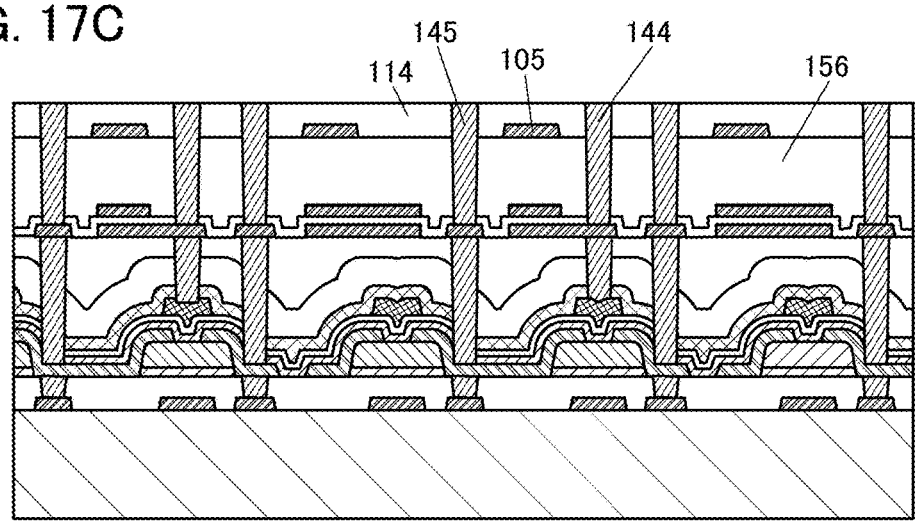

Next, the insulating film 156 is formed over the conductive film 155 and the insulating film 115. An upper surface of the insulating film 156 may be planarized. Description regarding the insulating film 216 is referred to for the insulating film 156. Next, the conductive film 105 and the like are formed over the insulating film 156. Next, the insulating film 114 is formed. Next, openings are provided in the insulating film 156 and the insulating film 114, a conductive film is formed so as to fill the openings, and a surface of the conductive film is planarized so that the insulating film 114 is exposed, whereby the plugs 144 and 145 and the like are formed (FIG. 17C).

Figure 18:
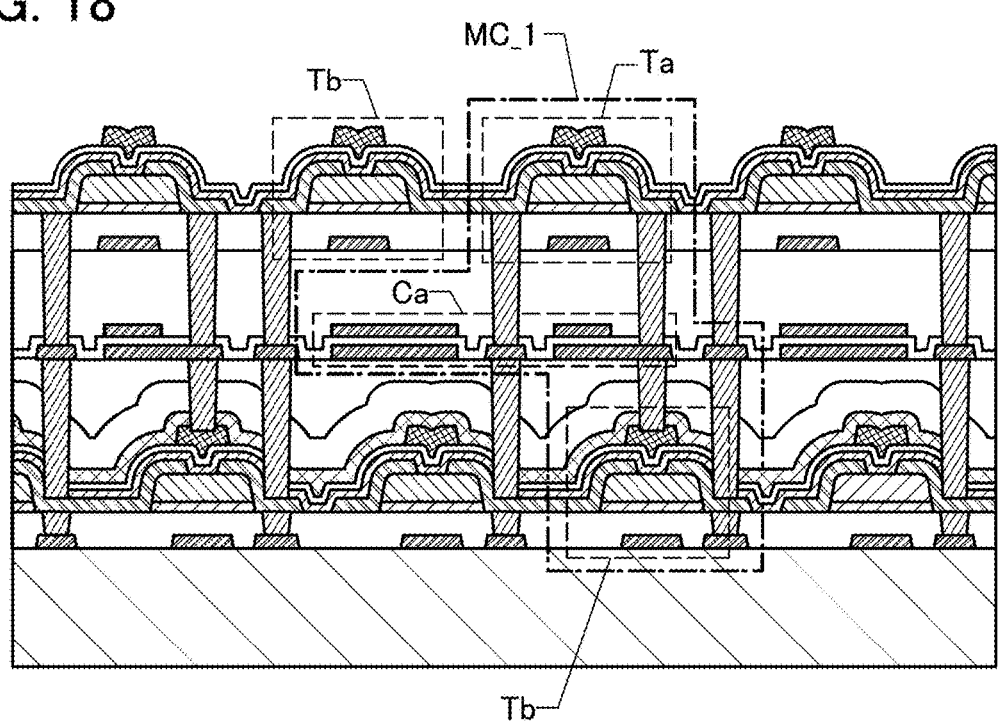
FIG. 18 is a cross-sectional view illustrating an example of a manufacturing method of a memory cell array.

Next, the transistor Ta and the like are formed (FIG. 18). For formation of the transistor Ta, the description regarding the transistor Tb can be referred to. In addition, as shown in FIG. 18, the transistor Ta included in the memory cell MC_1 and the transistor Tb included in the memory cell MC_2 are formed in the same steps.

By repeating the above steps, the memory cell array 300 shown in FIG. 9 can be manufactured.

The structure and method described in this embodiment can be implemented by being combined as appropriate with any of the other structures and methods described in the other embodiments.

Embodiment 2

In this embodiment, a structural example of a circuit that can be applied to a circuit system of one embodiment of the present invention is described in detail with reference to FIGS. 19A to 19C, FIGS. 20A to 20C, and FIGS. 21A and 21B.

<CMOS Circuit>

Figure 19A:
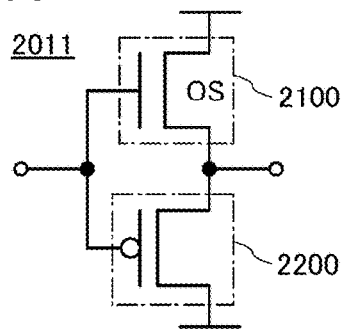
FIG. 19A is a circuit diagram illustrating an example of a semiconductor device.
Figure 19B:
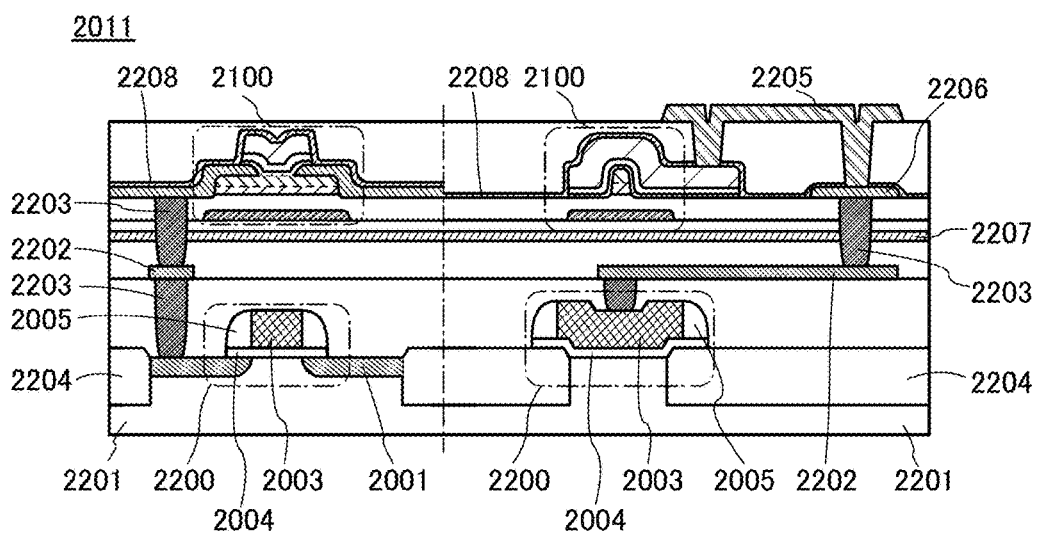
FIGS. 19B and 19C are cross-sectional views illustrating structural examples of the semiconductor device in FIG. 19A.

A circuit 2011 in FIG. 19A is a so-called CMOS inverter circuit in which a p-channel transistor 2200 and an n-channel transistor 2100 are connected to each other in series and in which gates of them are connected to each other. FIG. 19B shows an example of a device structure of the circuit 2011.

FIG. 19B is a cross-sectional view showing the structural example of the circuit 2011. The circuit 2011 includes a substrate 2201, a transistor 2200, a transistor 2100, a wiring 2202, a plug 2203, a wiring 2206, a wiring 2205, an element separation layer 2204, an insulating film 2207, and an insulating film 2208. The transistor 2200 includes an impurity region 2001 functioning as a source region or a drain region, a gate electrode 2003, a gate insulating film 2004, and a sidewall insulating layer 2005.

The circuit 2011 in FIG. 19B includes the transistor 2200 containing a first semiconductor material in a lower portion and the transistor 2100 containing a second semiconductor material in an upper portion. In FIG. 19B, the OS transistor described in Embodiment 1 as an example is used as the transistor 2100 containing the second semiconductor material. A cross-sectional view of the transistor 2100 and the transistor 2200 in a channel length direction is on the left side of a dashed-dotted line, and a cross-sectional view of the transistor 2100 and the transistor 2200 in a channel width direction is on the right side of the dashed-dotted line. As shown in the drawing, the stack of the two kinds of transistors reduces the area occupied by the circuit, allowing a plurality of circuits to be highly integrated.

Here, the first semiconductor material and the second semiconductor material are preferably materials having different band gaps. For example, the first semiconductor material can be a semiconductor material other than an oxide semiconductor (examples of such a semiconductor material include silicon (including strained silicon), germanium, silicon germanium, silicon carbide, gallium arsenide, aluminum gallium arsenide, indium phosphide, gallium nitride, and an organic semiconductor), and the second semiconductor material can be an oxide semiconductor. A transistor using a material other than an oxide semiconductor, such as single crystal silicon, can operate at high speed easily. In contrast, a transistor using an oxide semiconductor and described in the above embodiment as an example can have excellent subthreshold characteristics and a minute structure. Furthermore, the transistor can operate at a high speed because of its high switching speed and has low leakage current because of its low off-state current.

The transistor 2200 may be either an n-channel transistor or a p-channel transistor, and an appropriate transistor may be used in accordance with a circuit. In the circuit 2011 in FIG. 19A, the transistor 2200 is a p-channel transistor.

Figure 19C:
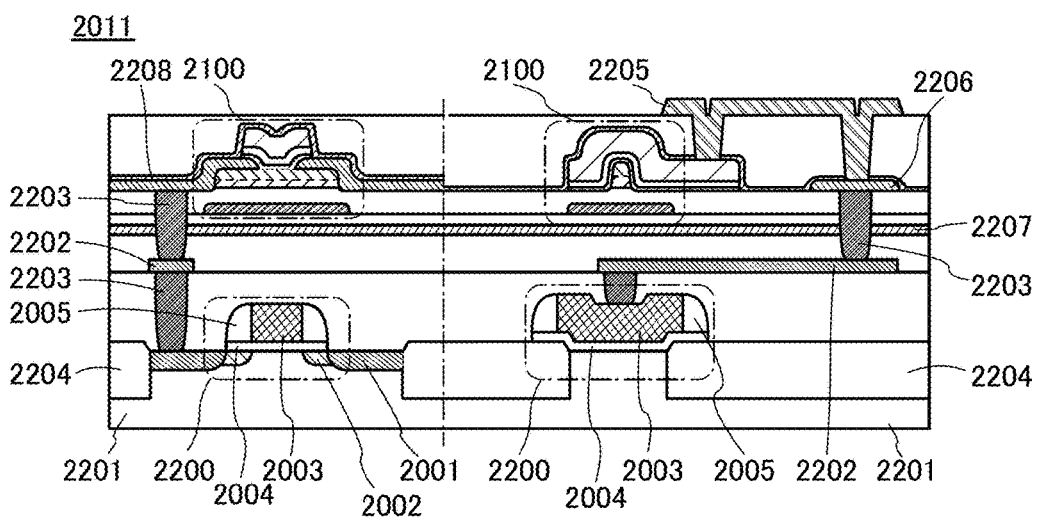

In addition, as shown in FIG. 19C, an impurity region 2002 may be provided in the transistor 2200. The impurity region 2002 functions as a lightly doped drain (LDD) region or an extension region. The impurity concentration of the impurity region 2001 is higher than that of the impurity region 2002. The impurity regions 2001 and 2002 are formed in a self-aligned manner with use of the gate electrode 2003 and the sidewall insulating layer 2005 as a mask. In particular, when the transistor 2200 is an n-channel transistor, the impurity region 2002 is preferably provided in order to suppress deterioration due to hot carriers.

As the transistor 2200, a transistor containing silicide (salicide) or a transistor which does not include a sidewall insulating layer 2005 may be used. When a structure that contains silicide (salicide) is used, resistance of the source region and the drain region can be further lowered and the speed of the semiconductor device is increased. Further, the semiconductor device can be operated at low voltage; thus, power consumption of the semiconductor device can be reduced.

The transistor 2100 in FIG. 19B has a structure with a back gate electrode; however, a structure without a back gate electrode may be employed.

As the substrate 2201, a single crystal semiconductor substrate or a polycrystalline semiconductor substrate of silicon or silicon carbide, a compound semiconductor substrate of silicon germanium, a silicon-on-insulator (SOI) substrate, or the like can be used. A transistor manufactured using a semiconductor substrate can operate at high speed easily. In the case of using a p-type single crystal silicon substrate as the substrate 2201, an impurity element imparting n-type conductivity may be added to part of the substrate 2201 to form an n-well, and a p-type transistor can be formed in a region where the n-well is formed. As the impurity element imparting n-type conductivity, phosphorus (P), arsenic (As), or the like can be used. As the impurity element imparting p-type conductivity, boron (B) or the like may be used.

Alternatively, the substrate 2201 can be a conductive substrate or an insulating substrate over which a semiconductor film is provided. Examples of the conductive substrate include a metal substrate, a stainless steel substrate, a substrate including stainless steel foil, a tungsten substrate, a substrate including tungsten foil. Examples of the insulating substrate include a glass substrate, a quartz substrate, a plastic substrate, a flexible substrate, an attachment film, paper including a fibrous material, and a base film. As an example of a glass substrate, a barium borosilicate glass substrate, an aluminoborosilicate glass substrate, a soda lime glass substrate, or the like can be given. Examples of a flexible substrate include a flexible synthetic resin such as plastics typified by polyethylene terephthalate (PET), polyethylene naphthalate (PEN), and polyether sulfone (PES), and acrylic. Examples of an attachment film are attachment films formed using polypropylene, polyester, polyvinyl fluoride, polyvinyl chloride, and the like. Examples of a base film are base films formed using polyester, polyamide, polyimide, aramid, epoxy, an inorganic vapor deposition film, and paper.

Alternatively, a semiconductor element may be formed using one substrate, and then, transferred to another substrate. Examples of a substrate to which a semiconductor element is transferred include, in addition to the above-described substrates, a paper substrate, a cellophane substrate, an aramid film substrate, a polyimide film substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, and a rubber substrate. When such a substrate is used, a transistor with excellent properties or a transistor with low power consumption can be formed, a device with high durability and high heat resistance can be provided, or reduction in weight or thickness can be achieved.

The transistor 2200 is separated from other transistors formed on the substrate 2201 by the element separation layer 2204. The element separation layer 2204 can be formed using an insulator containing one or more materials selected from aluminum oxide, aluminum oxynitride, magnesium oxide, silicon oxide, silicon oxynitride, silicon nitride oxide, silicon nitride, germanium oxide, yttrium oxide, zirconium oxide, lanthanum oxide, neodymium oxide, hafnium oxide, tantalum oxide, and the like.

Here, in the case where a silicon-based semiconductor material is used for the transistor 2200 provided in a lower portion, hydrogen in an insulating film provided in the vicinity of the semiconductor film of the transistor 2200 terminates dangling bonds of silicon; accordingly, the reliability of the transistor 2200 can be improved. Meanwhile, in the case where an oxide semiconductor is used for the transistor 2100 provided in an upper portion, hydrogen in an insulating film provided in the vicinity of the semiconductor film of the transistor 2100 becomes a factor of generating carriers in the oxide semiconductor; thus, the reliability of the transistor 2100 might be decreased. Therefore, in the case where the transistor 2100 using an oxide semiconductor is provided over the transistor 2200 using a silicon-based semiconductor material, it is particularly effective that the insulating film 2207 having a function of preventing diffusion of hydrogen is provided between the transistors 2100 and 2200. The insulating film 2207 makes hydrogen remain in the lower portion, thereby improving the reliability of the transistor 2200. In addition, since the insulating film 2207 suppresses diffusion of hydrogen from the lower portion to the upper portion, the reliability of the transistor 2100 also can be improved.

The insulating film 2207 can be, for example, formed using aluminum oxide, aluminum oxynitride, gallium oxide, gallium oxynitride, yttrium oxide, yttrium oxynitride, hafnium oxide, hafnium oxynitride, or yttria-stabilized zirconia (YSZ).

Furthermore, an insulating film 2208 having a function of preventing diffusion of hydrogen is preferably formed over the transistor 2100 to cover the transistor 2100 including an oxide semiconductor film. For the insulating film 2208, a material that is similar to that of the insulating film 2207 can be used, and in particular, an aluminum oxide film is preferably used. The aluminum oxide film has a high shielding (blocking) effect of preventing penetration of both oxygen and impurities such as hydrogen and moisture. Thus, by using the aluminum oxide film as the insulating film 2208 covering the transistor 2100, release of oxygen from the oxide semiconductor film included in the transistor 2100 can be prevented and entry of water and hydrogen into the oxide semiconductor film can be prevented.

The plug 2203 preferably has a single-layer structure or a stacked-layer structure of a conductive film containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), and cobalt (Co), an alloy of such a low-resistance material, or a compound containing such a material as its main component. It is particularly preferable to use a high-melting-point material that has both heat resistance and conductivity, such as tungsten or molybdenum. In addition, the plug is preferably formed using a low-resistance conductive material such as aluminum or copper. The plug is preferably formed using a Cu—Mn alloy, since in that case, manganese oxide formed at the interface with an insulator containing oxygen has a function of preventing Cu diffusion.

The wirings 2202 and 2205 preferably have a single-layer structure or a stacked-layer structure of a conductive film containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), and cobalt (Co), an alloy of such a low-resistance material, or a compound containing such a material as its main component. It is particularly preferable to use a high-melting-point material that has both heat resistance and conductivity, such as tungsten or molybdenum. In addition, the wirings are preferably formed using a low-resistance conductive material such as aluminum or copper. The wirings are preferably formed using a Cu—Mn alloy, since in that case, manganese oxide formed at the interface with an insulator containing oxygen has a function of preventing Cu diffusion.

The wiring 2206 can be formed using a material similar to that of the source electrode or the drain electrode of the transistor 2100.

In FIGS. 19B and 19C, regions where reference numerals and hatching patterns are not given show regions formed of an insulator. In these regions, an insulator containing one or more materials selected from aluminum oxide, aluminum nitride oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, and the like can be used. Alternatively, in these regions, an organic resin such as a polyimide resin, a polyamide resin, an acrylic resin, a siloxane resin, an epoxy resin, or a phenol resin can be used. The same is applied to FIGS. 20B and 20C and FIG. 21B described later.

By connecting electrodes of the transistor 2100 and the transistor 2200 as appropriate, a variety of circuits can be formed. Other examples are shown in FIGS. 20A to 20C, and FIGS. 21A and 21B.

<Analog Switch>

Figure 20A:
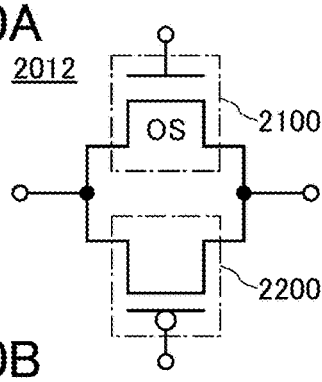
FIG. 20A is a circuit diagram illustrating an example of a semiconductor device.
Figure 20B:
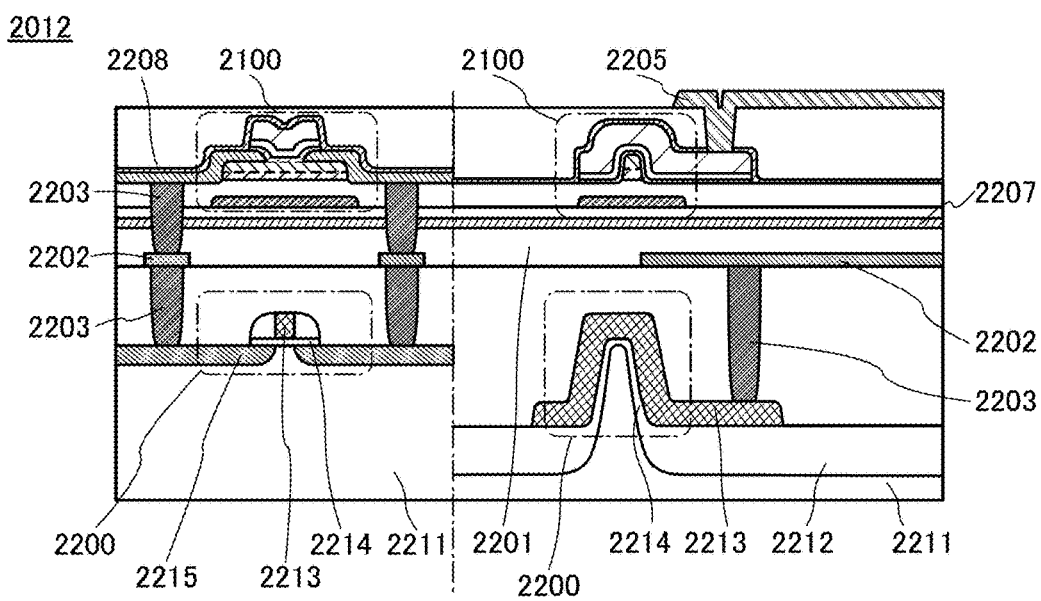
FIGS. 20B and 20C are cross-sectional views illustrating structural examples of the semiconductor device in FIG. 20A.

A circuit 2012 shown in FIG. 20A has a circuit structure in which sources of the transistors 2100 and 2200 are connected to each other and drains of the transistors 2100 and 2200 are connected to each other. That is, the circuit 2012 functions as an analog switch. FIG. 20B is a cross-sectional view illustrating an example of a device structure of the circuit 2012. Though the transistor 2200 in FIG. 19B is a planar transistor, various types of transistors may be used for the transistor 2200. For example, a FIN-type transistor, a tri-gate transistor, and the like which have a three-dimensional structure can be used. Such an example is shown in FIG. 20B.

Figure 20C:
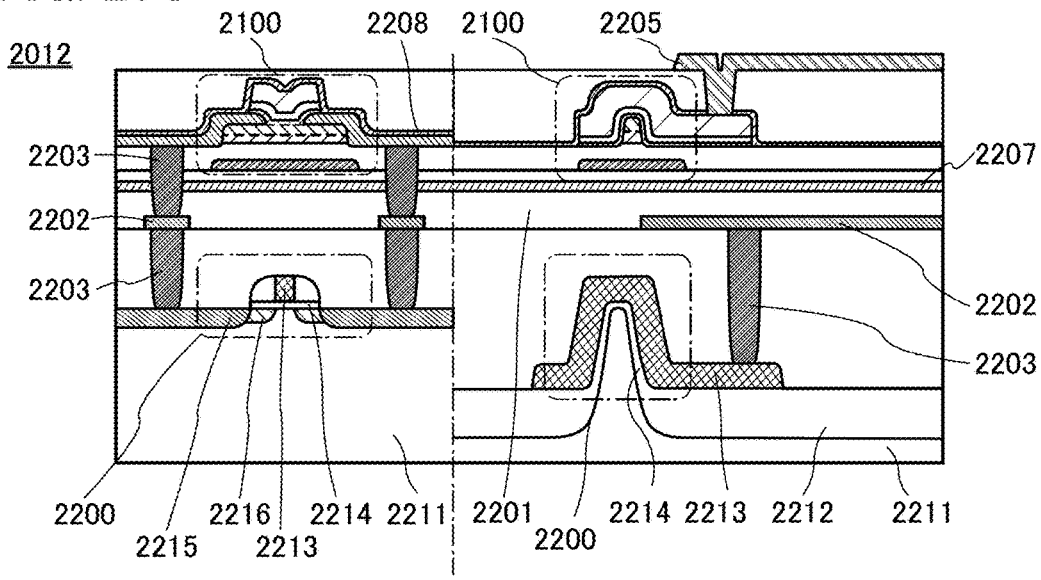

An insulating film 2212 is provided over a semiconductor substrate 2211 as shown in FIG. 20B. The semiconductor substrate 2211 includes a protruding portion with a thin tip (also referred to as a fin). Note that an insulating film may be provided over the protruding portion. The insulating film functions as a mask for preventing the semiconductor substrate 2211 from being etched when the protruding portion is formed. The protruding portion does not necessarily have the thin tip; a protruding portion with a cuboid-like protruding portion and a protruding portion with a thick tip are permitted, for example. A gate insulating film 2214 is provided over the protruding portion of the semiconductor substrate 2211, and a gate electrode 2213 is provided over the gate insulating film 2214. In the semiconductor substrate 2211, an impurity region 2215 functioning as a source region or a drain region is formed. In addition, an impurity region 2216 may be formed as shown in FIG. 20C. The impurity region 2216 functions as an LDD region or an extension region.

<Memory Circuit>

An example of a semiconductor device (memory device) which includes a transistor of one embodiment of the present invention will be described. The semiconductor device can retain stored data even when not powered, and has no limitation on the number of writing.

Figure 21A:
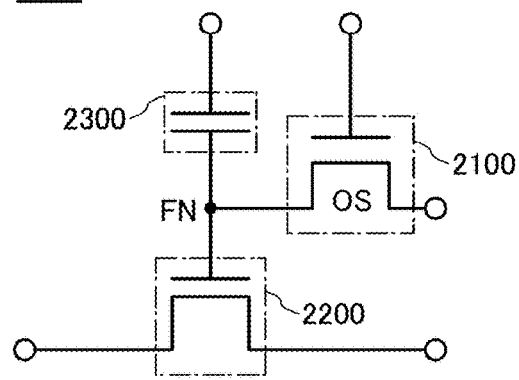
FIG. 21A is a circuit diagram illustrating an example of a semiconductor device.

A circuit 2013 in FIG. 21A includes the transistor 2100 using the second semiconductor material, the transistor 2200 using the first semiconductor material, and a capacitor 2300. The circuit 2013 has a circuit structure and a function similar to those of the memory circuit 25 in FIG. 2A. Therefore, the description regarding the memory circuit 25 is referred to for the description of the structure of the circuit 2013. In the example of FIG. 21A, the transistor 2200 is an n-channel transistor.

The transistor 2100 is a transistor in which a channel is formed in a semiconductor layer including an oxide semiconductor. Since the off-state current of the transistor 2100 is small, stored data can be held for a long time owing to such a transistor. In other words, power consumption can be sufficiently reduced because a semiconductor device in which refresh operation is unnecessary or the frequency of refresh operation is extremely low can be provided.

When the transistor described in Embodiment 1 is applied to the transistor 2100, the transistor can have excellent subthreshold characteristics and a minute structure. Furthermore, the transistor can operate at a high speed because of its high switching speed. In contrast, the transistor 2200 includes single crystal silicon or the like as a semiconductor material other than an oxide semiconductor, and can have a minute structure and operate at a high speed. By combination of these transistors, a small semiconductor device can be provided. In addition, high-speed writing and reading can be performed.

Figure 21B:
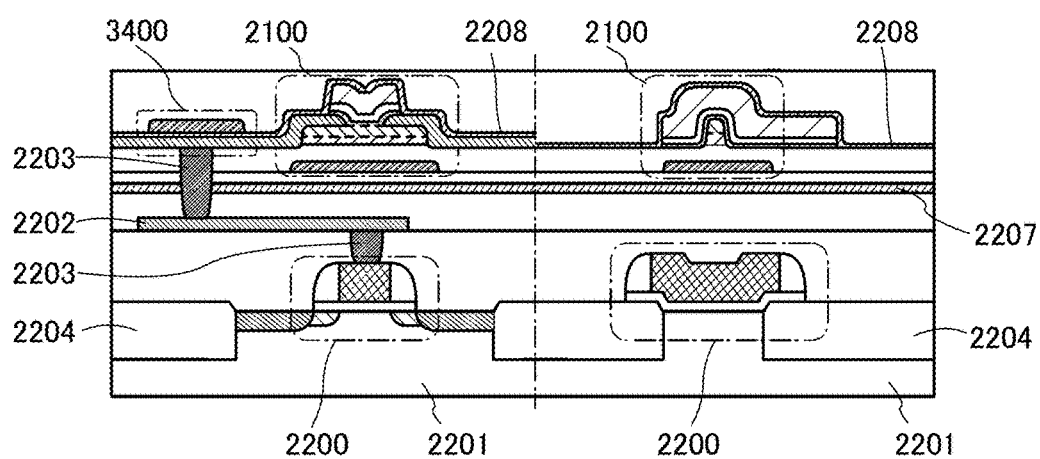
FIG. 21B is a cross-sectional view illustrating a structural example of the semiconductor device in FIG. 21A.

FIG. 21B shows an example of the device structure of the circuit 2013. In the circuit 2013, the transistor 2200 may be an n-channel transistor or a p-channel transistor. When the transistor 2200 is a p-channel transistor, the impurity region 2002 is not necessarily provided. In addition, the transistor 2100 does not necessarily have a back gate electrode.

In examples of FIGS. 19A to 19C, FIGS. 20A to 20C, and FIGS. 21A and 21B, bulk semiconductors are used as the substrate 2201 and the semiconductor substrate 2211; however, one embodiment of the present invention is not limited thereto. For example, an SOI substrate may be used.

The structure and method described in this embodiment can be implemented by being combined as appropriate with any of the other structures and methods described in the other embodiments.

Embodiment 3

In this embodiment, examples of a circuit applicable to a circuit system of one embodiment of the present invention are described with reference to FIGS. 22A to 22I.

Examples of a circuit including a transistor with an active layer of an oxide semiconductor or a transistor with an active layer of silicon are illustrated in FIGS. 22A to 22I. Hereinafter, a transistor with an active layer of an oxide semiconductor is referred to as an OS transistor, and a transistor with an active layer of silicon is referred to as a Si transistor. In addition, a p-channel Si transistor is referred to as a p-Si transistor, and an n-channel Si transistor is referred to as an n-Si transistor. An OS transistor is an n-channel transistor unless otherwise specified. Furthermore, for convenience, in FIGS. 22A to 22I, a p-channel transistor and an n-channel transistor are described as PMOS and NMOS, respectively.

The channel length of an OS transistor is preferably greater than or equal to 1 nm and less than 100 nm, or further preferably greater than or equal to 5 nm and less than or equal to 60 nm, for facilitating manufacturing, increasing integration degree, and utilizing advantages of the OS transistor with small short-channel effect. For formation of a Si transistor over a substrate where the OS transistor is formed, the channel length of the Si transistor is preferably greater than or equal to 1 nm and less than 100 nm, further preferably greater than or equal to 5 nm and less than or equal to 60 nm, or greater than or equal to 5 nm and less than or equal to 30 nm.

Figure 22A:
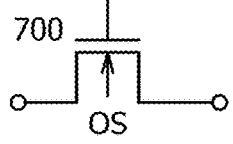
FIGS. 22A to 22I are circuit diagrams illustrating examples of a semiconductor device.
Figure 22B:
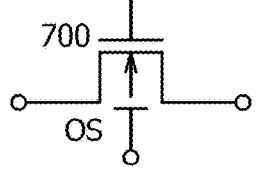

Circuits shown in FIGS. 22A and 22B each include a transistor 700, and function as a switching circuit, for example. The transistor 700 is an OS transistor. The transistor 700 shown in FIG. 22B is a dual-gate OS transistor including a first gate (top gate, or front gate) and a second gate (back gate). The on-state characteristics and off-state characteristics can be improved by controlling the first gate and the second gate separately.

Figure 22C:
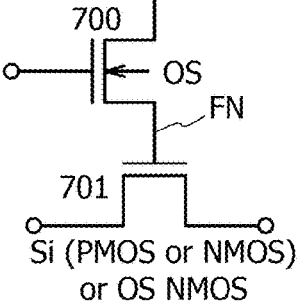

A circuit shown in FIG. 22C includes a transistor 700, a transistor 701, and a node FN, and functions as a memory circuit similar to the memory circuit 25 in FIG. 2A by holding a potential at the node FN. In FIG. 22C, the transistor 700 is an OS transistor. The transistor 701 may be a p-Si transistor, an n-Si transistor, or an OS transistor.

Figure 22D:
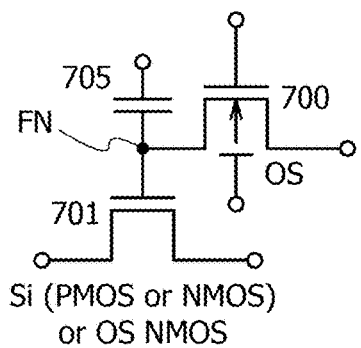

A circuit shown in FIG. 22D includes a transistor 700, a transistor 701, a capacitor 705, and a node FN. The circuit in FIG. 22D has a circuit structure similar to that of the memory circuit 25 in FIG. 2A, and functions as a memory circuit. Here, the transistor 700 is a dual-gate OS transistor. The transistor 701 may be a p-Si transistor, an n-Si transistor, or an OS transistor. If the transistor 701 is a p-Si transistor, sequence of data input is different from that shown in the timing charts in FIGS. 5A and 5B.

If the transistors 700 and 701 in the circuits in FIGS. 22C and 22D are OS transistors, it is not necessary to use a silicon substrate, and thus a transparent substrate such as a glass substrate or a quartz substrate, a metal substrate, or the like, may be used.

In miniaturization, an n-channel transistor needs more complicated steps such as formation of an LDD or a distortion, compared with a p-channel transistor. An OS transistor does not need complicated steps such as formation of an LDD or a distortion. Therefore, if the transistor 701 is a p-Si transistor and the transistor 700 is an OS transistor in the circuits in FIGS. 22C and 22D, a manufacturing process thereof can be simplified.

Since an OS transistor does not need a high-temperature process at 900° C. or higher, it is more suitable for integration than a Si transistor. In addition, the OS transistor and other semiconductor elements can be stacked, and thus a semiconductor device with high integration degree in which elements are three-dimensionally integrated can be provided with use of the OS transistors in the circuit. That is, since the OS transistor can be formed by a lower-temperature process than the Si transistor, the OS transistor can be formed over Si transistor; thus, a semiconductor device with high reliability and high performance can be provided.

Figure 22E:
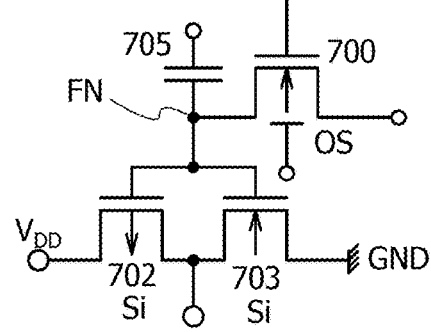

A circuit in FIG. 22E is a modification example of the circuit in FIG. 22D, and has a transistor 702 and a transistor 703 that are electrically connected to each other in series instead of the transistor 701. For example, a first terminal of the transistor 702 is electrically connected to a wiring or an electrode that is supplied with a power source potential ($V_{DD}$), and a second terminal of the transistor 703 is electrically connected to a wiring or an electrode that is supplied with a ground potential (GND). The transistor 700 is a dual-gate OS transistor, the transistor 702 is a p-Si transistor, and the transistor 703 is an n-Si transistor. The transistors 702 and 703 constitute a CMOS inverter circuit. The transistor 700 can be manufactured at a low temperature, and is compatible with a general manufacturing process of a Si transistor, and thus it is easy to form the transistor 700 over the transistors 702 and 703.

Figure 22F:
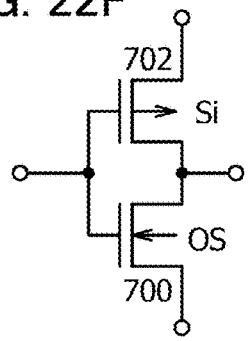

FIG. 22F illustrates an example of a CMOS inverter circuit. A transistor 700 is an OS transistor, and a transistor 702 is a p-Si transistor. The transistor 700 can be manufactured at low temperature, and is compatible with a general manufacturing process of a Si transistor, and thus it is easy to form the transistor 700 over the transistor 702.

Figure 22G:
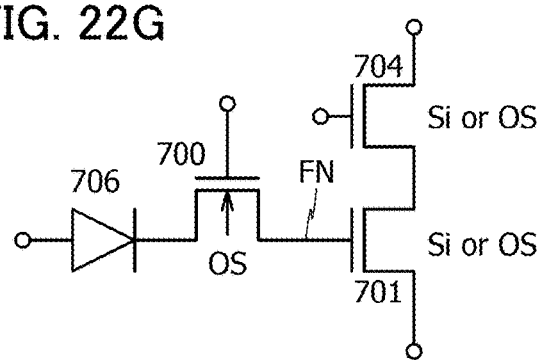

A circuit in FIG. 22G includes a transistor 700, a transistor 701, a transistor 704, a diode 706, and a node FN. The transistors 701 and 704 are electrically connected to each other in series. A gate of the transistor 701 is electrically connected to an output terminal of the diode 706 through the transistor 700. The input terminal of the diode 706, a gate of the transistor 700, a first terminal of the transistor 701, and a second terminal of the transistor 704 are electrically connected to wirings or electrodes that are different from each other (not illustrated in the drawing). The circuit including the transistor 700, the transistor 701, the transistor 704, the diode 706, and the node FN can function as a memory circuit similar to that of the circuits in FIG. 22C and the like. Data corresponding to a potential between the input terminal and an output terminal of the diode 706 can be held at the node FN. When a photodiode is used as the diode 706, it will function as a sensor element. In that case, the circuit in FIG. 22G can function as a photo sensor circuit. A potential corresponding to a photo current flowing in the photodiode (diode 706) can be held at the node FN.

A sensor element used in the circuit in FIG. 22G is not limited to a photo sensor element, but various sensors can be used. An example of the sensor element is as follows: an element having a function of measuring or detecting force, displacement, position, speed, acceleration, angular velocity, rotational frequency, distance, light (such as visible light or infrared light), electromagnetism (such as brain waves), magnetism, temperature, chemical substance, sound, time, hardness, electric field, current, voltage, electric power, radiation, flow rate, humidity, gradient, oscillation, smell, or the like, and converting the result into a voltage signal or a current signal. For example, a temperature sensor element where two resistors with different temperature characteristics are electrically connected to each other in series may be provided instead of the photodiode (706).

In the circuit in FIG. 22G, the transistor 700 is an OS transistor. The transistors 701 and 704 may each be a p-Si transistor, an n-Si transistor, or an OS transistor. The diode 706 may be a photodiode using silicon, for example. When the transistors 701 and 704 are Si transistors, it is easy to form the transistor 700 over the transistors 701 and 704 since the transistor 700 can be manufactured at a low temperature, and is compatible with a general manufacturing process of a Si transistor.

In addition, in the circuit in FIG. 22G, when one of the transistors 701 and 704 is a Si transistor and the other is an OS transistor, a circuit combining high-speed operation characteristics of the Si transistor and low-leakage current characteristics of the OS transistor can be formed.

Furthermore, in the circuit in FIG. 22G, the manufacturing process can be more simplified if the transistors 701 and 704 are OS transistors. As shown in Examples 1 and 3 described later, if a minute technology node is employed, an OS transistor can obtain frequency characteristics equivalent to that of a Si transistor, and thus a circuit combining high-speed operation characteristics and low-leakage current characteristics can be formed even with the structure.

Figure 22H:
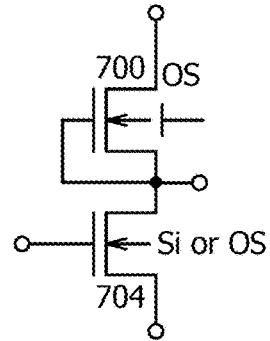

A circuit in FIG. 22H includes a transistor 700 and a transistor 704 electrically connected to each other in series. A first gate of the transistor 700 is electrically connected to a first terminal of the transistor 700, and a second terminal of the transistor 700 is electrically connected to a wiring or electrode that is not shown in the drawing. The first gate may be electrically connected to the second terminal. A first terminal of the transistor 704 is electrically connected to a wiring or electrode that is not shown in the drawing. The circuit in FIG. 22H can function as an enhancement/depletion type inverter circuit. The transistor 700 is a dual-gate OS transistor, and can control characteristics of the circuit (inverter circuit) shown in FIG. 22H when a second gate potential is variable. The transistor 704 may be an OS transistor or an n-Si transistor.

Figure 22I:
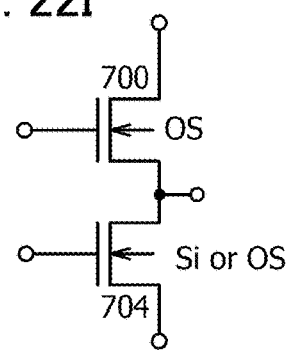

A circuit in FIG. 22I includes a transistor 700 and a transistor 704 electrically connected to each other in series, similar to the circuit in FIG. 22H. The circuit shown in FIG. 22I is different from the circuit in FIG. 22H in that a gate of the transistor 700 is electrically connected to a wiring or electrode that is not shown in the drawing. The circuit in FIG. 22I can function as an enhancement/enhancement type inverter circuit. The gate potential of the transistor 700 may be fixed, or be variable. The transistor 700 is an OS transistor. The transistor 704 may be an OS transistor or an n-Si transistor.

If the transistor 704 in FIGS. 22H and 22I is a Si transistor, the transistor 700 can be formed over the transistor 704, similar to the circuit in FIG. 22C.

For an OS transistor used for the circuits in FIGS. 22A to 22I, a second gate electrode may be provided or no second gate electrode may be provided as necessary.

The circuits (semiconductor devices) in FIGS. 22A to 22I can be formed over the same substrate. Therefore, a plurality of circuits with different functions or performance can be formed over the same substrate. For example, FIG. 23A illustrates a semiconductor device in the case where the circuits in FIGS. 22D and 22F are formed over the same substrate, and FIG. 24A illustrates a semiconductor device in the case where the circuits in FIGS. 22D and 22I are formed over the same substrate.

Figure 23A:
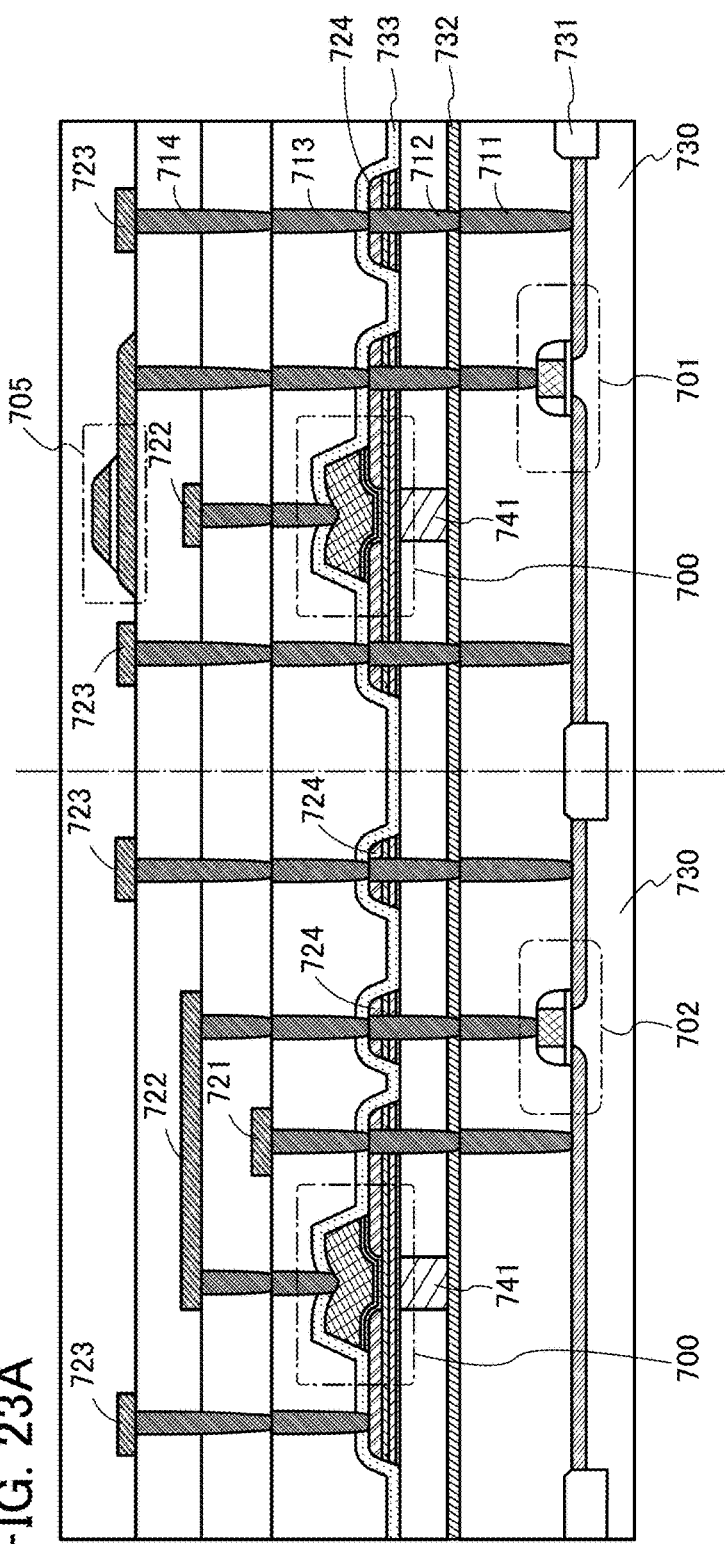
FIG. 23A is a cross-sectional view illustrating a structural example of a semiconductor device.
Figure 23C:
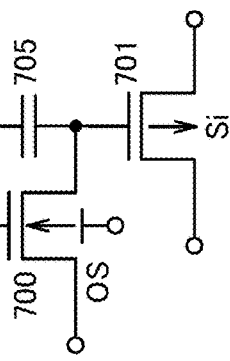
FIGS. 23B and 23C are circuit diagrams illustrating an example of the semiconductor device.
Figure 23B:
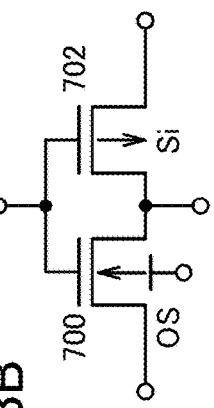

FIG. 23A is a cross-sectional view illustrating an example of a structure of the semiconductor device. The left portion corresponds to a circuit shown in FIG. 23B, and the right portion corresponds to a circuit shown in FIG. 23C. The circuit diagram in FIG. 23B corresponds to the circuit diagram in FIG. 22F, and the circuit diagram in FIG. 23C corresponds to the circuit diagram in FIG. 22D. In the semiconductor device in FIG. 23A, transistors 700 are OS transistors, and transistors 701 and 702 are p-Si transistors. FIG. 23A shows the cross-sectional view of the transistors in the channel length direction.

The semiconductor device in FIG. 23A includes the transistor 700, the transistor 701, the transistor 702, a capacitor 705, a substrate 730, an element separation layer 731, an insulating film 732, an insulating film 733, a plug 711, a plug 712, a plug 713, a plug 714, a wiring 721, a wiring 722, a wiring 723, a wiring 724, and a wiring 741. Note that in FIG. 23A, a reference numeral is given to one of a plurality of plugs formed in the same layer, and is not given to the other plugs in the same layer to avoid complexity.

For the detail of the substrate 730, the element separation layer 731, the insulating film 732, the insulating film 733, the plugs 711 to 714, and the wirings 721 to 723, the descriptions regarding the substrate 2201, the element separation layer 2204, the insulating film 2207, the insulating film 2208, the plug 2203, and the wiring 2202 in FIG. 19B are referred to, respectively.

The wiring 741 functions as a second gate electrode of the transistor 700. The wiring 741 may be formed of a material that can be used for the wirings 721 to 723. Note that the wiring 741 may be omitted in some cases. The wiring 724 can be formed of the same material as a source electrode or a drain electrode of the transistor 700.

In FIG. 23A, regions where reference numerals and hatching patterns are not given show regions formed of an insulator. In these regions, an insulator containing one or more materials selected from aluminum oxide, aluminum nitride oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, and the like can be used. Alternatively, in these regions, an organic resin such as a polyimide resin, a polyamide resin, an acrylic resin, a siloxane resin, an epoxy resin, or a phenol resin can be used.

In the semiconductor device with the structure shown in FIG. 23A, a memory circuit (including a transistor and a floating node) and a peripheral circuit can be formed over the same substrate. Since an OS transistor does not need a heat treatment at 900° C. or higher, the circuit can be formed in a lower-temperature process. In addition, a miniaturized OS transistor has frequency characteristics equivalent to that of an n-channel transistor with an active layer of silicon. A CMOS circuit combining an OS transistor and a p-Si transistor can operate at high speed.

FIG. 24A is a cross-sectional view illustrating an example of a structure of the semiconductor device. The left portion corresponds to a circuit shown in FIG. 24B, and the right portion corresponds to a circuit shown in FIG. 24C. The circuit diagram in FIG. 24B corresponds to the circuit diagram in FIG. 22I, and the circuit diagram in FIG. 24C corresponds to the circuit diagram in FIG. 22D. In the semiconductor device in FIG. 24A, transistors 700, a transistor 701, and a transistor 704 are OS transistors. FIG. 24A shows the cross-sectional view of the transistors in the channel length direction.

The semiconductor device in FIG. 24A includes the transistor 700, the transistor 701, the transistor 704, a capacitor 705, a substrate 735, an insulating film 732, an insulating film 733, a plug 711, a plug 712, a plug 713, a plug 714, a wiring 721, a wiring 722, a wiring 723, a wiring 724, a wiring 741, a wiring 742, and a wiring 743. Note that in FIG. 24A, a reference numeral is given to one of a plurality of plugs formed in the same layer, and is not given to the other plugs in the same layer to avoid complexity.

For the detail of the substrate 735, the description of the substrate 2201 in FIG. 19B is referred to. In addition, another device can be formed in the substrate 735. In that case, planarization treatment by CMP or the like is preferably performed so as to planarize a surface of the substrate 735.

For the detail of the insulating film 732, the insulating film 733, the plugs 711 to 714, and the wirings 721 to 723, the descriptions regarding the insulating film 2207, the insulating film 2208, the plug 2203, and the wiring 2202 in FIG. 19B are referred to, respectively.

The wiring 741 has a function as a second gate electrode of the transistor 700, the wiring 742 has a function as a second gate electrode of the transistor 701, and the wiring 743 has a function as a second gate electrode of the transistor 704. The wirings 741 to 743 can be formed of a material that can be used for the wirings 721 to 723. The wirings 741 to 743 may be omitted in some cases.

The wiring 724 can be formed of the same material as a source electrode or a drain electrode of the transistor 700 and the transistor 704.

In FIG. 24A, regions where reference numerals and hatching patterns are not given show regions formed of an insulator. In these regions, an insulator containing one or more materials selected from aluminum oxide, aluminum nitride oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, and the like can be used. Alternatively, in these regions, an organic resin such as a polyimide resin, a polyamide resin, an acrylic resin, a siloxane resin, an epoxy resin, or a phenol resin can be used.

In the semiconductor device with the structure shown in FIG. 24A, a memory circuit (including a transistor and a floating node) and a peripheral circuit can be formed over the same substrate. Since an OS transistor does not need a heat treatment at 900° C. or higher, the semiconductor device can be formed in a lower-temperature process. In addition, an OS transistor and other semiconductor elements can be stacked, and the elements can be three-dimensionally arranged, whereby a semiconductor device with high integration degree can be manufactured. In addition, a miniaturized OS transistor has frequency characteristics equivalent to that of an n-channel transistor with an active layer of silicon. A circuit with an OS transistor can operate at high speed.

In addition, influence of electron mobility dependence of an OS transistor on the channel length is not as large as that of electron mobility dependence of a Si transistor on the channel length. Moreover, there is no clear reduction in field effect mobility of an OS transistor even when the channel length is shortened from 10 μm to 100 nm.

Therefore, when an OS transistor with a channel length of 10 μm or less is used, difference in the field effect mobility between the OS transistor and a Si transistor becomes smaller than the difference when the channel length of the OS transistor is larger than 10 μm. When an OS transistor with a channel length of 100 nm or less is used, the difference in the field effect mobility can be reduced; specifically, the field effect mobility of the OS transistor can be about 1/30, preferably 1/10, or further preferably 1/3 of a Si transistor.

When an OS transistor is used for a transistor with a channel length of about 100 nm, it will be possible to achieve the field effect mobility equivalent to that of a Si transistor. Thus, a miniaturized OS transistor can achieve switching speed and frequency characteristics that are equivalent to those of the Si transistor.

In addition, an OS transistor is characterized by its low off-state current. In a circuit using an OS transistor, capacitance for holding charge can be small because of the low off-state current.

The structure of this embodiment can be combined with any of the structures described in the other embodiments or examples as appropriate.

Embodiment 4

In this embodiment, an RF device including a memory device such as the memory cell array 300 illustrated in the above embodiment is described. Here, the memory device may include a row driver, a column driver, an A/D converter, and the like that are connected to the memory cell array.

The RF device of this embodiment includes a memory circuit, stores necessary data in the memory circuit, and transmits and receives data to/from the outside by using contactless means, for example, wireless communication. With these features, the RF device can be used for an individual authentication system in which an object or the like is recognized by reading the individual information, for example. In order that an RF device is used for such application, extremely high reliability is needed.

Figure 25:
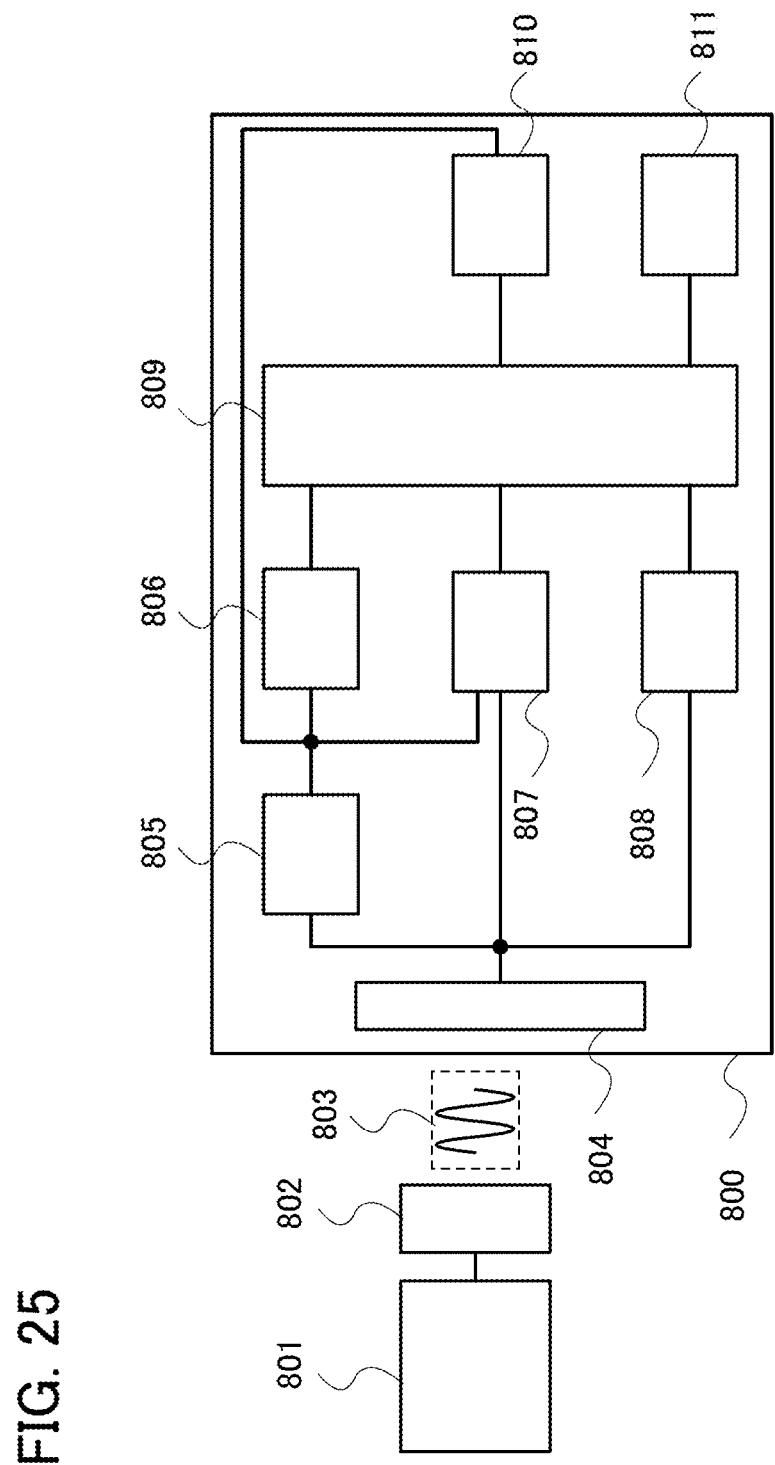
FIG. 25 illustrates an example of an RF device.
Figure 26A:
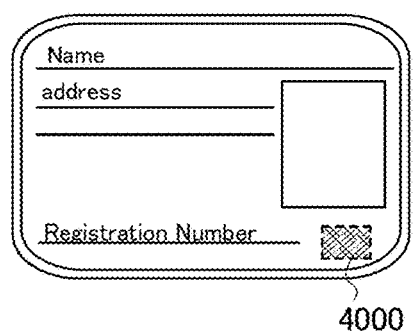
FIGS. 26A to 26F are figures illustrating examples of usage of an RF device.
Figure 26B:
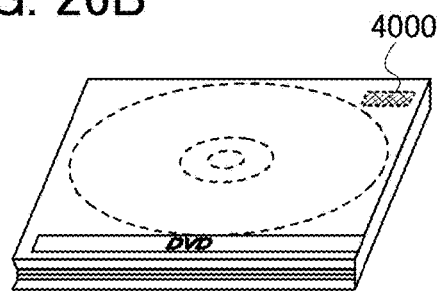
Figure 26C:
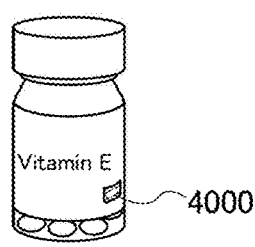
Figure 26D:
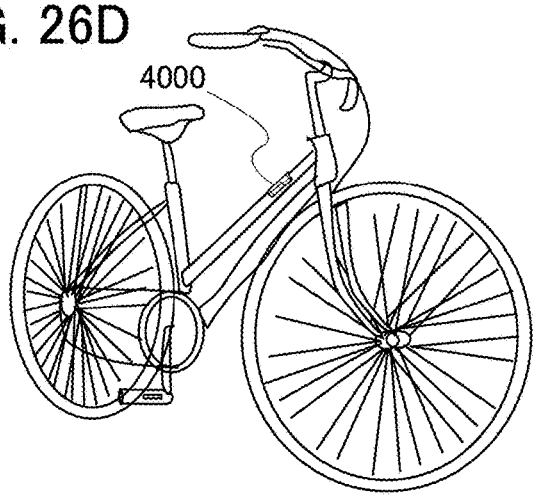
Figure 26E:
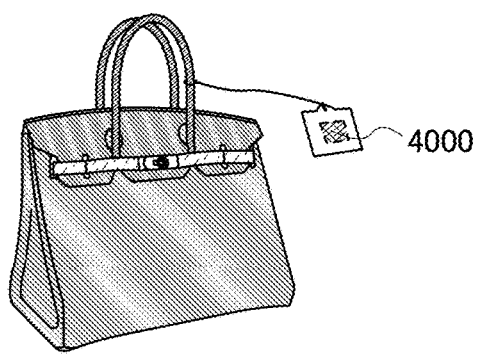
Figure 26F:
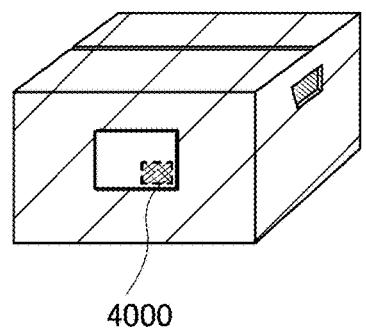

FIG. 25 is a block diagram illustrating a configuration example of an RF device. The RF device 800 in FIG. 25 includes an antenna 804, a rectifier circuit 805, a constant voltage circuit 806, a demodulation circuit 807, a modulation circuit 808, a logic circuit 809, a memory circuit 810, and a ROM 811.

A transistor having a rectifying function included in the demodulation circuit 807 may be formed using a material that enables a reverse current to be low enough, for example, an oxide semiconductor. This can suppress the phenomenon of a rectifying function becoming weaker due to generation of a reverse current and prevent saturation of the output from the demodulation circuit. In other words, the input to the demodulation circuit and the output from the demodulation circuit can have a relation closer to a linear relation. Note that data transmission methods are roughly classified into the following three methods: an electromagnetic coupling method by which a pair of coils is provided so as to be faced with each other and communicates with each other by mutual induction, an electromagnetic induction method by which communication is performed using an induction field, and an electric wave method by which communication is performed using an electric wave. Any of these methods can be used in the RF device 800 described in this embodiment.

Next, a structure of each circuit will be described. The antenna 804 exchanges a radio signal 803 with an antenna 802 which is connected to the communication device 801 (also referred to as an interrogator, a reader/writer, or the like). The rectifier circuit 805 generates an input potential by rectification, for example, half-wave voltage doubler rectification of an input alternating signal generated by reception of a radio signal at the antenna 804 and smoothing of the rectified signal with a capacitor provided in a later stage in the rectifier circuit 805. Note that a limiter circuit may be provided on an input side or an output side of the rectifier circuit 805. The limiter circuit controls electric power so that electric power which is higher than or equal to certain electric power is not input to a circuit in a later stage if the amplitude of the input alternating signal is high and an internal generation voltage is high.

The constant voltage circuit 806 generates a stable power supply voltage from an input potential and supplies it to each circuit. Note that the constant voltage circuit 806 may include a reset signal generation circuit. The reset signal generation circuit is a circuit which generates a reset signal of the logic circuit 809 by utilizing rise of the stable power supply voltage.

The demodulation circuit 807 demodulates the input alternating signal by envelope detection and generates the demodulated signal. Further, the modulation circuit 808 performs modulation in accordance with data to be output from the antenna 804.

The logic circuit 809 analyzes and processes the demodulated signal. The memory circuit 810 holds the input data and includes a row decoder, a column decoder, a memory region, and the like. Further, the ROM 811 stores an identification number (ID) or the like and outputs it in accordance with processing.

Note that decision whether each circuit described above is provided or not can be made as appropriate as needed.

Here, the memory circuit described in the above embodiment can be applied to the memory circuit 810. Since the memory circuit of one embodiment of the present invention can retain data even when not powered, the memory circuit can be favorably used for an RF device. Furthermore, the memory circuit of one embodiment of the present invention needs power (voltage) needed for data writing significantly lower than that needed in a conventional nonvolatile memory; thus, it is possible to prevent a difference between the maximum communication distances in data reading and that in data writing. Furthermore, it is possible to suppress malfunction or incorrect writing which is caused by power shortage in data writing.

Since the memory circuit of one embodiment of the present invention can be used as a nonvolatile memory, it can also be used as the ROM 811. In this case, it is preferable that a manufacturer separately prepare a command for writing data to the ROM 811 so that a user cannot rewrite data freely. Since the manufacturer gives identification numbers before shipment and then starts shipment of products, instead of putting identification numbers to all the manufactured RF devices, it is possible to put identification numbers only to good products to be shipped. Thus, the identification numbers of the shipped products are in series and customer management corresponding to the shipped products is easily performed.

Next, application examples of an RF device of one embodiment of the present invention will be described with reference to FIGS. 26A to 26F. The RF device is widely used and can be provided for, for example, products such as bills, coins, securities, bearer bonds, documents (e.g., driver's licenses or residence cards, see FIG. 26A), recording media (e.g., DVD software or video tapes, see FIG. 26B), packaging containers (e.g., wrapping paper or bottles, see FIG. 26C), vehicles (e.g., bicycles, see FIG. 26D), personal belongings (e.g., bags or glasses), foods, plants, animals, human bodies, clothing, household goods, medical supplies such as medicine and chemicals, and electronic devices (e.g., liquid crystal display devices, EL display devices, television sets, or cellular phones), or tags on products (see FIGS. 26E and 26F).

An RF device 4000 of one embodiment of the present invention is fixed to a product by being attached to a surface thereof or embedded therein. For example, the RF device 4000 is fixed to each product by being embedded in paper of a book, or embedded in an organic resin of a package. Since the RF device 4000 of one embodiment of the present invention can be reduced in size, thickness, and weight, it can be fixed to a product without spoiling the design of the product. Furthermore, bills, coins, securities, bearer bonds, documents, or the like can have an identification function by being provided with the RF device 4000 of one embodiment of the present invention, and the identification function can be utilized to prevent counterfeiting. Moreover, the efficiency of a system such as an inspection system can be improved by providing the RF device of one embodiment of the present invention for packaging containers, recording media, personal belongings, foods, clothing, household goods, electronic devices, or the like. Vehicles can also have higher security against theft or the like by being provided with the RF device of one embodiment of the present invention.

As described above, by using the RF device of one embodiment of the present invention for each application described in this embodiment, power for operation such as writing or reading of data can be reduced, which results in an increase in the maximum communication distance. Moreover, data can be held for an extremely long period even in the state where power is not supplied; thus, the RF device can be preferably used for application in which data is not frequently written or read.

The structure and method described in this embodiment can be implemented by being combined as appropriate with any of the other structures and methods described in the other embodiments.

Embodiment 5

In this embodiment, a CPU including a memory device which has at least the memory cell array 300 described in the above embodiment is described. Here, the memory device may include a row driver, a column driver, an A/D converter, and the like that are connected to the memory cell array.

Figure 27:
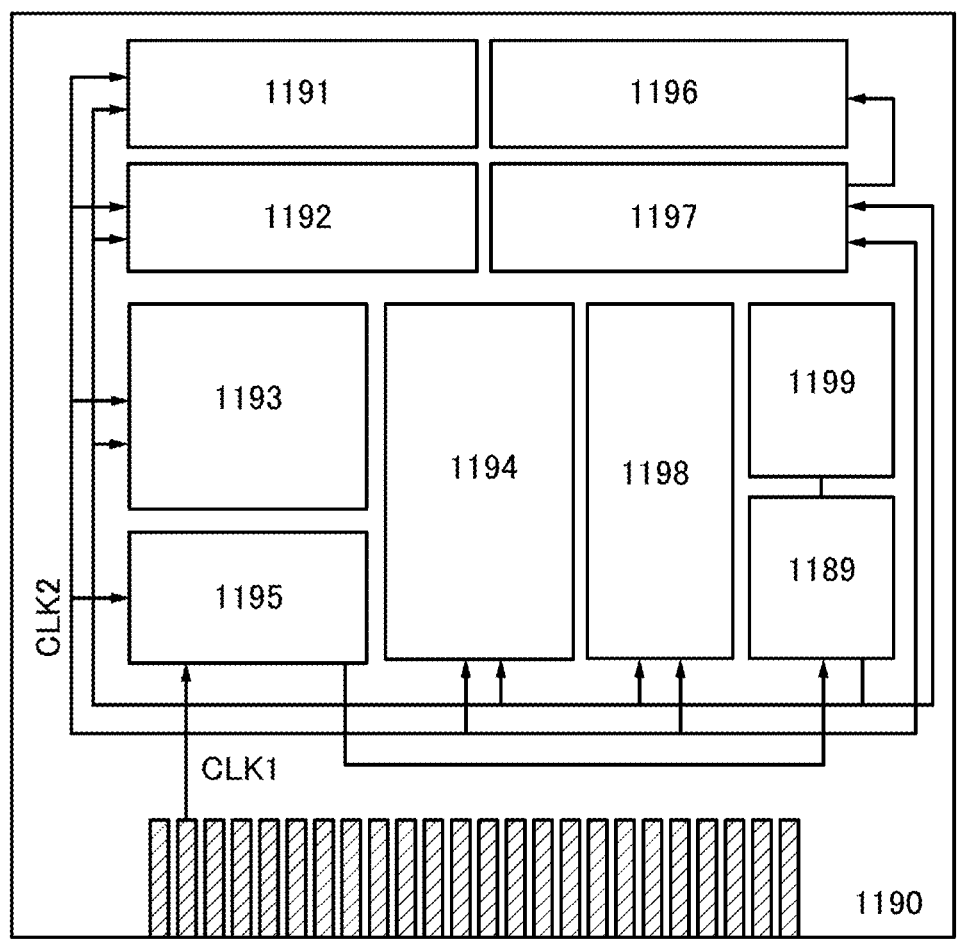
FIG. 27 is a figure illustrating an example of a CPU.

FIG. 27 is a block diagram illustrating a structural example of a CPU at least part of which includes the memory device described in the above embodiments or other semiconductor devices.

The CPU illustrated in FIG. 27 includes an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and an ROM interface (ROM I/F) 1189 over a substrate 1190. A semiconductor substrate, an SOI substrate, a glass substrate, or the like is used as the substrate 1190. The ROM 1199 and the ROM interface 1189 may be provided over a separate chip. Needless to say, the CPU in FIG. 27 is just an example of a simplified structure, and an actual CPU may have a variety of structures depending on the application. For example, the CPU may have the following configuration: a structure including the CPU illustrated in FIG. 27 or an arithmetic circuit is considered as one core; a plurality of the cores is included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 processes an interrupt request from an external input/output device or a peripheral circuit depending on its priority or a mask state. The register controller 1197 generates an address of the register 1196, and reads/writes data from/to the register 1196 depending on the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 on the basis of a reference clock signal CLK1, and supplies the internal clock signal CLK2 to the above circuits.

In the CPU illustrated in FIG. 27, a memory cell is provided in the register 1196. For the memory cell of the register 1196, any of the transistors described in the above embodiments can be used.

In the CPU illustrated in FIG. 27, the register controller 1197 selects an operation of holding data in the register 1196 in accordance with an instruction from the ALU 1191. That is, the register controller 1197 selects whether data is held by a flip-flop or by a capacitor in the memory cell included in the register 1196. When data holding by the flip-flop is selected, a power supply voltage is supplied to the memory cell in the register 1196. When data holding by the capacitor is selected, the data is rewritten in the capacitor, and supply of power supply voltage to the memory cell in the register 1196 can be stopped.

Figure 28:
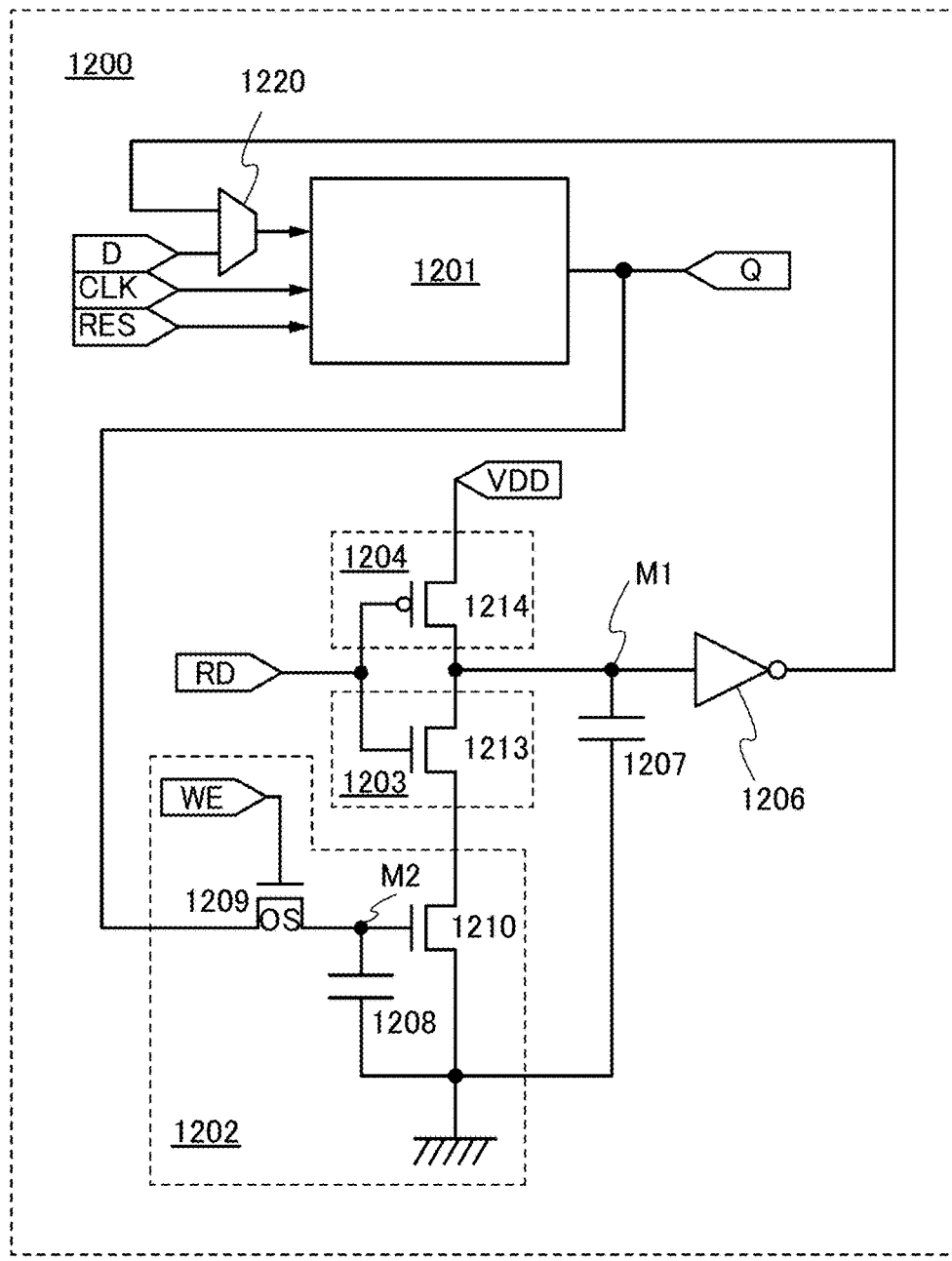
FIG. 28 is a circuit diagram illustrating an example of a memory circuit.

FIG. 28 is an example of a circuit diagram of a memory element that can be used as the register 1196. A memory circuit 1200 includes a circuit 1201 in which stored data is volatile when power supply is stopped, a circuit 1202 in which stored data is nonvolatile even when power supply is stopped, a switch 1203, a switch 1204, a logic element 1206, a capacitor 1207, and a circuit 1220 having a selecting function. The circuit 1202 includes a capacitor 1208, a transistor 1209, and a transistor 1210. Note that the memory circuit 1200 may further include another element such as a diode, a resistor, or an inductor, as needed. The transistor 1209 is preferably a transistor in which a channel is formed in an oxide semiconductor layer.

Here, the memory device described in the above embodiment can be used as the circuit 1202. When supply of a power supply voltage to the memory circuit 1200 is stopped, a ground potential (0 V) or a potential at which the transistor 1209 in the circuit 1202 is turned off is continuously input to a gate of the transistor 1209. For example, the gate of the transistor 1209 is grounded through a load such as a resistor.

Shown here is an example in which the switch 1203 is a transistor 1213 having one conductivity type (e.g., an n-channel transistor) and the switch 1204 is a transistor 1214 having a conductivity type opposite to the one conductivity type (e.g., a p-channel transistor). A first terminal of the switch 1203 corresponds to one of a source and a drain of the transistor 1213, a second terminal of the switch 1203 corresponds to the other of the source and the drain of the transistor 1213, and conduction or non-conduction between the first terminal and the second terminal of the switch 1203 (i.e., the on/off state of the transistor 1213) is selected by a control signal RD input to a gate of the transistor 1213. A first terminal of the switch 1204 corresponds to one of a source and a drain of the transistor 1214, a second terminal of the switch 1204 corresponds to the other of the source and the drain of the transistor 1214, and conduction or non-conduction between the first terminal and the second terminal of the switch 1204 (i.e., the on/off state of the transistor 1214) is selected by the control signal RD input to a gate of the transistor 1214.

One of a source and a drain of the transistor 1209 is electrically connected to one of a pair of electrodes of the capacitor 1208 and a gate of the transistor 1210. Here, the connection portion is referred to as a node M2. One of a source and a drain of the transistor 1210 is electrically connected to a wiring that can supply a low power supply potential (e.g., a GND line), and the other thereof is electrically connected to the first terminal of the switch 1203 (the one of the source and the drain of the transistor 1213). The second terminal of the switch 1203 (the other of the source and the drain of the transistor 1213) is electrically connected to the first terminal of the switch 1204 (the one of the source and the drain of the transistor 1214). The second terminal of the switch 1204 (the other of the source and the drain of the transistor 1214) is electrically connected to a wiring which can supply a power supply potential $V_{DD}$. The second terminal of the switch 1203 (the other of the source and the drain of the transistor 1213), the first terminal of the switch 1204 (the one of the source and the drain of the transistor 1214), an input terminal of the logic element 1206, and one of a pair of electrodes of the capacitor 1207 are electrically connected to each other. Here, the connection portion is referred to as a node M1. The other of the pair of electrodes of the capacitor 1207 can be supplied with a constant potential. For example, the other of the pair of electrodes of the capacitor 1207 can be supplied with a low power supply potential (e.g., GND) or a high power supply potential (e.g., $V_{DD}$). The other of the pair of electrodes of the capacitor 1207 is electrically connected to the line which can supply a low power supply potential (e.g., a GND line). The other of the pair of electrodes of the capacitor 1208 can be supplied with a constant potential. For example, the other of the pair of electrodes of the capacitor 1208 can be supplied with a low power supply potential (e.g., GND) or a high power supply potential (e.g., $V_{DD}$). The other of the pair of electrodes of the capacitor 1208 is electrically connected to the line which can supply a low power supply potential (e.g., a GND line).

The capacitor 1207 and the capacitor 1208 are not necessarily provided as long as the parasitic capacitance of the transistor, the wiring, or the like is actively utilized.

A control signal WE is input to the first gate (first gate electrode) of the transistor 1209. As for each of the switch 1203 and the switch 1204, a conduction state or a non-conduction state between the first terminal and the second terminal is selected by the control signal RD which is different from the control signal WE. When the first terminal and the second terminal of one of the switches are in the conduction state, the first terminal and the second terminal of the other of the switches are in the non-conduction state.

A signal corresponding to data retained in the circuit 1201 is input to the other of the source and the drain of the transistor 1209. FIG. 28 illustrates an example in which a signal output from the circuit 1201 is input to the other of the source and the drain of the transistor 1209. The logic value of a signal output from the second terminal of the switch 1203 (the other of the source and the drain of the transistor 1213) is inverted by the logic element 1206, and the inverted signal is input to the circuit 1201 through the circuit 1220.

In the example of FIG. 28, a signal output from the second terminal of the switch 1203 (the other of the source and the drain of the transistor 1213) is input to the circuit 1201 through the logic element 1206 and the circuit 1220; however, one embodiment of the present invention is not limited thereto. The signal output from the second terminal of the switch 1203 (the other of the source and the drain of the transistor 1213) may be input to the circuit 1201 without its logic value being inverted. For example, in the case where the circuit 1201 includes a node in which a signal obtained by inversion of the logic value of a signal input from the input terminal is retained, the signal output from the second terminal of the switch 1203 (the other of the source and the drain of the transistor 1213) can be input to the node.

In FIG. 28, the transistors included in the memory circuit 1200 except for the transistor 1209 can each be a transistor in which a channel is formed in a layer formed using a semiconductor other than an oxide semiconductor or in the substrate 1190. For example, it can be a Si transistor in which a channel is formed in a silicon layer or in a silicon substrate. Alternatively, all the transistors in the memory circuit 1200 may each be an OS transistor in which a channel is formed in an oxide semiconductor layer. Further alternatively, in the memory circuit 1200, an OS transistor in which a channel is formed in an oxide semiconductor can be included besides the transistor 1209, and a transistor in which a channel is formed in a layer or the substrate 1190 including a semiconductor other than an oxide semiconductor can be used for the rest of the transistors.

As the circuit 1201 in FIG. 28, for example, a flip-flop circuit can be used. As the logic element 1206, for example, an inverter or a clocked inverter can be used.

In a period during which the memory circuit 1200 is not supplied with the power supply voltage, the semiconductor device of one embodiment of the present invention can retain data stored in the circuit 1201 by the capacitor 1208 which is provided in the circuit 1202.

An off-state current of an OS transistor is extremely small. For example, the off-state current of the OS transistor is significantly smaller than that of a transistor in which a channel is formed in silicon having crystallinity. Thus, when the OS transistor is used as the transistor 1209, a signal held in the capacitor 1208 is retained for a long time also in a period during which the power supply voltage is not supplied to the memory circuit 1200. The memory circuit 1200 can accordingly retain the stored content (data) also in a period during which the supply of the power supply voltage is stopped.

Since the above-described memory element performs pre-charge operation with the switch 1203 and the switch 1204, the time required for the circuit 1201 to retain original data again after the supply of the power supply voltage is restarted can be shortened.

In the circuit 1202, a signal retained by the capacitor 1208 is input to the gate of the transistor 1210. Thus, after supply of the power supply voltage to the memory circuit 1200 is restarted, the signal retained by the capacitor 1208 can be converted into the one corresponding to the state (the on state or the off state) of the transistor 1210 to be read from the circuit 1202. Consequently, an original signal can be accurately read even when a potential corresponding to the signal retained by the capacitor 1208 varies to some degree.

By applying the above-described memory circuit 1200 to a memory device such as a register or a cache memory included in a processor, data in the memory device can be prevented from being lost owing to the stop of the supply of the power supply voltage. Further, shortly after the supply of the power supply voltage is restarted, the memory element can be returned to the same state as that before the power supply is stopped. Therefore, the power supply can be stopped even for a short time in the processor or one or a plurality of logic circuits included in the processor. Accordingly, power consumption can be suppressed.

Although the memory circuit 1200 is used in a CPU in this embodiment, the memory circuit 1200 can also be used in an LSI such as a digital signal processor (DSP), a custom LSI, or a programmable logic device (PLD), and a radio frequency (RF) device.

Note that in this specification and the like, a transistor can be formed using any of a variety of substrates, for example. The type of a substrate is not limited to a certain type. As the substrate, a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, a base material film, or the like can be used, for example. As an example of a glass substrate, a barium borosilicate glass substrate, an aluminoborosilicate glass substrate, a soda lime glass substrate, or the like can be given. Examples of the flexible substrate, the attachment film, the base material film, or the like are as follows: plastic typified by polyethylene terephthalate (PET), polyethylene naphthalate (PEN), and polyether sulfone (PES). Another example is a synthetic resin such as acrylic. Other examples are polypropylene, polyester, polyvinyl fluoride, polyvinyl chloride, or the like. Other examples are polyamide, polyimide, aramid, epoxy, an inorganic vapor deposition film, paper, or the like. Specifically, the use of semiconductor substrates, single crystal substrates, SOI substrates, or the like enables the manufacture of small-sized transistors with a small variation in characteristics, size, shape, or the like and with high current capability. A circuit using such transistors achieves lower power consumption of the circuit or higher integration of the circuit.

Alternatively, a flexible substrate may be used as the substrate, and the transistor may be provided directly on the flexible substrate. Further alternatively, a separation layer may be provided between the substrate and the transistor. The separation layer can be used when part or the whole of a semiconductor device formed over the separation layer is separated from the substrate and transferred onto another substrate. In such a case, the transistor can be transferred to a substrate having low heat resistance or a flexible substrate as well. For the above separation layer, a stack including inorganic films, which are a tungsten film and a silicon oxide film, or an organic resin film of polyimide or the like formed over a substrate can be used, for example.

In other words, a transistor may be formed using one substrate, and then transferred to another substrate. Examples of a substrate to which a transistor is transferred include, in addition to the above substrate over which the transistor can be formed, a paper substrate, a cellophane substrate, an aramid film substrate, a polyimide film substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), and the like), a leather substrate, and a rubber substrate. When such a substrate is used, a transistor with excellent properties or a transistor with low power consumption can be formed, a device with high durability can be manufactured, high heat resistance can be provided, or reduction in weight or thickness can be achieved.

The structure and method described in this embodiment can be implemented by being combined as appropriate with any of the other structures and methods described in the other embodiments.

Embodiment 6

The semiconductor device of one embodiment of the present invention can be used for display devices, personal computers, image reproducing devices provided with recording media (typically, devices which reproduce the content of recording media such as digital versatile discs (DVDs) and have displays for displaying the reproduced images), or the like. Other examples of electronic devices that can be equipped with the semiconductor device of one embodiment of the present invention are mobile phones, game machines including portable game consoles, portable data terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 29A to 29F illustrate specific examples of such electronic devices.

Figure 29A:
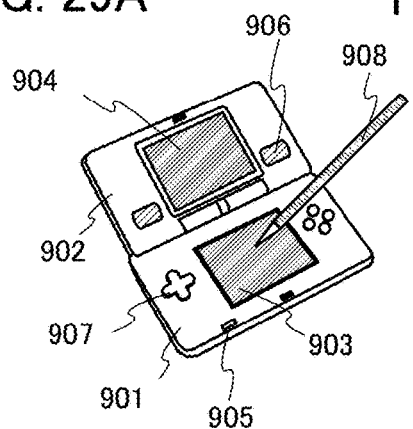
FIGS. 29A to 29F are figures illustrating examples of an electronic device.

FIG. 29A illustrates a portable game console including a housing 901, a housing 902, a display portion 903, a display portion 904, a microphone 905, a speaker 906, an operation key 907, a stylus 908, and the like. Although the portable game console in FIG. 29A has the two display portions 903 and 904, the number of display portions included in a portable game console is not limited to this.

Figure 29B:
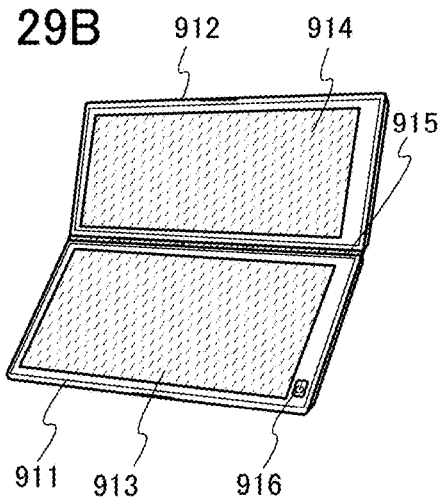

FIG. 29B illustrates a portable data terminal including a first housing 911, a second housing 912, a first display portion 913, a second display portion 914, a joint 915, an operation key 916, and the like. The first display portion 913 is provided in the first housing 911, and the second display portion 914 is provided in the second housing 912. The first housing 911 and the second housing 912 are connected to each other with the joint 915, and the angle between the first housing 911 and the second housing 912 can be changed with the joint 915. An image on the first display portion 913 may be switched depending on the angle between the first housing 911 and the second housing 912 at the joint 915. A display device with a position input function may be used as at least one of the first display portion 913 and the second display portion 914. Note that the position input function can be added by provision of a touch panel in a display device. Alternatively, the position input function can be added by provision of a photoelectric conversion element called a photosensor in a pixel area of a display device.

Figure 29C:
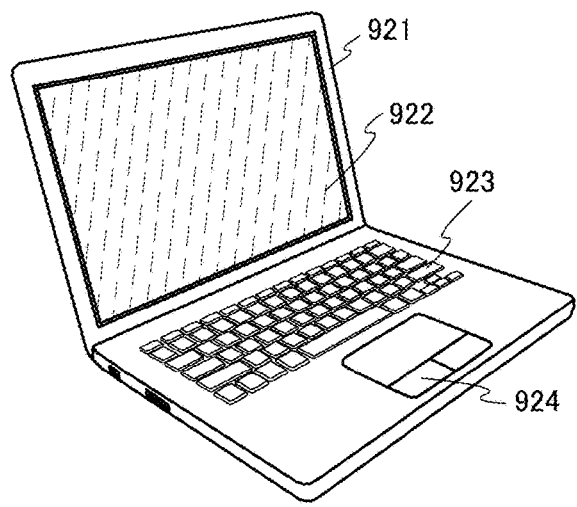

FIG. 29C illustrates a notebook personal computer, which includes a housing 921, a display portion 922, a keyboard 923, a pointing device 924, and the like.

Figure 29D:
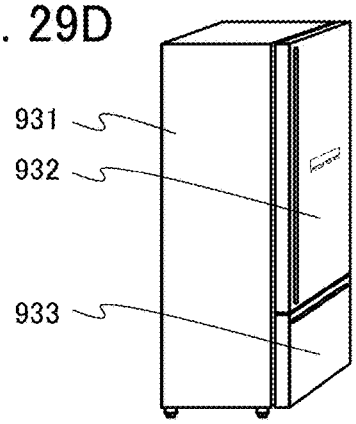

FIG. 29D illustrates an electric refrigerator-freezer including a housing 931, a refrigerator door 932, a freezer door 933, and the like.

Figure 29E:
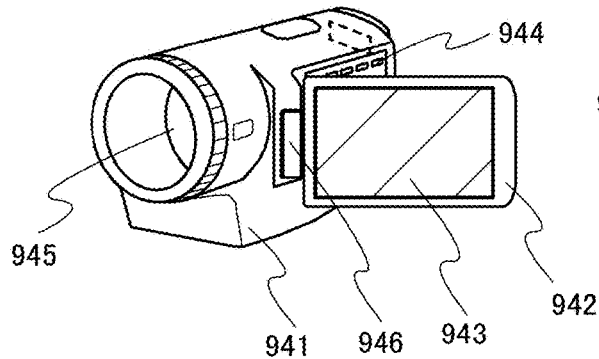

FIG. 29E illustrates a video camera, which includes a first housing 941, a second housing 942, a display portion 943, operation keys 944, a lens 945, a joint 946, and the like. The operation keys 944 and the lens 945 are provided for the first housing 941, and the display portion 943 is provided for the second housing 942. The first housing 941 and the second housing 942 are connected to each other with the joint 946, and the angle between the first housing 941 and the second housing 942 can be changed with the joint 946. Images displayed on the display portion 943 may be switched in accordance with the angle at the joint 946 between the first housing 941 and the second housing 942.

Figure 29F:
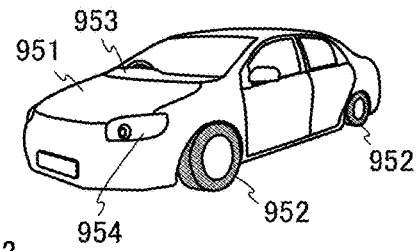

FIG. 29F illustrates an ordinary vehicle including a car body 951, wheels 952, a dashboard 953, lights 954, and the like.

The structure and method described in this embodiment can be implemented by being combined as appropriate with any of the other structures and methods described in the other embodiments.

Embodiment 7

In this embodiment, an oxide semiconductor film included in a semiconductor device is described in detail.

The oxide semiconductor film is an oxide semiconductor containing indium. The oxide semiconductor film can have high carrier mobility (electron mobility) by containing indium, for example. For the circuit system of one embodiment of the present invention, it is particularly preferable to use an oxide semiconductor film containing oxygen, In, Zn, and M (M is Ti, Ga, Y, Zr, La, Ce, Nd, or Hf). The element M is an element having a high bonding energy with oxygen, for example. The element M is an element whose bonding energy with oxygen is higher than that of indium, for example. The element M is an element that can increase the energy gap of the oxide semiconductor, for example. Further, the semiconductor film preferably contains zinc. When the oxide semiconductor contains zinc, the oxide semiconductor is easily to be crystallized, for example.

As the oxide semiconductor film, an oxide with a wide energy gap is preferably used. For example, the energy gap of the oxide semiconductor film is greater than or equal to 2.5 eV and less than or equal to 4.2 eV, preferably greater than or equal to 2.8 eV and less than or equal to 3.8 eV, further preferably greater than or equal to 3 eV and less than or equal to 3.5 eV.

In addition, when the oxide semiconductor film has a stacked-layer structure, the oxide semiconductor film may have the stacked-layer structure of the semiconductor film 44a, the semiconductor film 44b, and the semiconductor film 44c as shown in FIG. 2D.

Note that the semiconductor film 44a and the semiconductor film 44c are oxide semiconductors containing one, two, or more of the elements other than oxygen included in the semiconductor film 44b. Since the semiconductor film 44a and the semiconductor film 44c each include one or more elements other than oxygen included in the semiconductor film 44b, an interface state is less likely to be formed at the interface between the semiconductor film 44a and the semiconductor film 44b and the interface between the semiconductor film 44b and the semiconductor film 44c.

The semiconductor film 44a, the semiconductor film 44b, and the semiconductor film 44c preferably include at least indium. In the case of using an In-M-Zn oxide as the semiconductor film 44a, when a summation of In and M is assumed to be 100 atomic %, the proportions of In and M are preferably set to be less than 50 atomic % and greater than 50 atomic %, respectively, more preferably less than 25 atomic % and greater than 75 atomic %, respectively. In the case of using an In-M-Zn oxide as the semiconductor film 44b, when a summation of In and M is assumed to be 100 atomic %, the proportions of In and M are preferably set to be greater than 25 atomic % and less than 75 atomic %, respectively, more preferably greater than 34 atomic % and less than 66 atomic %, respectively. In the case of using an In-M-Zn oxide as the semiconductor film 44c, when a summation of In and M is assumed to be 100 atomic %, the proportions of In and M are preferably set to be less than 50 atomic % and greater than 50 atomic %, respectively, more preferably less than 25 atomic % and greater than 75 atomic %, respectively. Note that the semiconductor film 44c may be an oxide that is a type the same as that of the semiconductor film 44a.

As the semiconductor film 44b, an oxide having an electron affinity higher than those of the semiconductor films 44a and 44c is used. For example, as the semiconductor film 44b, an oxide having an electron affinity higher than those of the semiconductor films 44a and 44c by greater than or equal to 0.07 eV and less than or equal to 1.3 eV, preferably greater than or equal to 0.1 eV and less than or equal to 0.7 eV, further preferably greater than or equal to 0.15 eV and less than or equal to 0.4 eV is used. Note that the electron affinity refers to an energy gap between the vacuum level and the bottom of the conduction band.

An indium gallium oxide has a small electron affinity and a high oxygen-blocking property. Therefore, the semiconductor film 44c preferably includes an indium gallium oxide. The gallium atomic ratio [Ga/(In+Ga)] is, for example, higher than or equal to 70%, preferably higher than or equal to 80%, more preferably higher than or equal to 90%.

The semiconductor film 44c preferably includes gallium oxide. The gallium oxide film can function as a blocking film for preventing diffusion of indium. When the semiconductor film 44c is formed of a gallium oxide film, diffusion of indium from the semiconductor film 44b and the semiconductor film 44a positioned below will not occur, or will be suppressed.

When the field effect is applied to the gate electrode of the transistor, a channel is formed in the semiconductor film 44b having the highest electron affinity among the semiconductor films 44a, 44b, and 44c.

Figure 30:
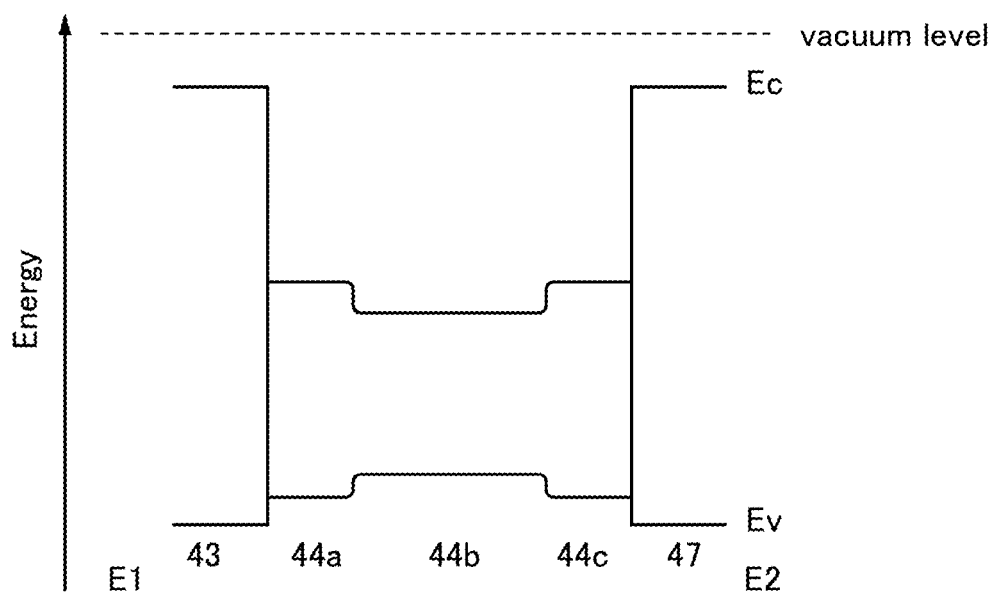
FIG. 30 shows a band structure in a stacked-layer structure of insulating films and oxide semiconductor films.

Here, a band structure in the stacked-layer structure of the insulating films and the oxide semiconductor films is illustrated in FIG. 30. FIG. 30 illustrates a vacuum level, and energy at the bottom of the conduction band (Ec) and energy at the top of the valence band (Ev) of each film (the insulating film 43, the semiconductor film 44a, the semiconductor film 44b, the semiconductor film 44c, and the insulating film 47).

Note that a region where the semiconductor film 44a and the semiconductor film 44b are mixed is formed between the semiconductor film 44a and the semiconductor film 44b in some cases. In addition, a region where the semiconductor film 44b and the semiconductor film 44c are mixed is formed between the semiconductor film 44b and the semiconductor film 44c in some cases. The mixed regions have a low interface state density. For that reason, the stack including the semiconductor films 44a, 44b, and 44c has a band structure where energy at each interface and in the vicinity of the interface is changed continuously (continuous junction).

Note that FIG. 30 illustrates the case where Ec of the semiconductor film 44a is equal to Ec of the semiconductor film 44c; however, they may be different from each other. For example, Ec of the semiconductor film 44c may be higher than Ec of the semiconductor film 44a.

At this time, electrons move mainly in the semiconductor film 44b, not in the semiconductor films 44a and 44c.

As described above, when the interface state density at the interface between the semiconductor film 44a and the semiconductor film 44b and the interface state density at the interface between the semiconductor film 44b and the semiconductor film 44c are lowered, the on-state current of the transistor can be increased without interruption of the movement of electrons in the semiconductor film 44b.

In the case where the transistor has the s-channel structure mentioned above, a channel is formed in the whole of the semiconductor film 44b. Therefore, as the semiconductor film 44b has a larger thickness, a channel region becomes larger. In other words, the thicker the semiconductor film 44b is, the larger the on-state current of the transistor is. For example, the semiconductor film 44b has a region with a thickness of greater than or equal to 20 nm, preferably greater than or equal to 40 nm, more preferably greater than or equal to 60 nm, still more preferably greater than or equal to 100 nm. Note that the semiconductor film 44b has a region with a thickness, for example, less than or equal to 300 nm, preferably less than or equal to 200 nm, or further preferably less than or equal to 150 nm because the productivity of the semiconductor device might be decreased.

Moreover, the thickness of the oxide semiconductor film 44c is preferably as small as possible to increase the on-state current of the transistor. The thickness of the semiconductor film 44c is less than 10 nm, preferably less than or equal to 5 nm, or further preferably less than or equal to 3 nm, for example. Meanwhile, the semiconductor film 44c has a function of blocking entry of elements other than oxygen (such as hydrogen and silicon) which are contained in an adjacent insulator into the semiconductor film 44b where a channel is formed. For this reason, the semiconductor film 44c preferably has a certain degree of thickness. The thickness of the semiconductor film 44c is greater than or equal to 0.3 nm, preferably greater than or equal to 1 nm, or further preferably greater than or equal to 2 nm, for example. The semiconductor film 44c preferably has an oxygen blocking property to suppress outward diffusion of oxygen released from the insulating film 43 and the like.

To improve reliability, preferably, the thickness of the semiconductor film 44a is large and the thickness of the semiconductor film 44c is small. For example, the semiconductor film 44a has a region with a thickness of greater than or equal to 10 nm, preferably greater than or equal to 20 nm, more preferably greater than or equal to 40 nm, still more preferably greater than or equal to 60 nm. When the thickness of the semiconductor film 44a is made large, a distance from an interface between the adjacent insulating film and the semiconductor film 44a to the semiconductor film 44b in which a channel is formed can be large. Since the productivity of the semiconductor device might be decreased, the semiconductor film 44a has a region with a thickness of, for example, less than or equal to 200 nm, preferably less than or equal to 120 nm, more preferably less than or equal to 80 nm.

When the oxide semiconductor film contains a large amount of hydrogen, the hydrogen and an oxide semiconductor are bonded to each other, so that part of the hydrogen serves as a donor and causes generation of an electron which is a carrier. As a result, the threshold voltage of the transistor shifts in the negative direction. Therefore, it is preferable that, after formation of the oxide semiconductor film, dehydration treatment (dehydrogenation treatment) be performed to remove hydrogen or moisture from the oxide semiconductor film so that the oxide semiconductor film is highly purified to contain impurities as little as possible.

Oxygen vacancies in the oxide semiconductor film could be increased by the dehydration treatment (dehydrogenation treatment) on the oxide semiconductor film in some cases. Accordingly, it is preferable that oxygen be added to the oxide semiconductor film to fill oxygen vacancies increased by the dehydration treatment (dehydrogenation treatment). In this specification and the like, supplying oxygen to an oxide semiconductor film is expressed as oxygen adding treatment in some cases. Treatment for making the oxygen content of the oxide semiconductor film be in excess of that in the stoichiometric composition may be expressed as treatment for making an oxygen-excess state.

In this manner, hydrogen or moisture is removed from the oxide semiconductor film by the dehydration treatment (dehydrogenation treatment) and oxygen vacancies therein are filled by the oxygen adding treatment, whereby the oxide semiconductor film can be turned into an i-type (intrinsic) oxide semiconductor film or a substantially i-type (intrinsic) oxide semiconductor film which is extremely close to an i-type oxide semiconductor film. Note that the substantially intrinsic oxide semiconductor film means that the oxide semiconductor film includes extremely few (close to zero) carriers derived from a donor, and the carrier density thereof is lower than $8\times10^{11}/cm^3$, preferably lower than $1\times10^{11}/cm^3$, or further preferably lower than $1\times10^{10}/cm^3$, and greater than or equal to $1\times10^{-9}/cm^3$.

A transistor including an i-type or substantially i-type oxide semiconductor film can have extremely favorable off-state current characteristics. For example, the drain current at the time when the transistor including an oxide semiconductor film is in an off-state can be less than or equal to $1\times10^{-18}$ A, preferably less than or equal to $1\times10^{-21}$ A, further preferably less than or equal to $1\times10^{-24}$ A at room temperature (about 25° C.); or less than or equal to $1\times10^{-15}$ A, preferably less than or equal to $1\times10^{-18}$ A, further preferably less than or equal to $1\times10^{-21}$ A at 85° C. Note that an off state of an n-channel transistor refers to a state where the gate voltage is sufficiently lower than the threshold voltage. Specifically, the transistor is in an off state when the gate voltage is lower than the threshold voltage by 1V or more, 2V or more, or 3V or more.

A structure of an oxide semiconductor is described below.

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

It is known that an amorphous structure is generally defined as being metastable and unfixed, and being isotropic and having no non-uniform structure. In other words, an amorphous structure has a flexible bond angle and a short-range order but does not have a long-range order.

This means that an inherently stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. Note that an a-like OS has a periodic structure in a microscopic region, but at the same time has a void and has an unstable structure. For this reason, an a-like OS has physical properties similar to those of an amorphous oxide semiconductor.
<CAAC-OS>

First, a CAAC-OS is described.

A CAAC-OS is one of oxide semiconductors having a plurality of c-axis aligned crystal parts (also referred to as pellets).

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed. Thus, in the CAAC-OS, a reduction in electron mobility due to the grain boundary is less likely to occur.

Figure 43A:
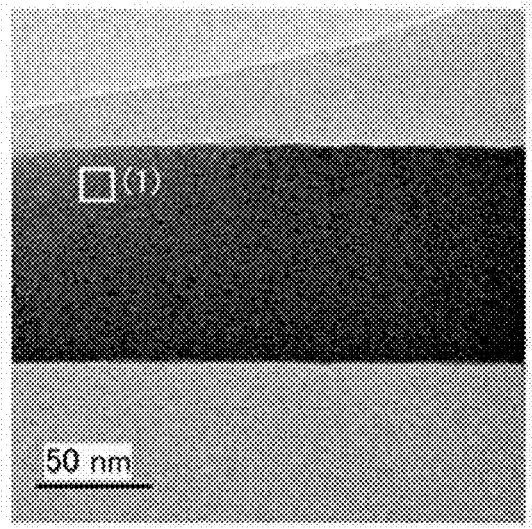
FIGS. 43A to 43D are Cs-corrected high-resolution TEM images of a cross section of a CAAC-OS and a cross-sectional schematic view of a CAAC-OS.

The CAAC-OS observed with a TEM is described below. FIG. 43A shows an example of a high-resolution TEM image of a cross section of the CAAC-OS film which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. Note that the Cs-corrected high-resolution TEM image can be obtained with, for example, an atomic resolution analytical electron microscope JEM-ARM200F manufactured by JEOL Ltd.

Figure 43B:
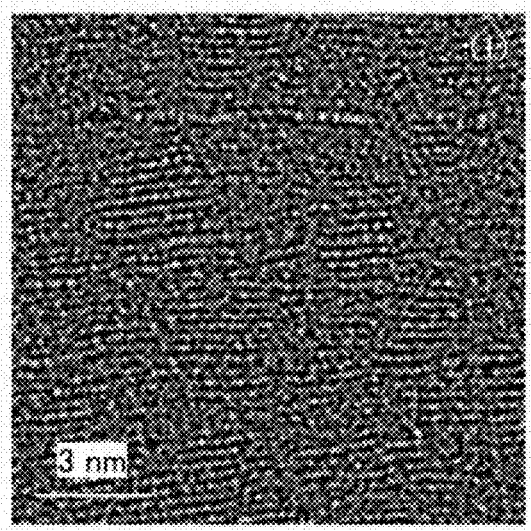

FIG. 43B is an enlarged Cs-corrected high-resolution TEM image of a region (1) in FIG. 43A. FIG. 43B shows that metal atoms are arranged in a layered manner in a pellet. Each metal atom layer has a configuration reflecting unevenness of a surface over which the CAAC-OS is formed (hereinafter, the surface is referred to as a formation surface) or a top surface of the CAAC-OS, and is arranged parallel to the formation surface or the top surface of the CAAC-OS.

Figure 43C:
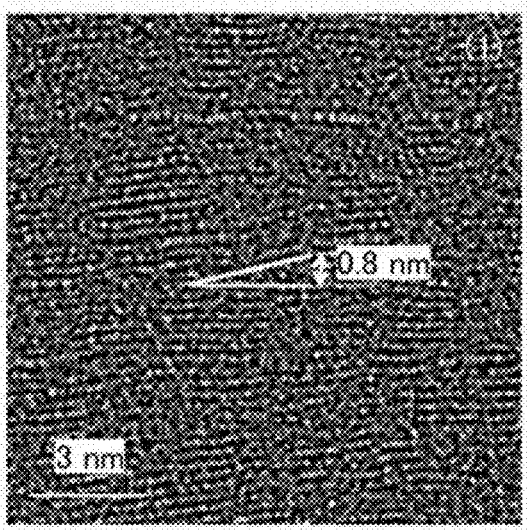

As shown in FIG. 43B, the CAAC-OS has a characteristic atomic arrangement. The characteristic atomic arrangement is denoted by an auxiliary line in FIG. 43C. FIGS. 43B and 43C prove that the size of a pellet is approximately 1 nm to 3 nm, and the size of a space caused by tilt of the pellets is approximately 0.8 nm. Therefore, the pellet can also be referred to as a nanocrystal (nc). Furthermore, the CAAC-OS can also be referred to as an oxide semiconductor including c-axis aligned nanocrystals (CANC).

Figure 43D:
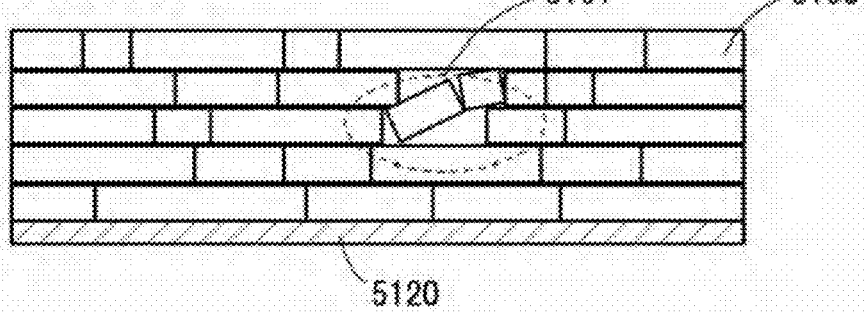

Here, according to the Cs-corrected high-resolution TEM images, the schematic arrangement of pellets 5100 of a CAAC-OS over a substrate 5120 is illustrated by such a structure in which bricks or blocks are stacked (see FIG. 43D). The part in which the pellets are tilted as observed in 43D corresponds to a region 5161 shown in FIG. 43D.

FIG. 44A shows a Cs-corrected high-resolution TEM image of a plane of the CAAC-OS observed from a direction substantially perpendicular to the sample surface. FIGS. 44B, 44C, and 44D are enlarged Cs-corrected high-resolution TEM images of regions (1), (2), and (3) in FIG. 44A, respectively. FIGS. 44B, 44C, and 44D indicate that metal atoms are arranged in a triangular, quadrangular, or hexagonal configuration in a pellet. However, there is no regularity of arrangement of metal atoms between different pellets.

Figure 45A:
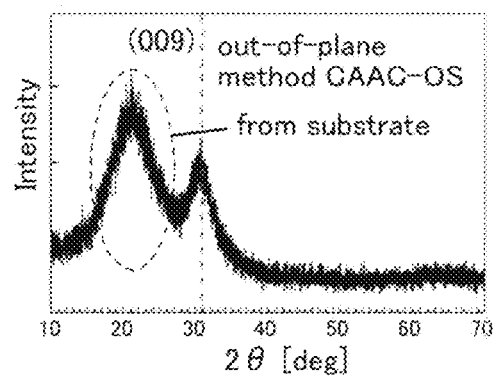
FIGS. 45A to 45C are graphs showing structural analyses of a CAAC-OS and a single crystal oxide semiconductor by XRD.

Next, a CAAC-OS analyzed by X-ray diffraction (XRD) is described. For example, when the structure of a CAAC-OS including an $InGaZnO_4$ crystal is analyzed by an out-of-plane method, a peak appears at a diffraction angle ($2\theta$) of around 31° as shown in FIG. 45A. This peak is derived from the (009) plane of the $InGaZnO_4$ crystal, which indicates that crystals in the CAAC-OS have c-axis alignment, and that the c-axes are aligned in a direction substantially perpendicular to the formation surface or the top surface of the CAAC-OS.

Note that in structural analysis of the CAAC-OS by an out-of-plane method, another peak may appear when $2\theta$ is around 36°, in addition to the peak at $2\theta$ of around 31°. The peak of $2\theta$ at around 36° indicates that a crystal having no c-axis alignment is included in part of the CAAC-OS. It is preferable that in the CAAC-OS analyzed by an out-of-plane method, a peak appear when $2\theta$ is around 31° and that a peak not appear when $2\theta$ is around 36°.

Figure 45B:
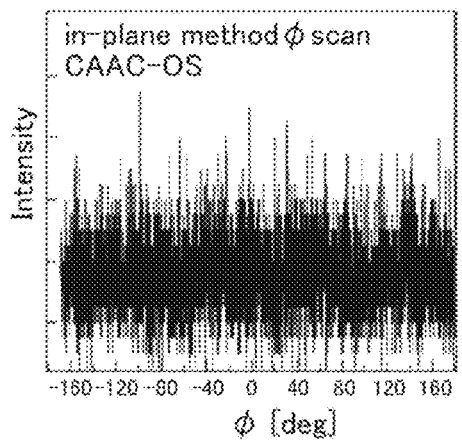
Figure 45C:
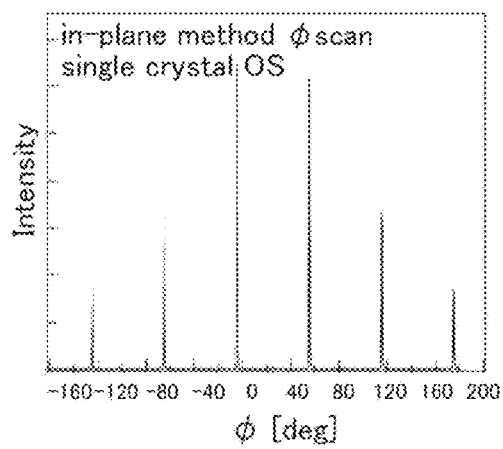

On the other hand, in structural analysis of the CAAC-OS by an in-plane method in which an X-ray is incident on a sample in a direction substantially perpendicular to the c-axis, a peak appears when $2\theta$ is around 56°. This peak is derived from the (110) plane of the $InGaZnO_4$ crystal. In the case of the CAAC-OS, when analysis ($\phi$ scan) is performed with $2\theta$ fixed at around 56° and with the sample rotated using a normal vector of the sample surface as an axis ($\phi$ axis), as shown in FIG. 45B, a peak is not clearly observed. In contrast, in the case of a single crystal oxide semiconductor of $InGaZnO_4$, when $\phi$ scan is performed with $2\theta$ fixed at around 56°, as shown in FIG. 45C, six peaks which are derived from crystal planes equivalent to the (110) plane are observed. Accordingly, the structural analysis using XRD shows that the directions of a-axes and b-axes are irregularly oriented in the CAAC-OS.

Figure 46A:
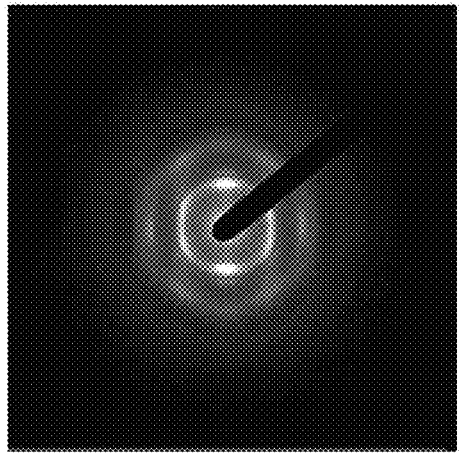
FIGS. 46A and 46B show electron diffraction patterns of a CAAC-OS.
Figure 46B:
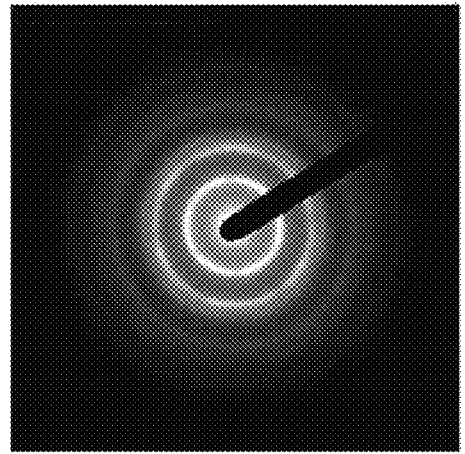

Next, a CAAC-OS analyzed by electron diffraction is described. For example, when an electron beam with a probe diameter of 300 nm is incident on a CAAC-OS including an $InGaZnO_4$ crystal in a direction parallel to the sample surface, a diffraction pattern (also referred to as a selected-area transmission electron diffraction pattern) shown in FIG. 46A can be obtained. In this diffraction pattern, spots derived from the (009) plane of an $InGaZnO_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 46B shows a diffraction pattern obtained in such a manner that an electron beam with a probe diameter of 300 nm is incident on the same sample in a direction perpendicular to the sample surface. As shown in FIG. 46B, a ring-like diffraction pattern is observed. Thus, the electron diffraction also indicates that the a-axes and b-axes of the pellets included in the CAAC-OS do not have regular alignment. The first ring in FIG. 46B is considered to be derived from the (010) plane, the (100) plane, and the like of the InGaZnO$_4$ crystal. The second ring in FIG. 46B is considered to be derived from the (110) plane and the like.

As described above, the CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities contained in the oxide semiconductor might serve as carrier traps or carrier generation sources, for example. Furthermore, oxygen vacancies in the oxide semiconductor serve as carrier traps or serve as carrier generation sources when hydrogen is captured therein.

The CAAC-OS having small amounts of impurities and oxygen vacancies is an oxide semiconductor with low carrier density (specifically, lower than $8 \times 10^{11}/cm^3$, preferably lower than $1 \times 10^{11}/cm^3$, further preferably lower than $1 \times 10^{10}/cm^3$, and is higher than or equal to $1 \times 10^{-9}/cm^3$). Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

<nc-OS>

Next, an nc-OS is described.

An nc-OS has a region in which a crystal part is observed and a region in which a crystal part is not clearly observed in a high-resolution TEM image. In most cases, the size of a crystal part included in the nc-OS is greater than or equal to 1 nm and less than or equal to 10 nm, or greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not observed.

Accordingly, the nc-OS cannot be distinguished from an a-like OS or an amorphous oxide semiconductor, depending on an analysis method. For example, when the nc-OS is analyzed by an out-of-plane method using an X-ray beam having a diameter larger than the size of a pellet, a peak which shows a crystal plane does not appear. Furthermore, a diffraction pattern like a halo pattern is observed when the nc-OS is subjected to electron diffraction using an electron beam with a probe diameter (e.g., 50 nm or larger) that is larger than the size of a pellet. Meanwhile, spots appear in a nanobeam electron diffraction pattern of the nc-OS when an electron beam having a probe diameter close to or smaller than the size of a pellet is applied. Moreover, in a nanobeam electron diffraction pattern of the nc-OS, regions with high luminance in a circular (ring) pattern are shown in some cases. Also in a nanobeam electron diffraction pattern of the nc-OS layer, a plurality of spots is shown in a ring-like region in some cases.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

Thus, the nc-OS is an oxide semiconductor that has high regularity as compared with an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<a-like OS>

An a-like OS has a structure intermediate between those of the nc-OS and the amorphous oxide semiconductor.

In a high-resolution TEM image of the a-like OS, a void may be observed. Furthermore, in the high-resolution TEM image, there are a region where a crystal part is clearly observed and a region where a crystal part is not observed.

The a-like OS has an unstable structure because it includes a void. To verify that an a-like OS has an unstable structure as compared with a CAAC-OS and an nc-OS, a change in structure caused by electron irradiation is described below.

An a-like OS (sample A), an nc-OS (sample B), and a CAAC-OS (sample C) are prepared as samples subjected to electron irradiation. Each of the samples is an In—Ga—Zn oxide.

First, a high-resolution cross-sectional TEM image of each sample is obtained. The high-resolution cross-sectional TEM images show that all the samples have crystal parts.

Note that which part is regarded as a crystal part is determined as follows. It is known that a unit cell of the InGaZnO$_4$ crystal has a structure in which nine layers including three In—O layers and six Ga—Zn—O layers are stacked in the c-axis direction. Accordingly, the spacing between these adjacent layers is equivalent to the lattice spacing on the (009) plane (also referred to as a d value). The value is calculated to be 0.29 nm from crystal structure analysis. Accordingly, a portion where the lattice spacing between lattice fringes is greater than or equal to 0.28 nm and less than or equal to 0.30 nm is regarded as a crystal part of InGaZnO$_4$. Each of lattice fringes corresponds to the a-b plane of the InGaZnO$_4$ crystal.

Figure 47:
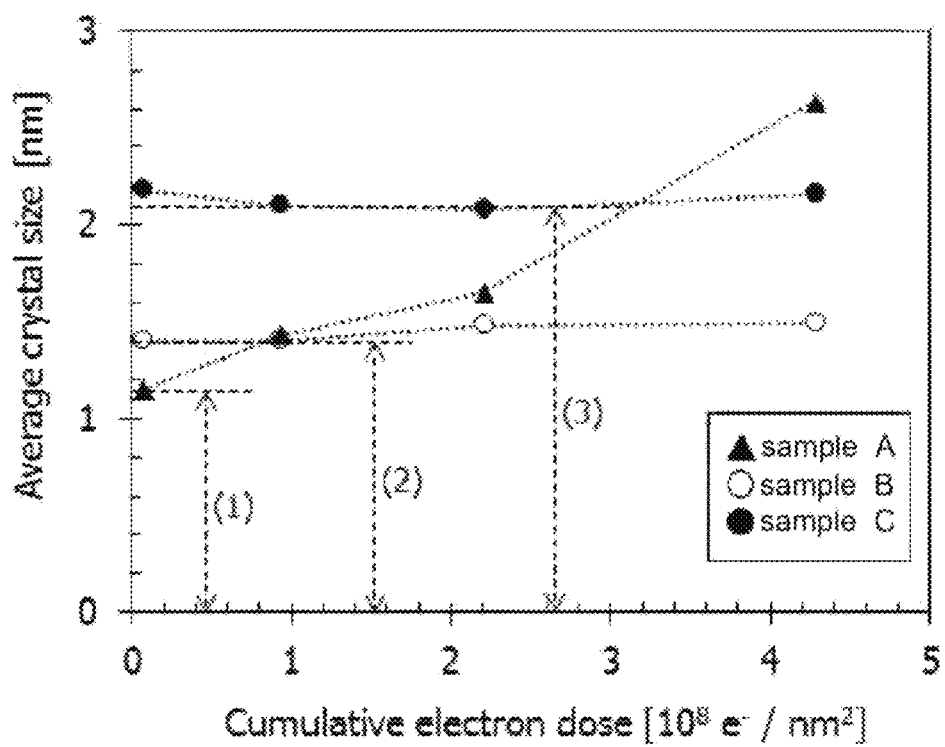
FIG. 47 is a graph showing a change in crystal part of an In—Ga—Zn oxide induced by electron irradiation.

FIG. 47 shows the change in the average size of crystal parts (at 22 points to 45 points) in each sample. Note that the crystal part size corresponds to the length of a lattice fringe. FIG. 47 indicates that the crystal part size in the a-like OS increases with an increase in the cumulative electron dose. Specifically, as shown by (1) in FIG. 47, a crystal part of approximately 1.2 nm at the start of TEM observation (the crystal part is also referred to as an initial nucleus) grows to a size of approximately 2.6 nm at a cumulative electron dose of $4.2\times10^8$ e$^-$/nm$^2$. In contrast, the crystal part size in the nc-OS and the CAAC-OS shows little change from the start of electron irradiation to a cumulative electron dose of $4.2\times10^8$ e$^-$/nm$^2$. Specifically, as shown by (2) and (3) in FIG. 47, the average crystal sizes in an nc-OS and a CAAC-OS are approximately 1.4 nm and approximately 2.1 nm, respectively, regardless of the cumulative electron dose.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it includes a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor layer having a density of lower than 78% of the density of the single crystal oxide semiconductor layer.

For example, in the case of an oxide semiconductor having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Note that single crystals with the same composition do not exist in some cases. In that case, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more of an amorphous oxide semiconductor, an a-like OS, an nc-OS, and a CAAC-OS, for example.

<Formation Method of CAAC-OS and nc-OS>

An example of a method for forming a CAAC-OS film will be described below.

Figure 48A:
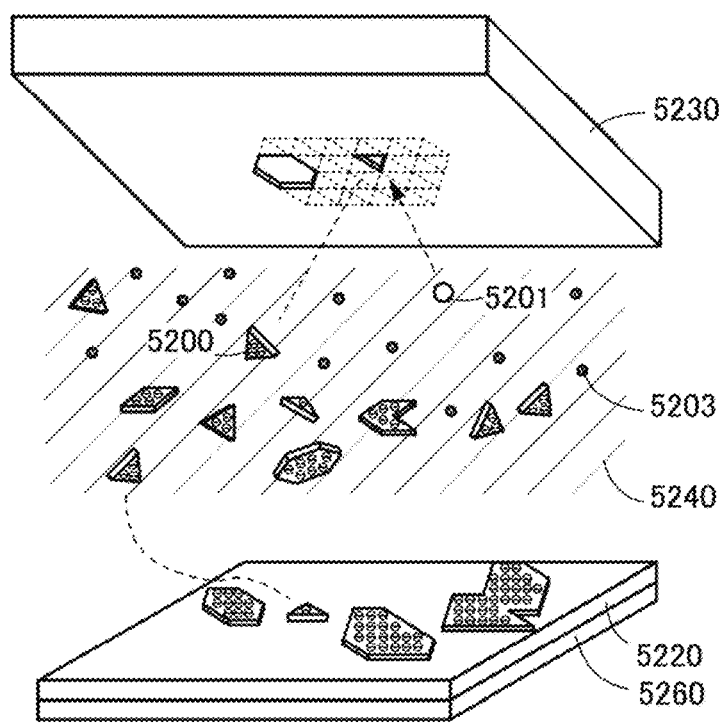
FIGS. 48A to 48D are figures illustrating a deposition mechanism of a CAAC-OS.

FIG. 48A is a schematic view of the inside of a film formation chamber. The CAAC-OS film can be formed by a sputtering method.

As shown in FIG. 48A, a substrate 5220 and a target 5230 are arranged to face each other. Plasma 5240 is generated between the substrate 5220 and the target 5230. A heating mechanism 5260 is under the substrate 5220. The target 5230 is attached to a backing plate (not illustrated in the drawing). A plurality of magnets is arranged to face the target 5230 with the backing plate positioned therebetween. A sputtering method in which the disposition speed is increased by utilizing a magnetic field of the magnets is referred to as a magnetron sputtering method.

The distance d between the substrate 5220 and the target 5230 (also referred to as a target-substrate distance (T-S distance)) is greater than or equal to 0.01 m and less than or equal to 1 m, preferably greater than or equal to 0.02 m and less than or equal to 0.5 m. The film formation chamber is mostly filled with a deposition gas (e.g., an oxygen gas, an argon gas, or a mixed gas containing oxygen at 5 vol % or higher) and the pressure in the film formation chamber is controlled to be higher than or equal to 0.01 Pa and lower than or equal to 100 Pa, preferably higher than or equal to 0.1 Pa and lower than or equal to 10 Pa. Here, discharge starts by application of a voltage at a certain value or higher to the target 5230, and the plasma 5240 is observed. The magnetic field forms a high-density plasma region in the vicinity of the target 5230. In the high-density plasma region, the deposition gas is ionized, so that an ion 5201 is generated. Examples of the ion 5201 include an oxygen cation (O$^+$) and an argon cation (Ar$^+$).

Figure 49:
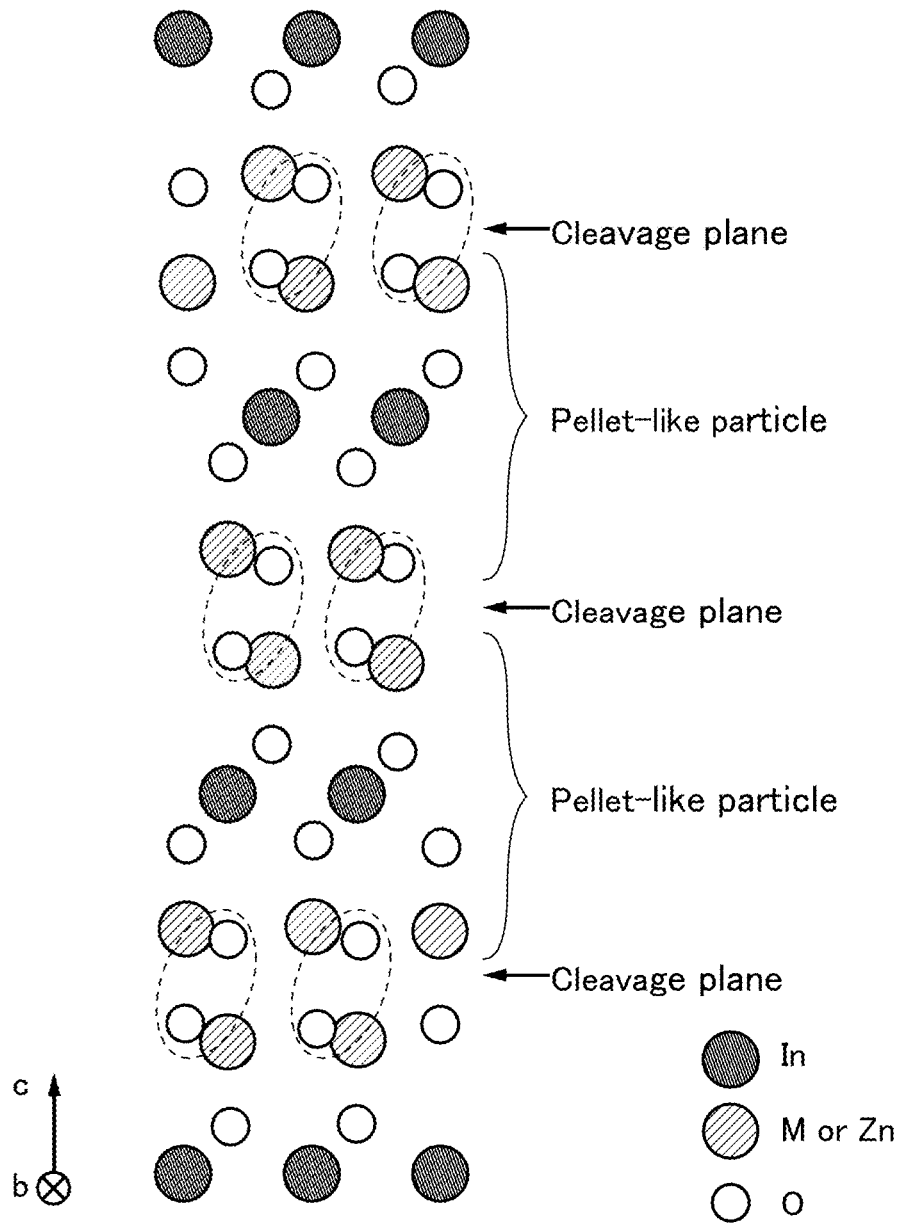
FIG. 49 is a figure illustrating a crystal structure of InMZnO$_4$.

Here, the target 5230 has a polycrystalline structure which includes a plurality of crystal grains and in which a cleavage plane exists in any of the crystal grains. As an example, a crystal structure of InMZnO$_4$ (the element M is Ga or Sn, for example) included in the target 5230 is illustrated in FIG. 49. Note that FIG. 49 illustrates the crystal structure of InMZnO$_4$ observed from a direction parallel to a b-axis. In the crystal of InMZnO$_4$, oxygen atoms are negatively charged, whereby repulsive force is generated between the two adjacent M-Zn—O layers. Thus, the InMZnO$_4$ crystal has a cleavage plane between the two adjacent M-Zn—O layers.

The ion 5201 generated in the high-density plasma region is accelerated toward the target 5230 side by an electric field, and then collides with the target 5230. At this time, a pellet 5200 which is a flat-plate-like or pellet-like sputtered particles is separated from the cleavage plane (FIG. 48A).

Figure 48B:
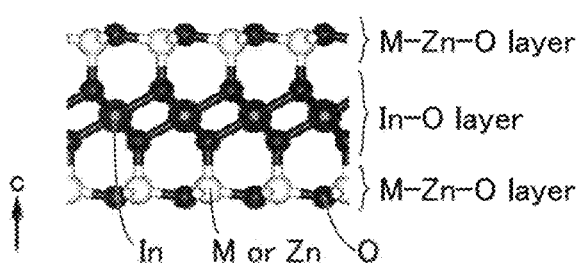
Figure 48C:
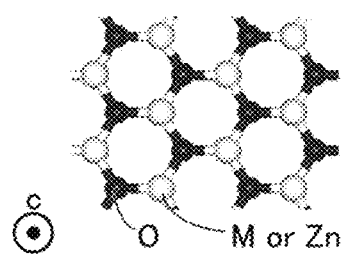

The pellet 5200 is between the two cleavage planes shown in FIG. 49. Thus, when the pellet 5200 is observed, the cross-section thereof is as shown in FIG. 48B, and the top surface thereof is as shown in FIG. 48C. Note that the structure of the pellet 5200 may be distorted by an impact of collision of the ion 5201. Note that along with the separation of the pellet 5200, a particle 5203 is also sputtered from the target 5230. The particle 5203 has an atom or an aggregate of several atoms. Therefore, the particle 5203 can be referred to as an atomic particle.

The pellet 5200 is a flat-plate-like (pellet-like) sputtered particle having a triangle plane, e.g., regular triangle plane. Alternatively, the pellet 5200 is a flat-plate-like (pellet-like) sputtered particle having a hexagon plane, e.g., regular hexagon plane. However, the shape of a flat plane of the pellet 5200 is not limited to a triangle or a hexagon. For example, the flat plane may have a shape formed by combining two or more triangles. For example, a quadrangle (e.g., rhombus) may be formed by combining two triangles (e.g., regular triangles).

The thickness of the pellet 5200 is determined depending on the kind of the deposition gas and the like. For example, the thickness of the pellet 5200 is greater than or equal to 0.4 nm and less than or equal to 1 nm, preferably greater than or equal to 0.6 nm and less than or equal to 0.8 nm. In addition, for example, the width of the pellet 5200 is greater than or equal to 1 nm and less than or equal to 3 nm, preferably greater than or equal to 1.2 nm and less than or equal to 2.5 nm. For example, the ion 5201 collides with the target 5230 including the In-M-Zn oxide. Then, the pellet 5200 including three layers of an M-Zn—O layer, an In—O layer, and an M-Zn—O layer is separated. Note that the particle 5203 is also sputtered from the target 5230 along with the separation of the pellet 5200.

The pellet 5200 may receive a charge when passing through the plasma 5240, so that surfaces thereof are negatively or positively charged. For example, the pellet 5200 receives a negative charge from $O^{2-}$ in the plasma 5240. As a result, oxygen atoms on the surfaces of the pellet 5200 may be negatively charged. In addition, when passing through the plasma 5240, the pellet 5200 is sometimes combined with indium, the element M, zinc, oxygen, or the like in the plasma 5240 to grow up.

The pellet 5200 and the particle 5203 that have passed through the plasma 5240 reach a surface of the substrate 5220. Note that part of the particles 5203 is discharged to the outside by a vacuum pump or the like because the particle 5203 is small in mass.

Next, deposition of the pellet 5200 and the particle 5203 on the surface of the substrate 5220 is described with reference to FIGS. 50A to 50E.

Figure 50A:
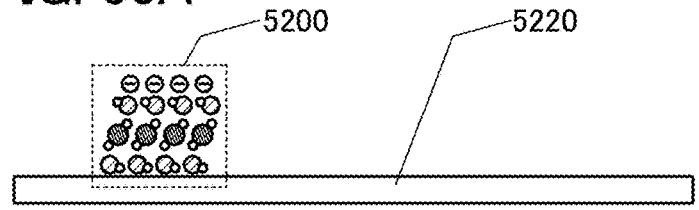
FIGS. 50A to 50E are figures illustrating a deposition mechanism of a CAAC-OS.

First, a first of the pellets 5200 is deposited over the substrate 5220. Since the pellet 5200 has a flat-plate-like shape, it is deposited so that the flat plane faces to the surface of the substrate 5220 (FIG. 50A). Here, a charge on a surface of the pellet 5200 on the substrate 5220 side is lost through the substrate 5220.

Figure 50B:
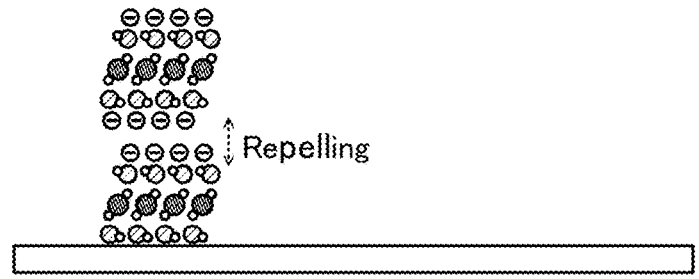

Next, a second of the pellets 5200 reaches the substrate 5220. Here, since another surface of the first of the pellets 5200 and surfaces of the second of the pellets 5200 are charged, they repel each other (FIG. 50B).

Figure 50C:
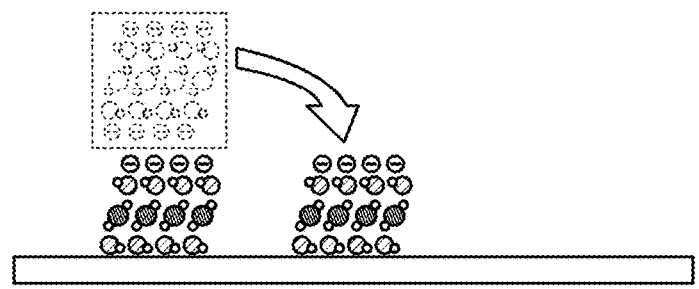

As a result, the second of the pellets 5200 avoids being deposited over the first of the pellets 5200, and is deposited over the surface of the substrate 5220 so as to be a little distance away from the first of the pellets 5200 (FIG. 50C). With repetition of this, millions of the pellets 5200 are deposited over the surface of the substrate 5220 to have a thickness of one layer. A region where any pellet 5200 is not deposited is generated between adjacent pellets 5200.

Figure 50D:
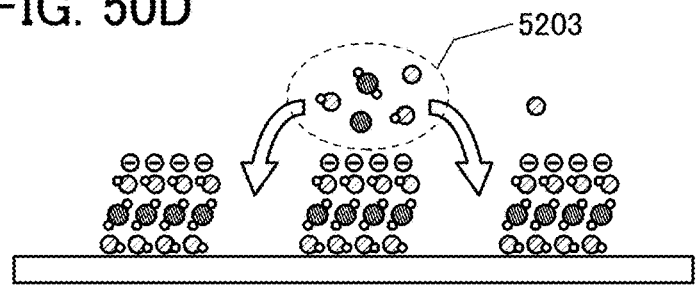

Next, the particle 5203 reaches the surface of the substrate 5220 (FIG. 50D).

The particle 5203 cannot be deposited over an active region such as the surface of the pellet 5200. Therefore, the particle 5203 is deposited so as to fill a region where the pellets 5200 are not deposited. The particles 5203 grow in the horizontal (lateral) direction between the pellets 5200, thereby connecting the pellets 5200. In this way, the particles 5203 are deposited until they fill regions where the pellets 5200 are not deposited. This mechanism is similar to a deposition mechanism of the ALD method.

Figure 50E:
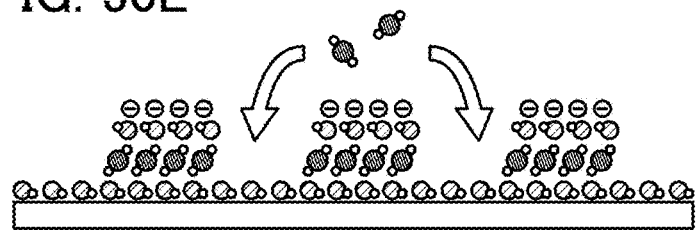

Note that there can be several mechanisms for the lateral growth of the particles 5203 between the pellets 5200. For example, as shown in FIG. 50E, the pellets 5200 can be connected from side surfaces of the first M-Zn—O layers. In this case, after the first M-Zn—O layers make connection, the In—O layers and the second M-Zn—O layers are connected in this order (the first mechanism).

Figure 51A:
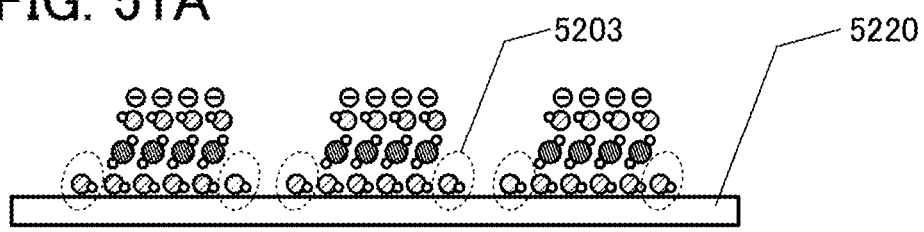
FIGS. 51A to 51C are figures illustrating a deposition mechanism of a CAAC-OS.
Figure 51B:
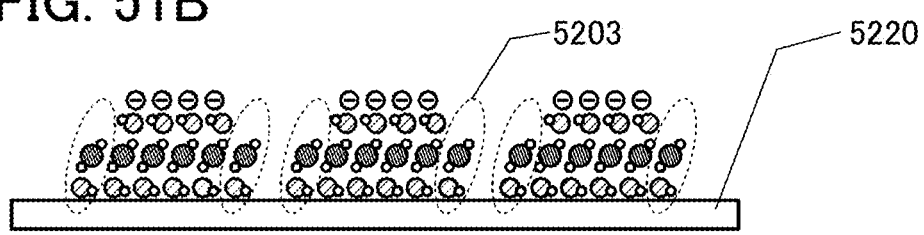

Alternatively, as shown in FIG. 51A, first, the particles 5203 are connected to the sides of the first M-Zn—O layers so that each side of the first M-Zn—O layer has one particle 5203. Then, as shown in FIG. 51B, the particle 5203 is connected to each side of the In—O layers. After that, the particle 5203 is connected to each side of the second M-Zn—O layers (the second mechanism).

Figure 51C:
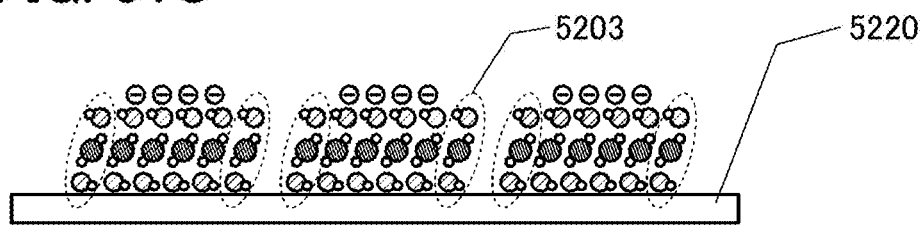

Note that the connection can also be made by the simultaneous occurrence of the deposition in FIGS. 51A, 51B, and 51C (the third mechanism).

As shown in the above, the above three mechanisms are considered as the mechanisms of the lateral growth of the particles 5203 between the pellets 5200. However, the particles 5203 may grow up laterally between the pellets 5200 by other mechanisms.

Therefore, even when the orientations of a plurality of pellets 5200 are different from each other, generation of crystal boundaries can be suppressed since the particles 5203 laterally grow to fill gaps between the plurality of pellets 5200. In addition, as the particles 5203 make smooth connection between the plurality of pellets 5200, a crystal structure different from a single crystal and a polycrystal is formed. In other words, a crystal structure including distortion between minute crystal regions (pellets 5200) is formed. The regions filling the gaps between the crystal regions are distorted crystal regions, and thus, it will be not appropriate to say that the regions have an amorphous structure.

Figure 48D:
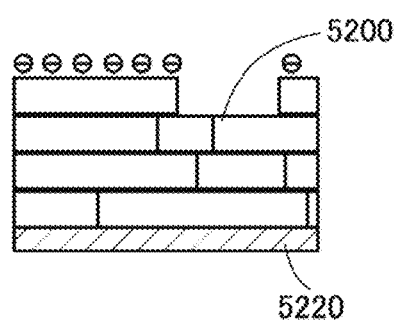

When the particles 5203 completely fill the regions between the pellets 5200, a first layer with a thickness almost the same as that of the pellet 5200 is formed. Then, a new first of the pellets 5200 is deposited over the first layer, and a second layer is formed. With repetition of this cycle, the stacked-layer thin film structure is formed (FIG. 48D).

A deposition way of the pellets 5200 changes depending on the surface temperature of the substrate 5220 or the like. For example, if the surface temperature of the substrate 5220 is high, migration of the pellets 5200 occurs over the substrate 5220. As a result, a proportion of the pellets 5200 that are directly connected with each other without the particles 5203 increases, whereby a CAAC-OS with high orientation is made. The surface temperature of the substrate 5220 for formation of the CAAC-OS is higher than or equal to 100° C. and less than 500° C., preferably higher than or equal to 140° C. and less than 450° C., or further preferably higher than or equal to 170° C. and less than 400° C. Therefore, even when a large-sized substrate of the 8th generation or more is used as the substrate 5220, a warp or the like hardly occur.

Figure 52:
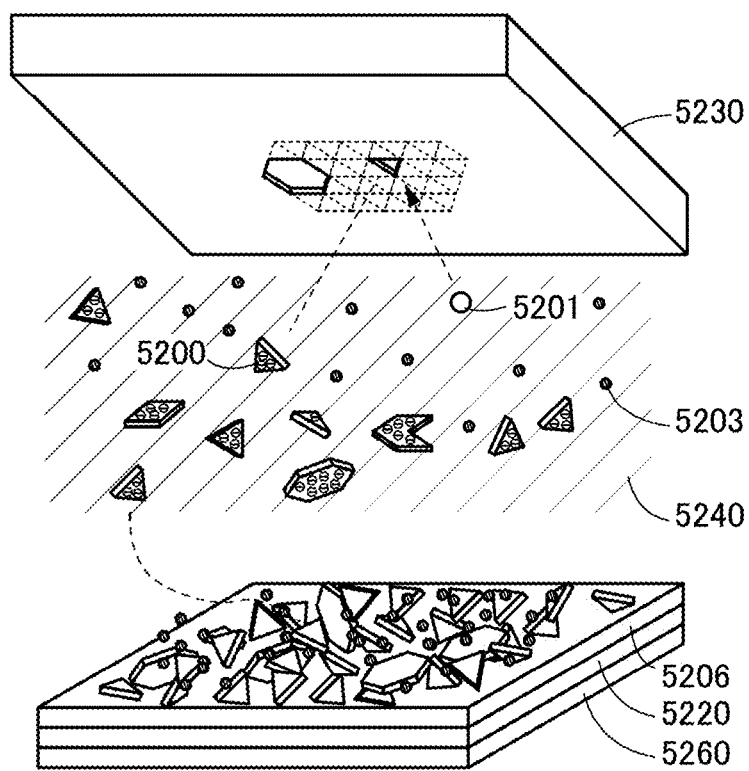
FIG. 52 is a figure illustrating a deposition mechanism of an nc-OS.

On the other hand, if the surface temperature of the substrate 5220 is low, the migration of the pellets 5200 over the substrate 5220 does not easily occur. As a result, the pellets 5200 are stacked to form a nc-OS or the like with low orientation (FIG. 52). In the nc-OS, the pellets 5200 are possibly deposited with certain gaps since the pellets 5200 are negatively charged. Therefore, the nc-OS film has low orientation but some regularity, and thus it has a denser structure than an amorphous oxide semiconductor.

When spaces between the pellets are extremely small in a CAAC-OS, the pellets may form a large pellet. The inside of the large pellet has a single crystal structure. For example, the size of the pellet may be greater than or equal to 10 nm and less than or equal to 200 nm, greater than or equal to 15 nm and less than or equal to 100 nm, or greater than or equal to 20 nm and less than or equal to 50 nm, when seen from the above.

According to such a model, the pellets 5200 are considered to be deposited on the substrate 5220. A CAAC-OS can be deposited even when a formation surface does not have a crystal structure; therefore, a growth mechanism in this case is different from epitaxial growth. In addition, a uniform film of a CAAC-OS or an nc-OS can be formed even over a large-sized glass substrate or the like. For example, even when the surface of the substrate 5220 (formation surface) has an amorphous structure (e.g., such as amorphous silicon oxide), a CAAC-OS can be formed.

In addition, even when the surface of the substrate 5220 (formation surface) has an uneven shape, the pellets 5200 are aligned along the shape.

The structure and method described in this embodiment can be implemented by being combined as appropriate with any of the other structures and methods described in the other embodiments.

EXAMPLE 1

Figure 31:
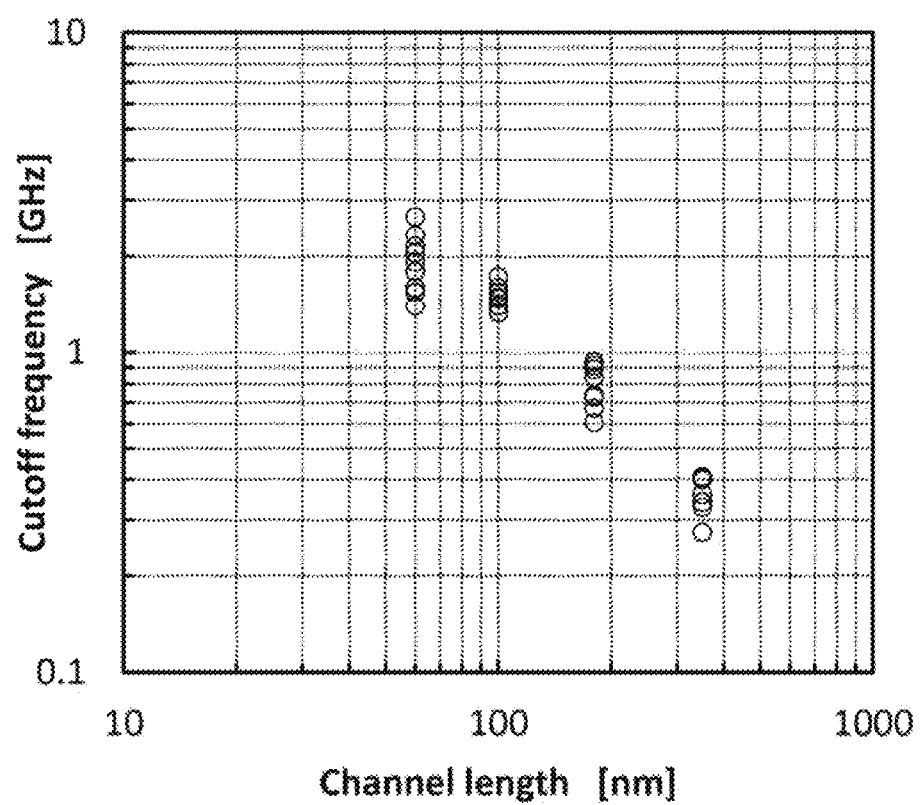
FIG. 31 is a graph showing a measurement result of cutoff frequency of an oxide semiconductor transistor.

In this example, OS transistors were manufactured and the cutoff frequency thereof was measured. Specifically, the cutoff frequency with respect to the channel length of the OS transistor was measured. FIG. 31 shows the measurement results.

The manufactured OS transistor had a device structure similar to the transistor TR1 shown in FIGS. 12A to 12C. The gate insulating film 102 was a silicon oxynitride film with a thickness of 10 nm. The conductive films 104a and 104b were each a tungsten film with a thickness of 10 nm. The gate electrode 103 was a stacked-layer film of a titanium nitride film with a thickness of 10 nm and a tungsten film with a thickness of 10 nm. A back gate electrode (conductive film 105) was not provided. A semiconductor film of the manufactured CAAC-OS FET was a three-layer film of In—Ga—Zn oxide films. The second In—Ga—Zn oxide film was formed using a sputtering apparatus with a substrate heated so as to have crystal parts aligned in a c-axis direction. Note that a silicon wafer is used as the substrate.

The OS transistors with a channel length L of 60 nm, 100 nm, 180 nm, and 350 nm were manufactured. The frequency characteristics of each OS transistor were measured by a network analyzer, and the cutoff frequency of each OS transistor was obtained. The number of measured transistors with respect to one channel length L was 10.

Based on the measurement result in FIG. 31, the cutoff frequency was estimated to be approximately 2 GHz when the channel length L was 60 nm. It was found that the miniaturized OS transistor has excellent frequency characteristics.

EXAMPLE 2

The circuit system of one embodiment of the present invention was manufactured, and various kinds of measurement were performed. In this example, the measurement results are described.

OS transistors corresponding to the transistor TR1 shown in FIGS. 12A to 12C were manufactured, and the electrical characteristics thereof were measured.

The manufactured OS transistor had a channel length L of 60 nm and a channel width W of 60 nm. The back gate electrode was a tungsten film with a thickness of 50 nm. The insulating film over the back gate electrode was a stacked-layer film of a silicon oxynitride film with a thickness of 100 nm, an aluminum oxide film with a thickness of 50 nm, and a silicon oxide film with a thickness of 50 nm. The oxide semiconductor film was a stacked-layer film of an In—Ga—Zn oxide with a thickness of 20 nm (In:Ga:Zn=1:3:4 [atomic %]) and an In—Ga—Zn oxide with a thickness of 15 nm (In:Ga:Zn=1:1:1 [atomic %]), and an In—Ga—Zn oxide with a thickness of 5 nm (In:Ga:Zn=1:3:2 [atomic %]). The source electrode and drain electrode were each a tungsten film with a thickness of 20 nm. The gate insulating film was a silicon oxynitride film with a thickness of 10 nm. In addition, the gate electrode was a stacked-layer film of a titanium nitride film with a thickness of 10 nm and a tungsten film with a thickness of 10 nm.

Figure 32:
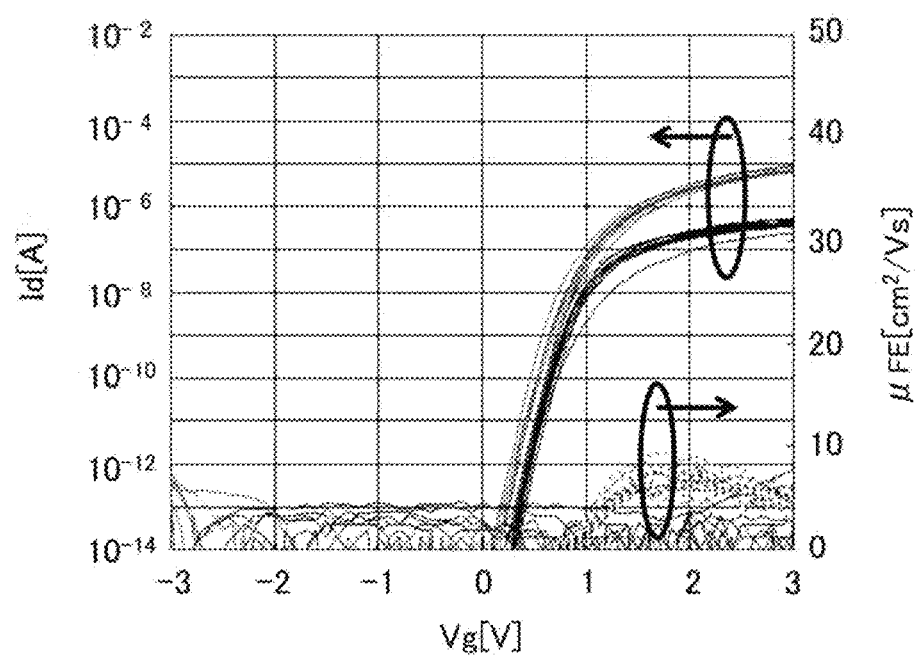
FIG. 32 is a graph showing $V_g$-$I_d$ characteristics of fabricated transistors.

FIG. 32 illustrates $I_d$-$V_g$ (drain current-gate voltage) characteristics of the manufactured OS transistors in this example. In FIG. 32, an ordinate axis represents $I_d$ (drain current) and an abscissa axis represents $V_g$ (gate voltage). The measurement was conducted under a condition where $V_d$ (drain voltage) of the transistor was set to 0.1 V and 1.8 V, and the back gate electrode was not supplied with a potential, that is, in a floating state. FIG. 32 shows data of 13 transistors over the same substrate. In FIG. 32, data in the case of $V_d$=0.1 V and that in the case of $V_d$=1.8 V are shown overlapping with each other. Based on the $I_d$-$V_g$ characteristics in FIG. 32, it was found that the OS transistors in this example had favorable transistor characteristics.

Figure 33A:
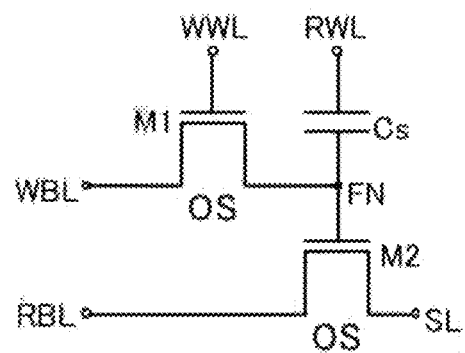
FIG. 33A is a circuit diagram illustrating a fabricated circuit system.

Next, a circuit with an OS transistor having a device structure similar to that measured in FIG. 32 was manufactured, and operations thereof were examined. FIG. 33A illustrates a circuit diagram of the manufactured circuit. The circuit had a structure similar to that of the memory circuit 25 shown in FIG. 2A in Embodiment 1, and included a transistor M1, a transistor M2, and a capacitor Cs.

Figure 33B:
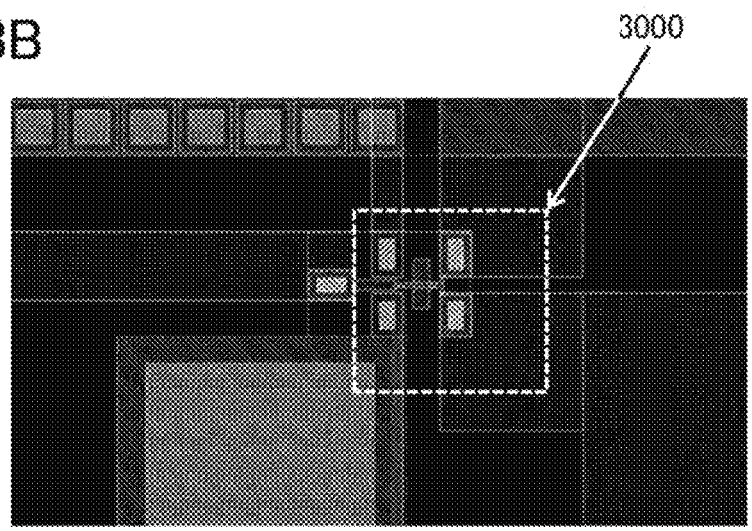
FIG. 33B is a layout view thereof.
Figure 33C:
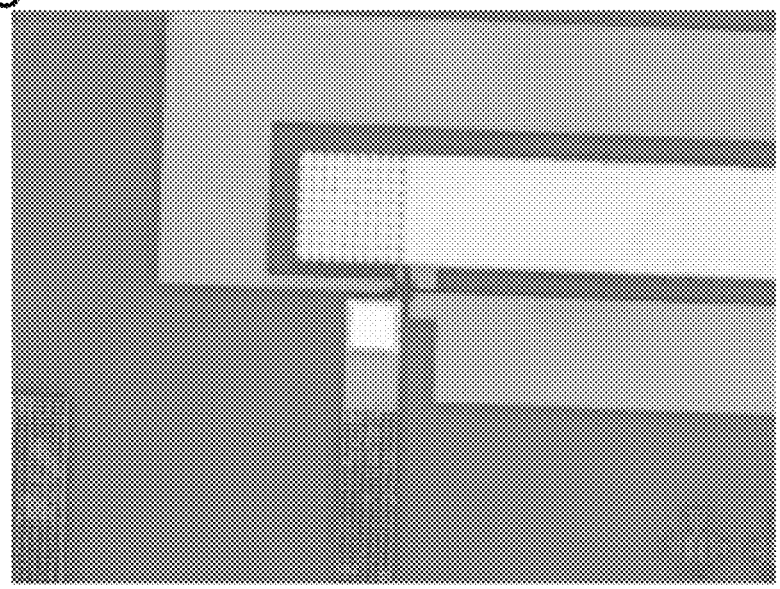
FIG. 33C is an optical micrograph thereof.

FIG. 33B illustrates a layout of the manufactured circuit, and FIG. 33C illustrates an optical micrograph of the manufactured circuit. The optical micrograph in FIG. 33C shows a region corresponding to a region 3000 in FIG. 33B. From the optical micrograph in FIG. 33C, it was confirmed that the desired circuit was manufactured.

In the manufactured circuit, the transistor M1 is an OS transistor with a channel width W of 60 nm and a channel length L of 60 nm, and the transistor M2 is an OS transistor with a channel width W of 60 nm and a channel length L of 60 nm. Two kinds of circuits, one with a capacitance of the capacitor Cs of 1 fF and the other with 3 fF, were manufactured. Here, the former circuit is called a memory circuit Mem1, and the latter one is called a memory circuit Mem2.

Figure 34:
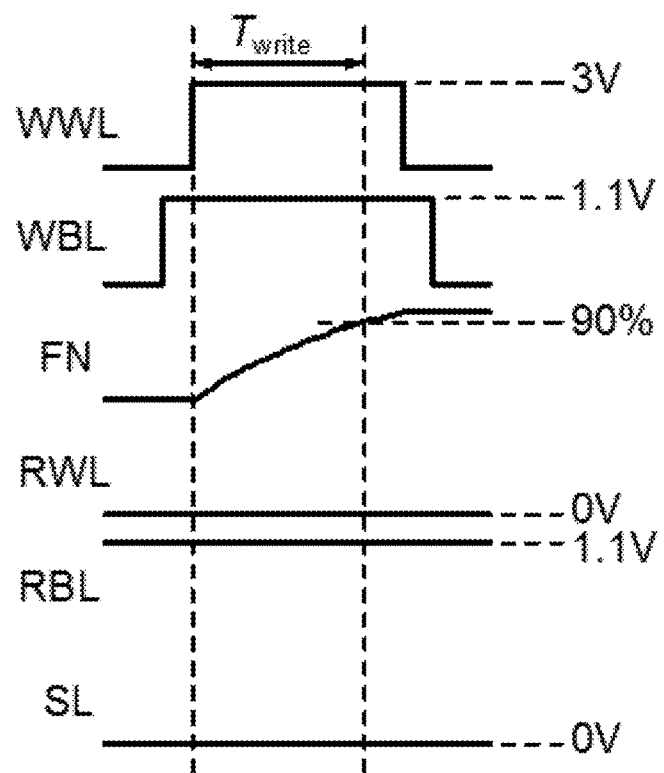
FIG. 34 is a schematic view illustrating operation waveforms during writing operation of a fabricated circuit system.

Writing operations of the manufactured memory circuits Mem1 and Mem2 were measured. FIG. 34 is a timing chart of the writing operation. FIG. 34 illustrates the operation of writing data at high logic level, which corresponds to operation of charging the capacitor Cs (node FN). A voltage at 1.1 V was applied to the wiring WBL as a data signal. In addition, a pulse signal at 3 V was applied to the wiring WWL, whereby the transistor M1 was turned on. The potential of the wiring SL was 0 V. Writing time $T_{write}$ indicates time taken to step up the voltage of the node FN to 90% of that of the wiring WBL. In the operation example in FIG. 34, the time $T_{write}$ is time taken to step up the potential of node FN from 0 V to 1 V (90% of 1.1 V, the potential of the wiring WBL).

Figure 35A:
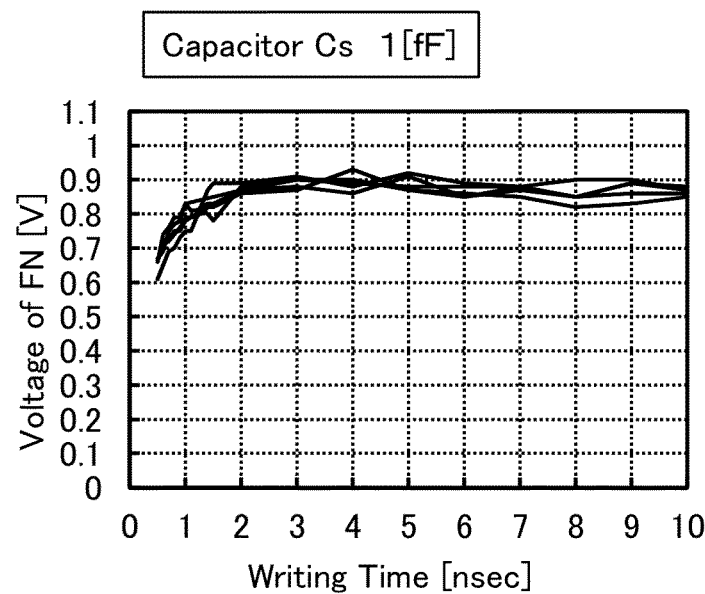
FIGS. 35A and 35B are graphs showing a relationship between voltages of a floating node and writing time in a fabricated circuit system.
Figure 35B:
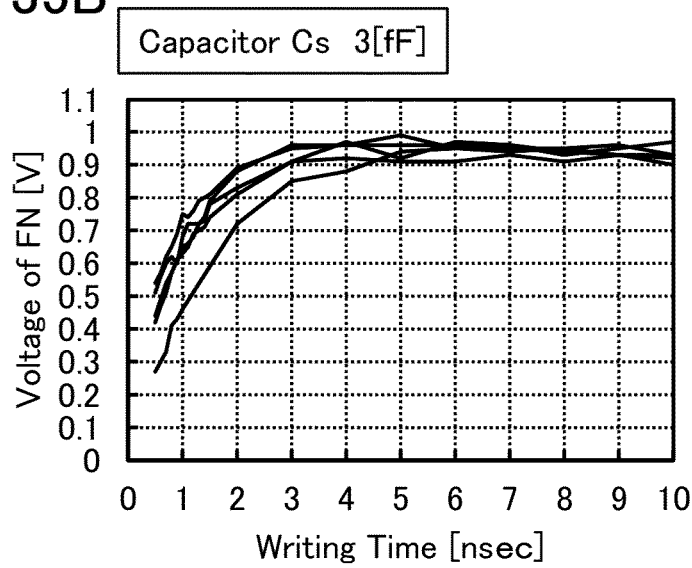

FIGS. 35A and 35B illustrate measurement results of voltages of the node FN with respect to the writing time. FIG. 35A illustrates the measurement result of the memory circuit Mem1, and FIG. 35B illustrates the measurement result of the memory circuit Mem2. The number of measurements was 5 for each case. The voltage of the node FN was obtained by measuring a current flowing in the wiring RBL in the writing operation. The current flowing in the wiring RBL corresponded to a drain current of the transistor M2, and the voltage of the node FN corresponded to a gate voltage of the transistor M2. Therefore, based on the measured current values and the $I_d$-$V_g$ characteristics of the transistor M2 obtained in advance, the potential of the node FN was obtained. Note that the writing time in the abscissa axis of FIGS. 35A and 35B is the time during which 3 V is applied to the wiring WWL.

The measurement result in FIGS. 35A and 35B shows that it is possible to charge the capacitor Cs to 90% in a very short time, that is, data can be written in a very short time. FIG. 35A shows that it is possible to step up the potential of the node FN from 0 V to 1 V in 2 nsec in the case where the capacitance of the capacitor Cs is 1 fF. FIG. 35B shows that it is possible to step up the potential of the node FN from 0 V to 1 V in 5 nsec in the case where the capacitance of the capacitor Cs is 3 fF.

Next, the relationship between the writing time of the memory circuit (Mem1 and Mem2) and the mobility of a writing transistor is described.

Figure 36:
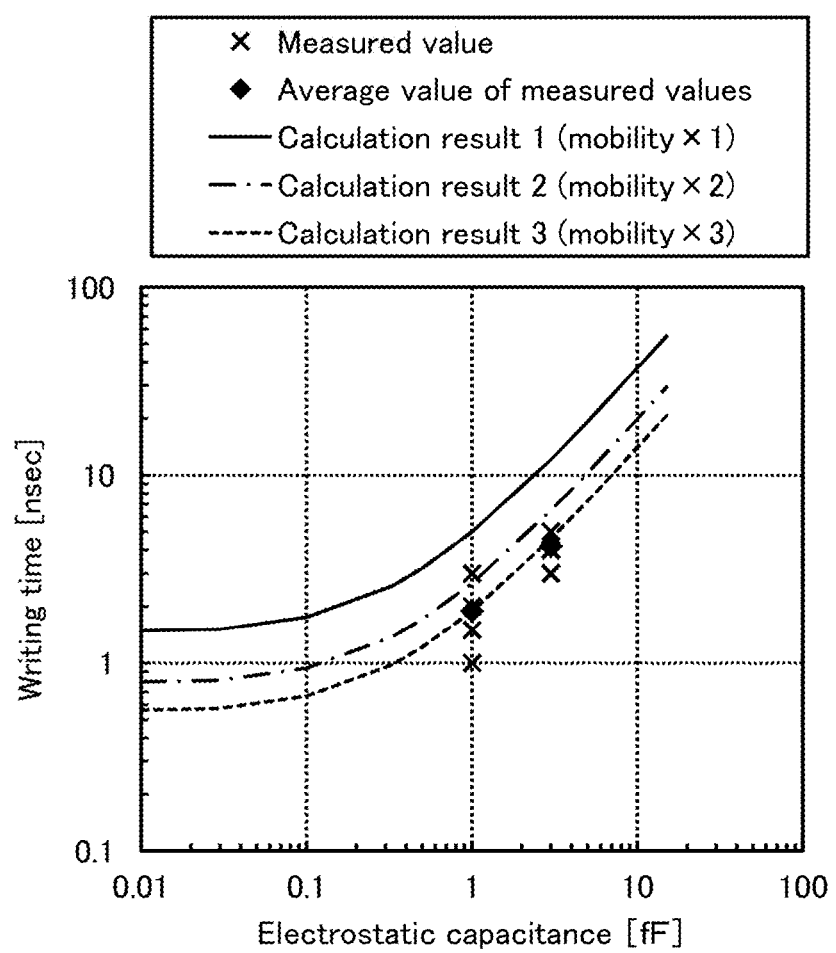
FIG. 36 is a graph showing a relationship between writing time and electrostatic capacitance in a fabricated circuit system.

FIG. 36 illustrates the relationship between the electrostatic capacitance of the capacitor Cs of the memory circuit (Mem1 and Mem2) and the writing time. Measured values in FIG. 36 were obtained from the measurement results in FIGS. 35A and 35B. In addition, FIG. 36 also shows an average value of the writing time of the five memory circuits Mem1 and an average value of the writing time of the five memory circuits Mem2. In addition, the writing time of the memory circuits Mem1 and Mem2 was calculated. Three curve lines in FIG. 36 show calculation results: the solid line shows the calculation result of the writing time in the case where the circuit operated at room temperature (27° C.) and the mobility of the transistor M1 was the original mobility (calculation result 1); the dashed-dotted line shows the calculation result in the case where the mobility of the transistor M1 at room temperature (27° C.) was doubled (calculation result 2); and the dotted line shows the calculation result in the case where the mobility was tripled (calculation result 3).

Based on the calculation results shown in FIG. 36, it was estimated that the writing time was reduced by doubling or tripling the mobility of the transistor M1. Furthermore, the average values of the measurement values of the writing time approximately overlapped with the calculation result in the case of tripling the mobility. When the capacitance of the capacitor Cs is 1 fF, the measured values were less than 5 nsec.

As described above, it was found that the circuit manufactured in this example could be applied to a high-speed and low-power-consumption LSI.

EXAMPLE 3

In this example, an OS transistor where a semiconductor region was formed with a CAAC-OS film (hereinafter referred to as a CAAC-OS FET in some cases) was manufactured, and the DC characteristics and RF characteristics of the CAAC-OS FET were measured. In addition, a memory circuit was manufactured using a CAAC-OS FET, and the operation was examined. The detail is described below.

<Manufacturing of CAAC-OS FET>

The manufactured CAAC-OS FET had a channel length L of 60 nm and a channel width W of 60 nm. The CAAC-OS FET had a device structure similar to that of the transistor manufactured in Example 1, and was manufactured in the similar steps. A base insulating film was formed on a silicon wafer, and the CAAC-OS FET was formed over the base insulating film. The equivalent oxide thickness of the base insulating film, which is obtained by converting into the thickness of a silicon oxide film, was 390 nm. In addition, the equivalent thickness of the gate insulating film was 11 nm. A semiconductor film of the manufactured CAAC-OS FET was a three-layer film of In—Ga—Zn oxide films. The second In—Ga—Zn oxide film was formed using a sputtering apparatus with the silicon wafer heated so as to have crystal parts aligned in a c-axis direction.

The electrical characteristics of the manufactured CAAC-OS FET were measured. The measurement results are shown in FIGS. 37A and 37B, FIG. 38, and FIG. 39. The measurement data in FIGS. 37A and 37B, FIG. 38, and FIG. 39 were those of 5000 CAAC-OS FETs electrically connected to each other in parallel. Each of the CAAC-OS FETs has a channel length L of 60 nm and a channel width W of 60 nm. That is, FIGS. 37A and 37B, FIG. 38, and FIG. 39 show the electrical characteristics of the CAAC-OS FET with a channel length L of 60 nm and a channel width W of 300 µm.

<DC Characteristics>

Figure 37A:
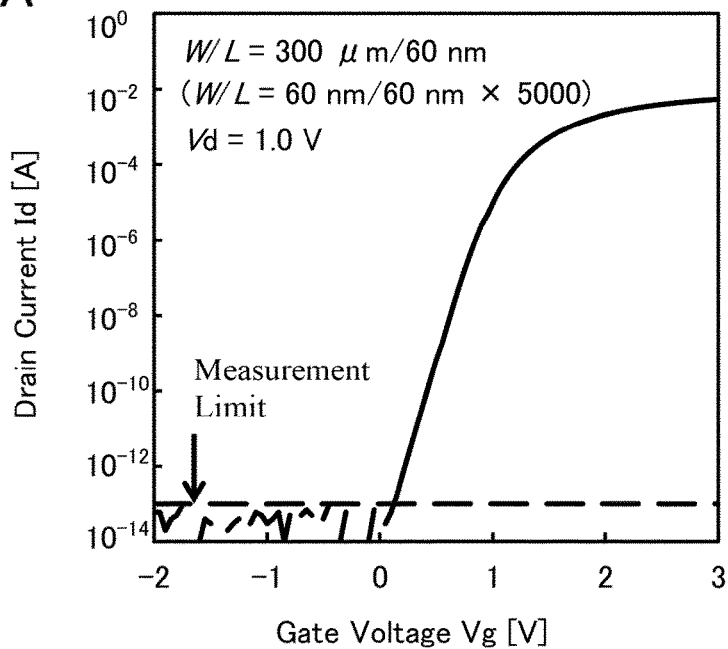
FIGS. 37A and 37B are graphs showing DC characteristics of a transistor using a c-axis aligned crystalline oxide semiconductor (CAAC-OS FET)
Figure 37B:
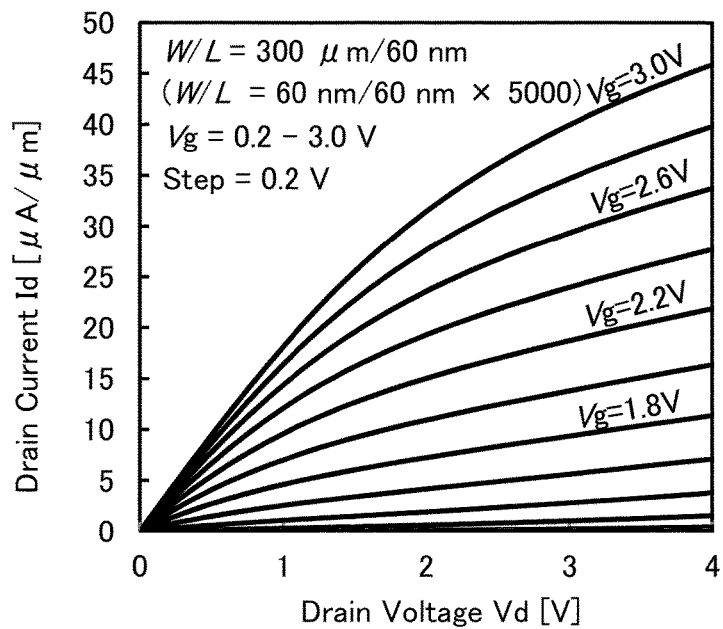

FIG. 37A shows the $I_d$-$V_g$ (drain current-gate voltage) characteristics of the CAAC-OS FET with W=300 µm and L=60 nm, and FIG. 37B shows $I_d$-$V_d$ (drain current-drain voltage) characteristics. When $V_g$=2.2 V and $V_d$=1.0 V, the on-state current $I_{on}$ was 2.87 mA, and the S value (subthreshold swing value) was 0.09 V/dec. The off-state current was lower than or equal to the lower measurement limit, that is, $1 \times 10^{13}$ A, which shows an extremely-small leak current of the CAAC-OS FET.

Figure 38:
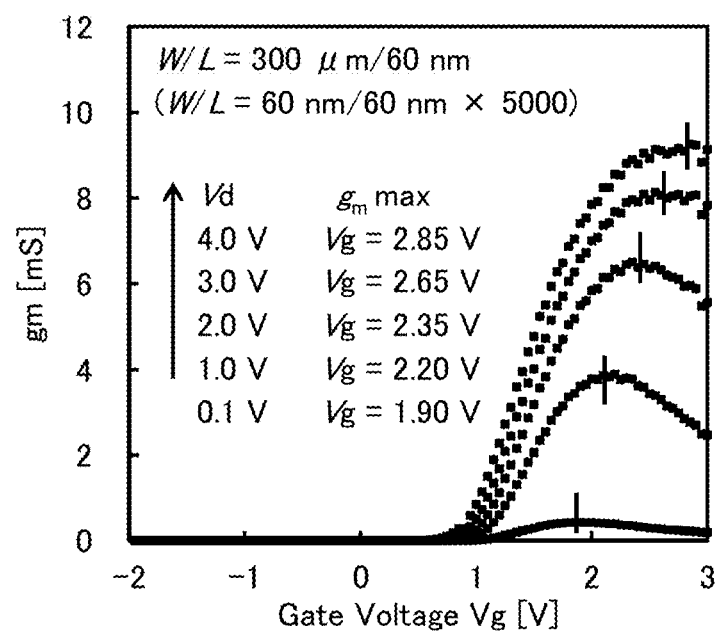
FIG. 38 is a graph showing a measurement result of mutual conductance ($g_m$) characteristics of a CAAC-OS FET.

FIG. 38 shows the mutual conductance ($g_m$) characteristics of the CAAC-OS FET with W=300 µm and L=60 nm. When the drain voltage $V_d$ was set to 0.1 V, 1.0 V, 2.0 V, 3.0 V, or 4.0 V, the maximum value of $g_m$ was 0.4 mS, 3.9 mS, 6.5 mS, 8.0 mS, or 9.3 mS, respectively. The gate voltage $V_g$ when $g_m$ took the maximum value was 1.90 V, 2.20 V, 2.35 V, 2.65 V, or 2.85 V.

<RF Characteristics>

The S parameter of the CAAC-OS FET with W=300 µm and L=60 nm (5000 CAAC-OS FETs each having W=60 nm and L=60 nm) was measured, the RF gain (current gain |H21|, and maximum unilateral power gain Ug) was obtained, and the parameter cutoff frequency ($f_T$) and the maximum oscillation frequency ($f_{max}$) were derived.

Figure 39:
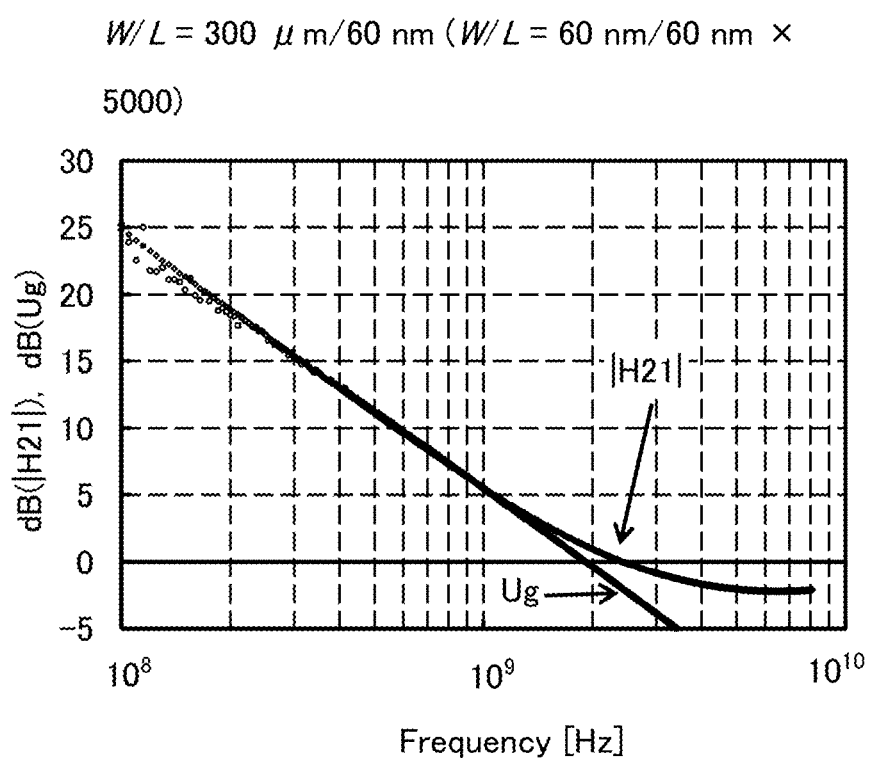
FIG. 39 is a graph illustrating a measurement result of high-frequency gain of a CAAC-OS FET with respect to frequency.

FIG. 39 illustrates the RF gain with respect to frequency (|H21|, Ug). $V_d$=1.0 V, and $V_g$=2.2 V. FIG. 39 shows that both $f_T$ and $f_{max}$ were 1.9 GHz. These values were obtained after de-embedding with short-open calibration.

Figure 40:
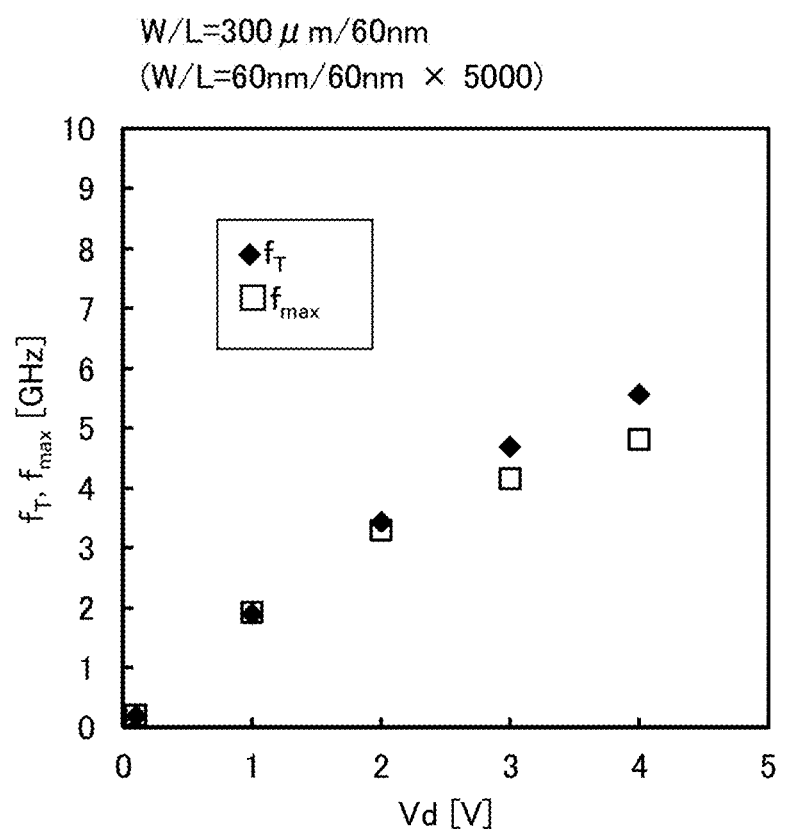
FIG. 40 is a graph showing a relationship between $V_d$, cutoff frequency, and maximum oscillation frequency of a CAAC-OS FET.

FIG. 40 illustrates drain voltage dependence of $f_T$ and $f_{max}$. The $f_T$ and $f_{max}$ were plotted under conditions where $g_m$ in FIG. 38 took the maximum values. When the drain voltage $V_d$ was 0.1 V, 1.0 V, 2.0 V, 3.0 V, or 4.0 V, $f_T$ is 0.2 GHz, 1.9 GHz, 3.4 GHz, 4.7 GHz, or 5.6 GHz, respectively, and $f_{max}$ was 0.2 GHz, 1.9 GHz, 3.3 GHz, 4.2 GHz, or 4.8 GHz, respectively. FIG. 40 illustrates that both $f_T$ and $f_{max}$ increased as $V_d$ got higher.

<Possibility of Application of CAAC-OS FET to LSI>

Figure 41:
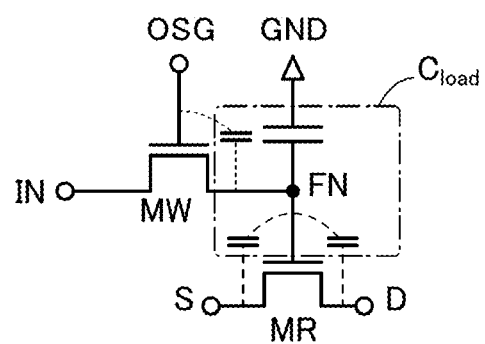
FIG. 41 is a circuit diagram of a fabricated memory circuit.

A circuit was manufactured with a CAAC-OS FET and a passive element, and application of the CAAC-OS FET to an LSI was examined. Here, as an example, an examination result of a memory circuit shown in FIG. 41 is described. The memory circuit in FIG. 41 had a circuit structure similar to that of the memory circuit 25 in FIG. 2A, and included a writing transistor MW, a reading transistor MR, and a capacitor Cs. Each of the writing transistor MW and the reading transistor MR was a CAAC-OS FET with the channel width W of 60 nm and the channel length L of 60 nm. The two kinds of the memory circuits were manufactured: one had load capacitance $C_{load}$ of the node FN of 1.0 fF while the other had that of 3.0 fF. As shown in FIG. 41, the load capacitance $C_{load}$ was the sum of the capacity Cs and parasitic capacitance.

Figure 42:
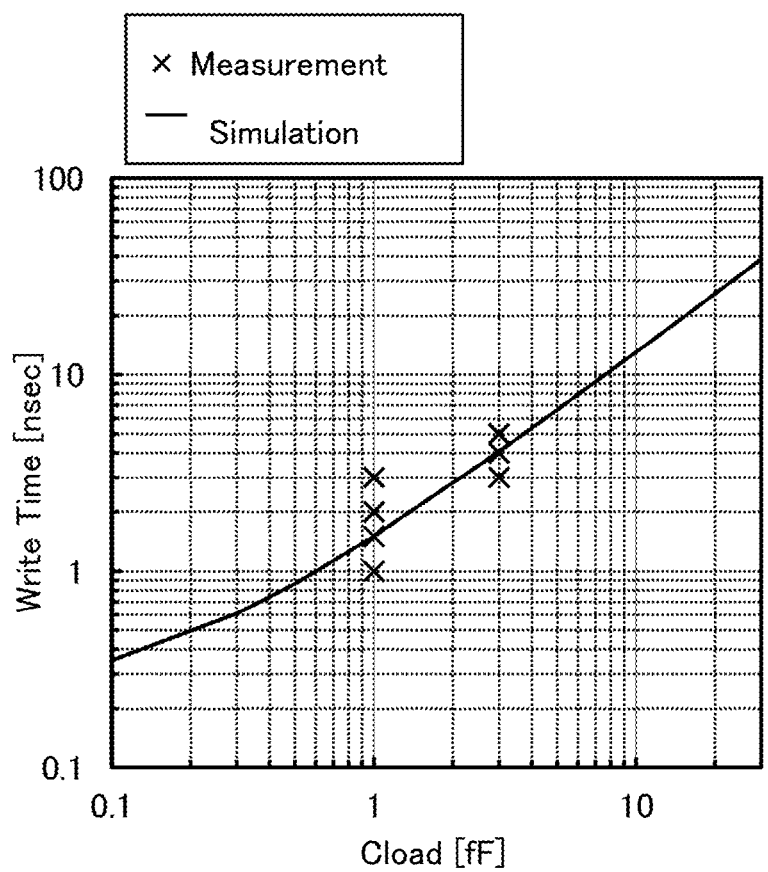
FIG. 42 is a graph showing a relationship between load capacitance ($C_{load}$) and writing time of the memory circuit of FIG. 41.

Writing time of the memory circuit in FIG. 41 was measured. FIG. 42 shows the measurement results. FIG. 42 illustrates the relationship between the load capacitance of the memory circuit and the writing time. The measurement method is described below.

The potential of a node IN was 0.0 V, and the potential of a node OSG was 3.0 V as an initial state, so that the potential of a node FN was 0.0 V. The potential of the node OSG was set to −1.0 V, and 1.1 V was applied to the node IN. A pulse (from −1.0 V to 3.0 V) was input to the node OSG, and a drain current of the reading transistor MR (current flowing between a node S and a node D) was measured. Based on $I_d$-$V_g$ characteristics of the reading transistor MR measured in advance, the potential of the node FN was estimated. The measurement was conducted by changing a pulse width applied to the node OSG. The pulse width means the time during which a potential of 3.0 V is applied to the node OSG. The writing time was defined as the pulse width where the potential of the node FN reaches 1.0 V (90% of 1.1 V, the potential of the node IN). Note that a solid line in FIG. 42 shows the calculation result. FIG. 42 shows that the writing time was 4.0 nsec when the load capacitance $C_{load}$ was 3.0 fF, and was 2.0 nsec when $C_{load}$ was 1.0 fF.

SUMMARY

In this example, the CAAC-OS FET with a channel width W of 60 nm and a channel length L of 60 nm was manufactured, and the DC characteristics and RF characteristics were measured. With a channel width of 300 μm, the off-state current lower than or equal to the lower measurement limit ($1\times10^{-13}$ A) and an S value of 0.09 V/dec were obtained. When W=300 μm, $V_g$=2.2 V and $V_d$=1.0 V, $f_T$ of 1.9 GHz and $f_{max}$ of 1.9 GHz were obtained. In addition, the writing speed of the memory circuit was 4.0 nsec when the load capacitance of the floating node was 3.0 fF, and was 2.0 nsec when the load capacitance was 1.0 fF.

A CAAC-OS FET with a channel length L of 60 nm is sufficiently capable of application to an LSI such as a low-power-consumption memory device. In addition, it is well known that the RF characteristics of a transistor are increased by miniaturization. That is, a CAAC-OS FET whose technology node is shorter than 60 nm can have $f_T$ and $f_{max}$ with higher frequencies. This example indicated that a miniaturized CAAC-OS FET could be applied to a microwave integrated circuit (MIC) in a GHz frequency band.

REFERENCE NUMERALS

10: circuit system, 12: memory cell array, 14: peripheral circuit, 21: transistor, 22: transistor, 23: capacitor, 24: transistor, 25: memory circuit, 26: memory circuit, 27: memory circuit, 31: substrate, 32: conductive film, 33: insulating film, 34: semiconductor film, 34a: semiconductor film, 34b: semiconductor film, 34c: semiconductor film, 35: conductive film, 36: conductive film, 37: insulating film, 38: conductive film, 42: conductive film, 43: insulating film, 44: semiconductor film, 44a: semiconductor film, 44b: semiconductor film, 44c: semiconductor film, 45: conductive film, 46: conductive film, 47: insulating film, 48: conductive film, 100: substrate, 101: semiconductor film, 101a: semiconductor film, 101b: semiconductor film, 101c: semiconductor film, 102: gate insulating film, 103: gate electrode, 104a: conductive film, 104b: conductive film, 105: conductive film, 114: insulating film, 115: insulating film, 116: insulating film, 118a: plug, 118b: plug, 133: conductive film, 134: plug, 141: plug, 142: plug, 143: plug, 144: plug, 145: plug, 151: conductive film, 152: conductive film, 153: conductive film, 155: conductive film, 156: insulating film, 171a: low-resistance region, 171b: low-resistance region, 202: gate insulating film, 203: gate electrode, 204a: conductive film, 204b: conductive film, 205: conductive film, 212: insulating film, 213: insulating film, 216: insulating film, 291: layer, 292: layer, 293: layer, 294: layer, 295: layer, 296: layer, 297: layer, 300: memory cell array, 700: transistor, 701: transistor, 702: transistor, 703: transistor, 704: transistor, 705: capacitor, 706: diode, 711: plug, 712: plug, 713: plug, 714: plug, 721: wiring, 722: wiring, 723: wiring, 724: wiring, 730: substrate, 731: element separation layer, 732: insulating film, 733: insulating film, 735: substrate, 741: wiring, 742: wiring, 743: wiring, 800: RF device, 801: communication device, 802: antenna, 803: radio signal, 804: antenna, 805: rectifier circuit, 806: constant voltage circuit, 807: demodulation circuit, 808: modulation circuit, 809: logic circuit, 810: memory circuit, 811: ROM, 901: housing, 902: housing, 903: display portion, 904: display portion, 905: microphone, 906: speaker, 907: operation key, 908: stylus, 911: housing, 912: housing, 913: display portion, 914: display portion, 915: joint, 916: operation key, 921: housing, 922: display portion, 923: keyboard, 924: pointing device, 931: housing, 932: refrigerator door, 933: freezer door, 941: housing, 942: housing, 943: display portion, 944: operation key: 945: lens, 946: joint, 951: car body, 952: wheel, 953: dashboard, 954: light, 1189: ROM interface, 1190: substrate, 1191: ALU, 1192: ALU controller, 1193: instruction decoder, 1194: interrupt controller, 1197: register controller, 1198: bus interface, 1199: ROM, 1200: memory circuit, 1201: circuit, 1202: circuit, 1203: switch, 1204: switch, 1206: logic element, 1207: capacitor, 1208: capacitor, 1209: transistor, 1210: transistor, 1213: transistor, 1214: transistor, 1220: circuit, 2001: impurity region, 2002: impurity region, 2003: gate electrode, 2004: gate insulating film, 2005: sidewall insulating layer, 2011: circuit, 2012: circuit, 2013: circuit, 2100: transistor, 2200: transistor, 2201: substrate, 2202: wiring, 2203: plug, 2204: element separation layer, 2205: wiring, 2206: wiring, 2207: insulating film, 2208: insulating film, 2211: semiconductor substrate, 2212: insulating film, 2213: gate electrode, 2214: gate insulating layer, 2215: impurity region, 2216: impurity region, 2300: capacitor, 2305: wiring, 3000: region, 4000: RF device, 5100: pellet, 5120: substrate, 5161: region, 5200: pellet, 5201: ion, 5203: particle, 5220: substrate, 5230: target, 5240: plasma, 5260: heating mechanism This application is based on Japanese Patent Application serial no. 2014-052263 filed with Japan Patent Office on Mar. 14, 2014, Japanese Patent Application serial no. 2014-052864 filed with Japan Patent Office on Mar. 16, 2014, Japanese Patent Application serial no. 2014-055459 filed with Japan Patent Office on Mar. 18, 2014, Japanese Patent Application serial no. 2014-070518 filed with Japan Patent Office on Mar. 28, 2014, and Japanese Patent Application serial no. 2014-093321 filed with Japan Patent Office on Apr. 30, 2014, the entire contents of which are hereby incorporated by reference.

The invention claimed is:

1. A semiconductor device comprising:
a capacitor; and
a transistor electrically connected to the capacitor,
wherein electrostatic capacitance of the capacitor is larger than or equal to 0.1 fF and less than 10 fF, wherein the transistor comprises an oxide semiconductor film, and wherein writing time of the semiconductor device is longer than or equal to 0.1 nsec and shorter than 5 nsec in operation at room temperature.

2. The semiconductor device according to claim 1, wherein the oxide semiconductor film comprises crystal parts aligned in a c-axis direction.

3. A semiconductor device comprising:

a memory circuit over a substrate, the memory circuit comprising a capacitor, a first transistor, and a second transistor; and a circuit over the substrate, the circuit comprising a third transistor and a fourth transistor, wherein a gate of the first transistor is electrically connected to the capacitor and one of a source and a drain of the second transistor, wherein the third transistor and the fourth transistor are electrically connected to each other in series, wherein the first transistor and the third transistor each comprise an active layer comprising silicon, and wherein the second transistor and the fourth transistor each comprise an active layer of an oxide semiconductor film.

4. The semiconductor device according to claim 3, wherein the first transistor and the third transistor are p-channel transistors.

5. The semiconductor device according to claim 3, wherein the second transistor has a region in which a channel length is larger than or equal to 1 nm and less than 100 nm, and wherein the fourth transistor has a region in which a channel length is larger than or equal to 1 nm and less than 100 nm.

6. The semiconductor device according to claim 3, wherein the second transistor has a region in which a channel length is larger than or equal to 5 nm and less than 60 nm, and wherein the fourth transistor has a region in which a channel length is larger than or equal to 5 nm and less than 60 nm.

7. The semiconductor device according to claim 3, wherein the first transistor, the second transistor, the third transistor, the fourth transistor, and the capacitor are three-dimensionally arranged.

8. The semiconductor device according to claim 3, wherein electrostatic capacitance of the capacitor is larger than or equal to 0.1 fF and less than 10 fF.

9. The semiconductor device according to claim 3, wherein writing time of the memory circuit is longer than or equal to 0.1 nsec and shorter than 5 nsec.

10. The semiconductor device according to claim 3, wherein the oxide semiconductor film contains oxygen, In, Zn, and one of Ti, Ga, Y, Zr, La, Ce, Nd, and Hf.

11. The semiconductor device according to claim 3, wherein the oxide semiconductor film comprises crystal parts.

12. The semiconductor device according to claim 3, wherein the oxide semiconductor film comprises crystal parts aligned in a c-axis direction.

13. A semiconductor device comprising:

a memory circuit over a substrate, the memory circuit comprising a capacitor, a first transistor, and a second transistor; and a circuit over the substrate, the circuit comprising a third transistor and a fourth transistor, wherein a gate of the first transistor is electrically connected to the capacitor and one of a source and a drain of the second transistor, wherein the third transistor and the fourth transistor are electrically connected to each other in series, and wherein the first transistor, the second transistor, the third transistor, and the fourth transistor each comprise an active layer of an oxide semiconductor film.

14. The semiconductor device according to claim 13, wherein the first transistor, the second transistor, the third transistor, and the fourth transistor each have a region in which a channel length is larger than or equal to 1 nm and less than 100 nm.

15. The semiconductor device according to claim 13, wherein the first transistor, the second transistor, the third transistor, and the fourth transistor each have a region in which a channel length is larger than or equal to 5 nm and less than 60 nm.

16. The semiconductor device according to claim 13, wherein the first transistor, the second transistor, the third transistor, the fourth transistor, and the capacitor are three-dimensionally arranged.

17. The semiconductor device according to claim 13, wherein electrostatic capacitance of the capacitor is larger than or equal to 0.1 fF and less than 10 fF.

18. The semiconductor device according to claim 13, wherein writing time of the memory circuit is longer than or equal to 0.1 nsec and shorter than 5 nsec.

19. The semiconductor device according to claim 13, wherein the oxide semiconductor film contains oxygen, In, Zn, and one of Ti, Ga, Y, Zr, La, Ce, Nd, and Hf.

20. The semiconductor device according to claim 13, wherein the oxide semiconductor film comprises crystal parts.

21. The semiconductor device according to claim 13, wherein the oxide semiconductor film comprises crystal parts aligned in a c-axis direction.

* * * * *